(12) United States Patent
Seo et al.

(10) Patent No.: US 9,548,468 B2
(45) Date of Patent: Jan. 17, 2017

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Satoshi Seo, Kanagawa (JP); Takahiro Ishisone, Kanagawa (JP); Nobuharu Ohsawa, Kanagawa (JP); Yusuke Nonaka, Kanagawa (JP); Toshiki Sasaki, Kanagawa (JP)

(73) Assignee: Semiconductor Energy Laboratory Co., Ltd., Atsugi-shi, Kanagawa-ken (JE)

( * ) Notice: Subject to any disclaimer, the term of this patent is extended or adjusted under 35 U.S.C. 154(b) by 0 days.

(21) Appl. No.: 14/725,026

(22) Filed: May 29, 2015

(65) Prior Publication Data

US 2015/0349284 A1    Dec. 3, 2015

(30) Foreign Application Priority Data

May 30, 2014    (JP) .................................. 2014-112448
Nov. 28, 2014    (JP) .................................. 2014-241137

(51) Int. Cl.
| | | |
|---|---|---|
| *H01L 51/50* | (2006.01) | |
| *H01L 27/32* | (2006.01) | |
| *G09G 3/32* | (2016.01) | |

(52) U.S. Cl.
CPC ........... *H01L 51/504* (2013.01); *G09G 3/3225* (2013.01); *H01L 27/32* (2013.01);
(Continued)

(58) Field of Classification Search
CPC ............. H01L 51/5028; H01L 51/5092; H01L 51/5072; H01L 51/5056; H01L 51/0067; H01L 51/504; H01L 51/5044; H01L 51/5024; H01L 51/5016; H01L 27/32
(Continued)

(56) References Cited

U.S. PATENT DOCUMENTS

| | | |
|---|---|---|
| 6,995,509 B2 | 2/2006 | Yamazaki et al. |
| 7,009,338 B2 | 3/2006 | D'Andrade et al. |

(Continued)

FOREIGN PATENT DOCUMENTS

| | | |
|---|---|---|
| CN | 001988205 A | 6/2007 |
| CN | 102076640 A | 5/2011 |

(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.

(Continued)

*Primary Examiner* — Jarrett Stark
*Assistant Examiner* — Shahed Ahmed
(74) *Attorney, Agent, or Firm* — Fish & Richardson P.C.

(57) ABSTRACT

Emission efficiency of a light-emitting element is improved. The light-emitting element has a pair of electrodes and an EL layer between the pair of electrodes. The EL layer includes a first light-emitting layer and a second light-emitting layer. The first light-emitting layer includes a fluorescent material and a host material. The second light-emitting layer includes a phosphorescent material, a first organic compound, and a second organic compound. An emission spectrum of the second light-emitting layer has a peak in a yellow wavelength region. The first organic compound and the second organic compound form an exciplex.

18 Claims, 31 Drawing Sheets

(52) U.S. Cl.
CPC ...... *H01L 51/5004* (2013.01); *H01L 51/5016* (2013.01); *H01L 51/5024* (2013.01); *H01L 51/5044* (2013.01); *G09G 2300/0426* (2013.01); *H01L 27/322* (2013.01); *H01L 2251/5376* (2013.01); *H01L 2251/552* (2013.01)

(58) Field of Classification Search
USPC ......... 257/21, 40, 79, 113, 184; 438/20, 116
See application file for complete search history.

(56) References Cited

U.S. PATENT DOCUMENTS

| | | | |
|---|---|---|---|
| 7,285,907 | B2 | 10/2007 | D'Andrade et al. |
| 7,572,522 | B2 | 8/2009 | Seo et al. |
| 7,943,925 | B2 | 5/2011 | Yamazaki |
| 8,101,857 | B2 | 1/2012 | Kido et al. |
| 8,247,086 | B2 | 8/2012 | Inoue et al. |
| 8,723,025 | B2 | 5/2014 | Kido et al. |
| 9,090,532 | B2 | 7/2015 | Kaiser et al. |
| 2005/0048310 | A1 | 3/2005 | Cocchi et al. |
| 2006/0134464 | A1 | 6/2006 | Nariyuki |
| 2006/0228577 | A1 | 10/2006 | Nagara |
| 2007/0138947 | A1 | 6/2007 | Popovic et al. |
| 2007/0244320 | A1 | 10/2007 | Inoue et al. |
| 2008/0160345 | A1 | 7/2008 | Inoue et al. |
| 2008/0286604 | A1 | 11/2008 | Inoue et al. |
| 2009/0302313 | A1* | 12/2009 | Choi ............... H01L 51/5012 257/40 |
| 2010/0052527 | A1 | 3/2010 | Ikeda et al. |
| 2010/0145044 | A1 | 6/2010 | Inoue et al. |
| 2011/0001146 | A1 | 1/2011 | Yamazaki et al. |
| 2011/0108821 | A1 | 5/2011 | Kaiser et al. |
| 2011/0114889 | A1 | 5/2011 | Buesing et al. |
| 2011/0210316 | A1 | 9/2011 | Kadoma et al. |
| 2011/0215714 | A1 | 9/2011 | Seo et al. |
| 2012/0098417 | A1 | 4/2012 | Inoue et al. |
| 2012/0205632 | A1 | 8/2012 | Shitagaki et al. |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0242219 | A1 | 9/2012 | Seo et al. |
| 2012/0248421 | A1 | 10/2012 | Yamazaki et al. |
| 2012/0256535 | A1 | 10/2012 | Seo et al. |
| 2012/0274201 | A1 | 11/2012 | Seo et al. |
| 2012/0277427 | A1 | 11/2012 | Inoue et al. |
| 2012/0305896 | A1* | 12/2012 | Inoue ............... H01L 51/0067 257/40 |
| 2013/0020561 | A1 | 1/2013 | Suzuki et al. |
| 2013/0048964 | A1 | 2/2013 | Takeda et al. |
| 2013/0049579 | A1 | 2/2013 | Kaiser et al. |
| 2013/0088144 | A1 | 4/2013 | Inoue et al. |
| 2013/0207088 | A1 | 8/2013 | Seo |
| 2013/0240851 | A1 | 9/2013 | Seo et al. |
| 2013/0270531 | A1 | 10/2013 | Seo et al. |
| 2013/0277654 | A1 | 10/2013 | Seo et al. |
| 2013/0277655 | A1 | 10/2013 | Seo et al. |
| 2013/0277656 | A1 | 10/2013 | Seo et al. |
| 2013/0292656 | A1 | 11/2013 | Seo et al. |
| 2013/0292664 | A1 | 11/2013 | Nishimura et al. |
| 2013/0306945 | A1 | 11/2013 | Seo |
| 2014/0034926 | A1 | 2/2014 | Matsubara et al. |
| 2014/0034927 | A1 | 2/2014 | Seo et al. |
| 2014/0034929 | A1 | 2/2014 | Hamada et al. |
| 2014/0034930 | A1 | 2/2014 | Seo et al. |
| 2014/0034931 | A1 | 2/2014 | Inoue et al. |
| 2014/0034932 | A1 | 2/2014 | Seo et al. |
| 2014/0042469 | A1 | 2/2014 | Seo et al. |
| 2014/0061604 | A1 | 3/2014 | Seo et al. |
| 2014/0084274 | A1 | 3/2014 | Yamazaki et al. |
| 2014/0246071 | A1 | 9/2014 | Kido et al. |
| 2014/0284578 | A1 | 9/2014 | Takeda et al. |
| 2014/0319492 | A1 | 10/2014 | Seo et al. |
| 2015/0001502 | A1 | 1/2015 | Seo et al. |
| 2015/0028313 | A1* | 1/2015 | Pillow ............... C08G 61/12 257/40 |
| 2015/0053958 | A1 | 2/2015 | Ishisone et al. |
| 2015/0155510 | A1 | 6/2015 | Kawata et al. |
| 2015/0155511 | A1 | 6/2015 | Ohsawa et al. |
| 2015/0171347 | A1 | 6/2015 | Suzuki et al. |
| 2015/0333283 | A1 | 11/2015 | Ishisone et al. |

FOREIGN PATENT DOCUMENTS

| | | |
|---|---|---|
| CN | 102076641 A | 5/2011 |
| CN | 102757782 A | 10/2012 |
| CN | 102884649 A | 1/2013 |
| CN | 103052624 A | 4/2013 |
| CN | 103204796 A | 7/2013 |
| DE | 102008035413 | 2/2010 |
| DE | 102010020044 | 11/2011 |
| DE | 112012003073 | 11/2014 |
| DE | 112012005831 | 6/2015 |
| JP | 2004-522276 | 7/2004 |
| JP | 2004-241374 A | 8/2004 |
| JP | 2006-024791 A | 1/2006 |
| JP | 2006-024830 A | 1/2006 |
| JP | 2006-120689 A | 5/2006 |
| JP | 2007-173827 A | 7/2007 |
| JP | 2011-529455 | 12/2011 |
| JP | 2011-529614 | 12/2011 |
| JP | 2012-004526 A | 1/2012 |
| JP | 2012-186461 A | 9/2012 |
| JP | 2012-238854 A | 12/2012 |
| JP | 2013-047283 A | 3/2013 |
| JP | 2013-048221 A | 3/2013 |
| JP | 2013-093570 A | 5/2013 |
| JP | 2013-100341 A | 5/2013 |
| JP | 2013-526773 | 6/2013 |
| KR | 2007-0067606 A | 6/2007 |
| KR | 2010-0012781 A | 2/2010 |
| KR | 2010-0012808 A | 2/2010 |
| KR | 2013-0037646 A | 4/2013 |
| KR | 2013-0107206 A | 10/2013 |
| KR | 2014-0015259 A | 2/2014 |
| KR | 2014-0026577 A | 3/2014 |
| TW | 201307285 | 2/2013 |
| TW | 201307528 | 2/2013 |
| TW | 201313682 | 4/2013 |
| WO | WO-00/70655 | 11/2000 |
| WO | WO-2010/012328 | 2/2010 |
| WO | WO-2010/012330 | 2/2010 |
| WO | WO-2011/141109 | 11/2011 |
| WO | WO-2012/099241 | 7/2012 |
| WO | WO-2013/015144 | 1/2013 |
| WO | WO-2014/185434 | 11/2014 |

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Gu.G et al., "Transparent Organic Light Emitting Devices", Appl. Phys. Lett. (Applied Physics Letters), May 6, 1996, vol. 68, No. 19, pp. 2606-2608.
Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.
Adachi.C et al., "Nearly 100% Internal Phosphorescence Efficiency in an Organic Light Emitting Device", J. Appl. Phys. (Journal of Applied Physics), Nov. 15, 2001, vol. 90, No. 10, pp. 5048-5051.
Baldo.M et al., "Prospects for Electrically Pumped Organic Lasers", Phys. Rev. B (Physical Review. B), Jul. 1, 2002, vol. 66, pp. 035321-1-035321-16.
Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647.
Itano.K et al., "Exciplex formation at the organic solid-state interface: Yellow emission in organic light-emitting diodes using green-

(56) References Cited

OTHER PUBLICATIONS fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Kondakova.M et al., "High-efficiency, low-voltage phosphorescent organic light-emitting diode devices with mixed host", J. Appl. Phys. (Journal of Applied Physics), 2008, vol. 104, pp. 094501-1-094501-17.

Seo.J et al., "Efficient blue-green organic light-emitting diodes based on heteroleptic tris-cyclometalated iridium(III) complexes", Thin Solid Films, 2009, vol. 517, No. 5, pp. 1807-1810.

Goushi.K et al., "Efficient organic light-emitting diodes through up-conversion from triplet to singlet excited states of exciplexes", Appl. Phys. Lett. (Applied Physics Letters), Jul. 12, 2012, vol. 101, No. 2, pp. 023306-1-023306-4.

Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.

Hirakata.Y et al., "Development of high-definition organic light emitting display", OPTRONICS, Dec. 1, 2013, No. 384, pp. 33-39.

International Search Report (Application No. PCT/IB2015/053577) Dated Sep. 1, 2015.

Written Opinion (Application No. PCT/IB2015/053577) Dated Sep. 1, 2015.

\* cited by examiner

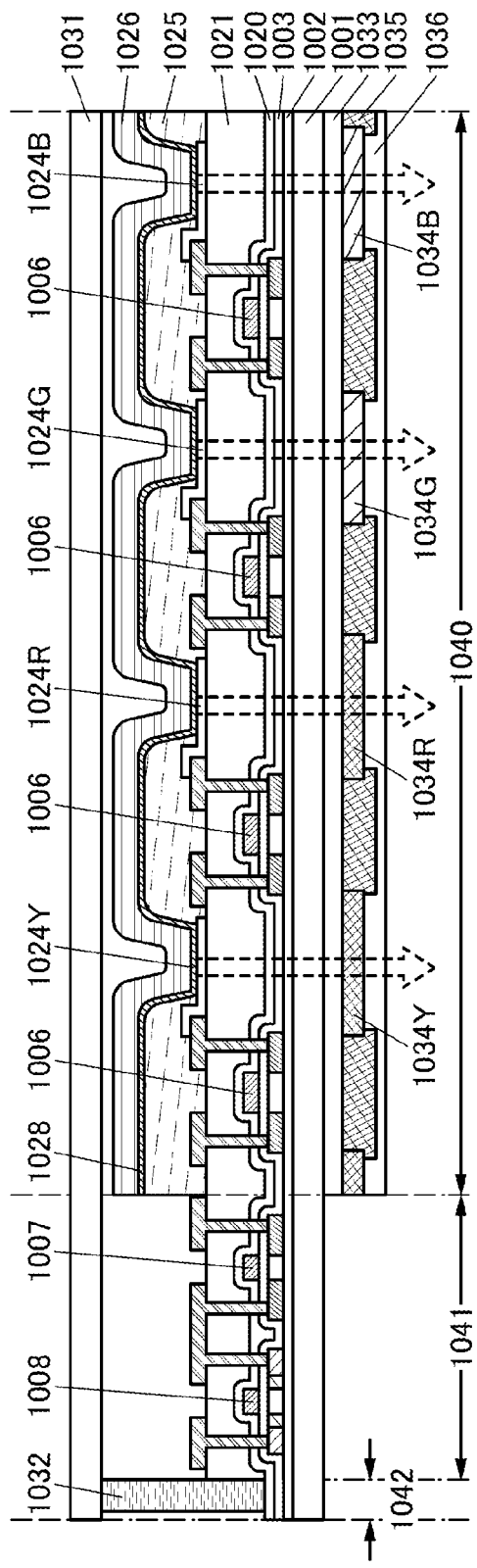
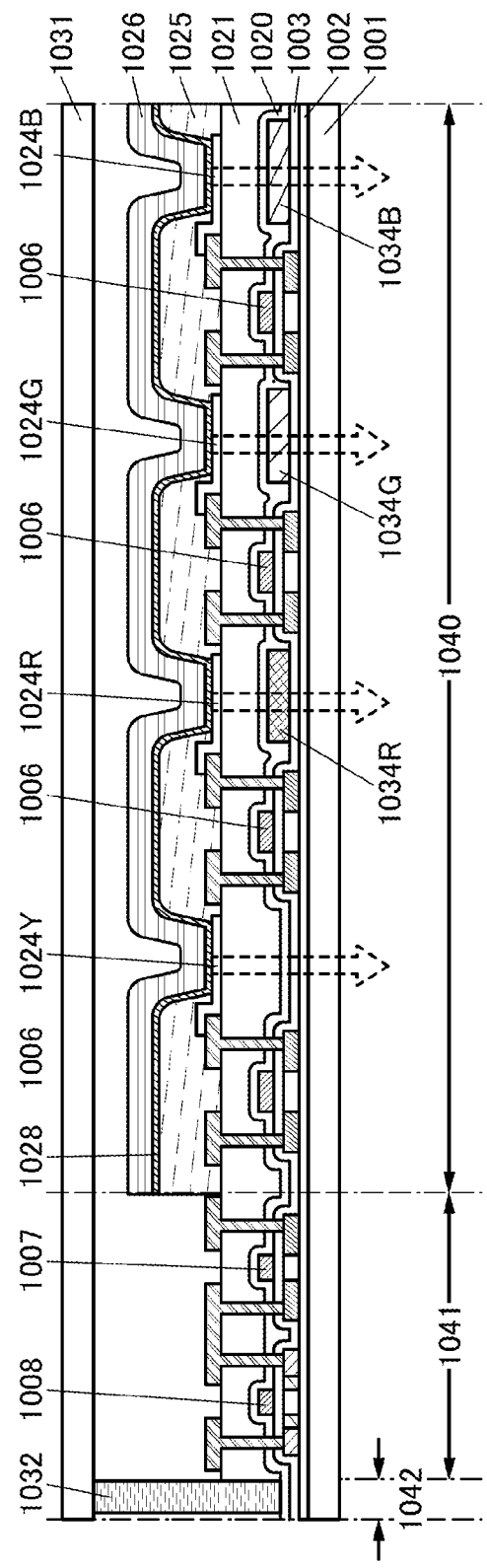

9100

9200

9101

9201

9102

9201

9201

LIGHT-EMITTING ELEMENT, LIGHT-EMITTING DEVICE, ELECTRONIC DEVICE, AND LIGHTING DEVICE

TECHNICAL FIELD

One embodiment of the present invention relates to a light-emitting element in which a light-emitting layer capable of emitting light by application of an electric field is provided between a pair of electrodes, and also relates to a light-emitting device, an electronic device, and a lighting device including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

BACKGROUND ART

In recent years, research and development of a light-emitting element (organic EL element) which uses an organic compound and utilizes electroluminescence (EL) have been actively promoted. In the basic structure of such a light-emitting element, an organic compound layer containing a light-emitting substance (an EL layer) is provided between a pair of electrodes. By voltage application to this element, light emission from the light-emitting substance can be obtained.

A light-emitting element in which an organic compound layer is between a pair of electrodes is referred to as an organic electroluminescence element, and a light-emitting device including the light-emitting element is referred to as an organic electroluminescence device. The organic electroluminescence device can be used in a display device, a lighting device, and the like (see Patent Document 1, for example).

REFERENCE

Patent Document

[Patent Document 1] Japanese Published Patent Application No. 2012-186461

DISCLOSURE OF INVENTION

An object of one embodiment of the present invention is to improve emission efficiency of a light-emitting element. Another object of one embodiment of the present invention is to provide a novel semiconductor device, a novel light-emitting element, or a novel light-emitting device. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting element in which an EL layer is between a pair of electrodes. The EL layer includes a first light-emitting layer and a second light-emitting layer. The first light-emitting layer includes a fluorescent material and a host material. The second light-emitting layer includes a phosphorescent material, a first organic compound, and a second organic compound. An emission spectrum of the second light-emitting layer has a peak in a yellow wavelength region. The first organic compound and the second organic compound form an exciplex.

In the above structure, it is preferred that the second light-emitting layer include one phosphorescent material.

In any of the above structures, it is preferred that energy be transferred from the exciplex to the phosphorescent material.

In any of the above structures, it is preferred that a singlet excited level of the host material be higher than that of the fluorescent material and a triplet excited level of the host material be lower than that of the fluorescent material.

In any of the above structures, it is preferred that a triplet excited level of the host material be lower than those of the first organic compound and the second organic compound.

In any of the above structures, it is preferred that the first light-emitting layer and the second light-emitting layer include a region where the first light-emitting layer and the second light-emitting layer are in contact with each other.

In any of the above structures, it is preferred that the first light-emitting layer and the second light-emitting layer include a region where the first light-emitting layer and the second light-emitting layer are separated from each other, in which case a mixed layer of a hole-transport material and an electron-transport material is preferably provided between the first light-emitting layer and the second light-emitting layer.

In any of the above structures, it is preferred that the second light-emitting layer be over the first light-emitting layer.

Another embodiment of the present invention is a light-emitting device including the light-emitting element with any of the above structures, and a transistor or a substrate.

The light-emitting device in this specification and the like includes an image display device that uses a light-emitting element. Furthermore, the light-emitting device may be included in a module in which a light-emitting element is provided with a connector such as a flexible printed circuit (FPC), a module in which a light-emitting element is provided with an anisotropic conductive film or a tape carrier package (TCP), a module in which a printed wiring board is provided at the end of the TCP, or a module in which an integrated circuit (IC) is directly mounted on a light-emitting element by a chip on glass (COG) method.

Another embodiment of the present invention is an electronic device including a light-emitting device with the above structure and an external connection port, a keyboard, an operation button, a speaker, or a microphone. Another embodiment of the present invention is an electronic device including a module with the above structure and an external connection port, a keyboard, an operation button, a speaker, or a microphone. Another embodiment of the present invention is a lighting device including a light-emitting device with the above structure and a housing.

According to one embodiment of the present invention, emission efficiency of a light-emitting element can be improved. According to one embodiment of the present invention, a novel semiconductor device, a novel light-emitting element, or a novel light-emitting device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 7A and 7B are cross-sectional views illustrating light-emitting devices of one embodiment of the present invention;

BEST MODE FOR CARRYING OUT THE INVENTION

Figure 1A:
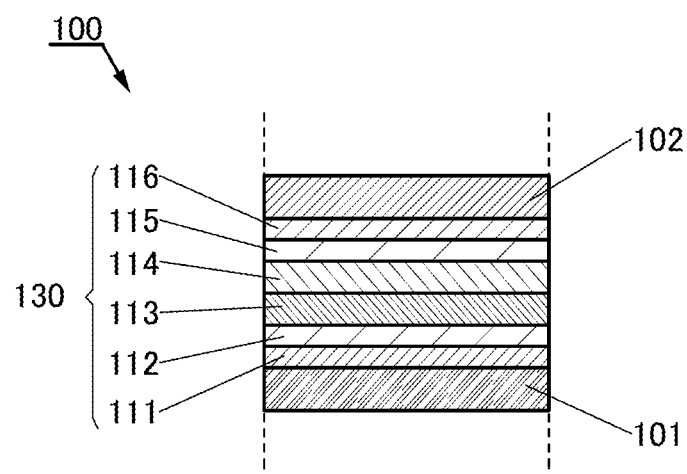
FIGS. 1A and 1B are schematic cross-sectional views illustrating light-emitting elements of one embodiment of the present invention.

Embodiments of the present invention will be explained below with reference to the drawings. Note that one embodiment of the invention is not limited to the description given below, and various changes and modifications can be made without departing from the spirit and scope of the invention. Therefore, one embodiment of the present invention is not interpreted as being limited to the description of the embodiments described below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In describing structures of the present invention with reference to the drawings, the same reference numerals are used in common for the same portions in different drawings in this specification and the like.

Note that the terms "film" and "layer" can be interchanged with each other depending on the case or circumstances in this specification and the like. For example, the term "conductive layer" can be changed into the term "conductive film" in some cases. Also, the term "insulating film" can be changed into the term "insulating layer" in some cases.

In this specification and the like, a fluorescent material refers to a material that emits light in the visible light region when the level of the lowest singlet excited state ($S_1$ level) relaxes to the ground state. A phosphorescent material refers to a material that emits light in the visible light region at room temperature when the level of the lowest triplet excited state ($T_1$ level) relaxes to the ground state. That is, a phosphorescent material refers to a material that can convert triplet excitation energy into visible light.

In this specification and the like, blue light has at least one peak of emission spectrum in a blue wavelength region of greater than or equal to 420 nm and less than or equal to 480 nm, green light has at least one peak of emission spectrum in a green wavelength region of greater than or equal to 500 nm and less than 550 nm, yellow light has at least one peak of emission spectrum in a yellow wavelength region of greater than or equal to 550 nm and less than or equal to 590 nm, and red light has at least one peak of emission spectrum in a red wavelength region of greater than or equal to 600 nm and less than or equal to 740 nm.

Embodiment 1

Figure 1B:
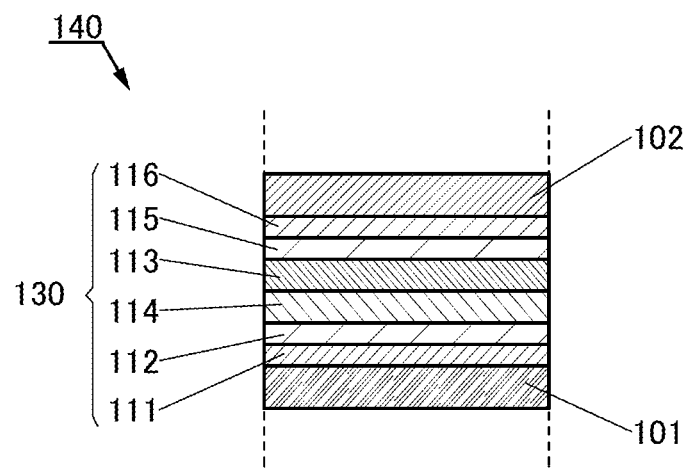

Light-emitting elements of one embodiment of the present invention are described with reference to FIGS. 1A and 1B. FIG. 1A is a schematic cross-sectional view of a light-emitting element 100 of one embodiment of the present invention, and FIG. 1B is a schematic cross-sectional view of a light-emitting element 140 of one embodiment of the present invention.

In the light-emitting element 100 shown in FIG. 1A, an EL layer 130 is between a pair of electrodes (a first electrode 101 and a second electrode 102). The EL layer 130 includes a first light-emitting layer 113 and a second light-emitting layer 114. In the light-emitting element 100, a hole-injection layer 111, a hole-transport layer 112, an electron-transport layer 115, and an electron-injection layer 116 are illustrated as part of the EL layer 130. However, this stacked-layer structure is an example, and the structure of the EL layer 130 in the light-emitting element of one embodiment of the present invention is not limited thereto. Note that, in the light-emitting element 100, the first electrode 101 serves as an anode, and the second electrode 102 serves as a cathode.

The first light-emitting layer 113 includes a fluorescent material and a host material. An emission spectrum of the first light-emitting layer 113 preferably has a peak in a blue wavelength region. The second light-emitting layer 114 includes a phosphorescent material, a first organic compound, and a second organic compound. An emission spectrum of the second light-emitting layer 114 preferably has a peak in a yellow wavelength region. The second light-emitting layer 114 preferably includes one phosphorescent material. The first organic compound and the second organic compound form an exciplex. One of the first organic compound and the second organic compound serves as a host material for the second light-emitting layer 114, and the other of the first organic compound and the second organic compound serves as an assist material for the second light-emitting layer 114. Note that the first organic compound serves as the host material and the second organic compound serves as the assist material in the following description.

When the first light-emitting layer 113 and the second light-emitting layer 114 have the above structures, fluorescent light emission from the first light-emitting layer 113 (here, light emission with a peak in the blue wavelength region) and phosphorescent light emission from the second light-emitting layer 114 (here, light emission with a peak in the yellow wavelength region) can be efficiently obtained.

A $T_1$ level of the host material of the first light-emitting layer 113 is preferably lower than $T_1$ levels of the first and second organic compounds of the second light-emitting layer 114. In the first light-emitting layer 113, an $S_1$ level of the host material is preferably higher than an $S_1$ level of the fluorescent material while the $T_1$ level of the host material is lower than a $T_1$ level of the fluorescent material.

Although there is no limitation on the combination of the first organic compound and the second organic compound in the second light-emitting layer 114 as long as an exciplex can be formed, it is preferred that one organic compound be a material having a hole-transport property and the other organic compound be a material having an electron-transport property. In that case, a donor-acceptor excited state is formed easily, which allows an exciplex to be formed efficiently. In the case where the combination of the first organic compound and the second organic compound is a combination of the material having a hole-transport property and the material having an electron-transport property, the carrier balance can be easily controlled depending on the mixture ratio. Specifically, the ratio of the material having a hole-transport property to the material having an electron-transport property is preferably within a range of 1:9 to 9:1 (weight ratio). Since the carrier balance can be easily controlled in the light-emitting element 100 having the structure, a recombination region can also be easily adjusted.

In the light-emitting element 100, a carrier recombination region is preferably distributed to some extent. Therefore, it is preferred that the first light-emitting layer 113 or the second light-emitting layer 114 have an appropriate degree of carrier-trapping property. It is particularly preferred that the phosphorescent material in the second light-emitting layer 114 have an electron-trapping property.

Note that in the light-emitting element 100, light emitted from the first light-emitting layer 113 preferably has a peak on the shorter wavelength side than light emitted from the second light-emitting layer 114. The luminance of a light-emitting element using the phosphorescent material emitting light with a short wavelength tends to degrade quickly. In view of the above, fluorescence is used for light emission with a short wavelength, so that a light-emitting element with less degradation of luminance can be provided.

Because the first light-emitting layer 113 and the second light-emitting layer 114 are stacked to be in contact with each other in the light-emitting element 100, the number of layers for forming the EL layer 130 is small and productivity is high.

Further, in the light-emitting element 100, the first light-emitting layer 113 and the second light-emitting layer 114 are made to emit light with different emission wavelengths, so that the light-emitting element can be a multicolor light-emitting element. The emission spectrum of the light-emitting element 100 is formed by combining light having different emission peaks, and thus has at least two peaks.

The light-emitting element 100 is suitable for obtaining white light emission. When the first light-emitting layer 113 and the second light-emitting layer 114 emit light of complementary colors, white light emission can be obtained.

In addition, white light emission with a high color rendering property that is formed of three primary colors or four or more colors can be obtained by using a plurality of light-emitting substances emitting light with different wavelengths for the first light-emitting layer 113. In that case, the first light-emitting layer 113 may be divided into layers and each of the divided layers may contain a different light-emitting substance from the others.

<Light Emission Mechanism of Second Light-Emitting Layer>

Figure 2A:
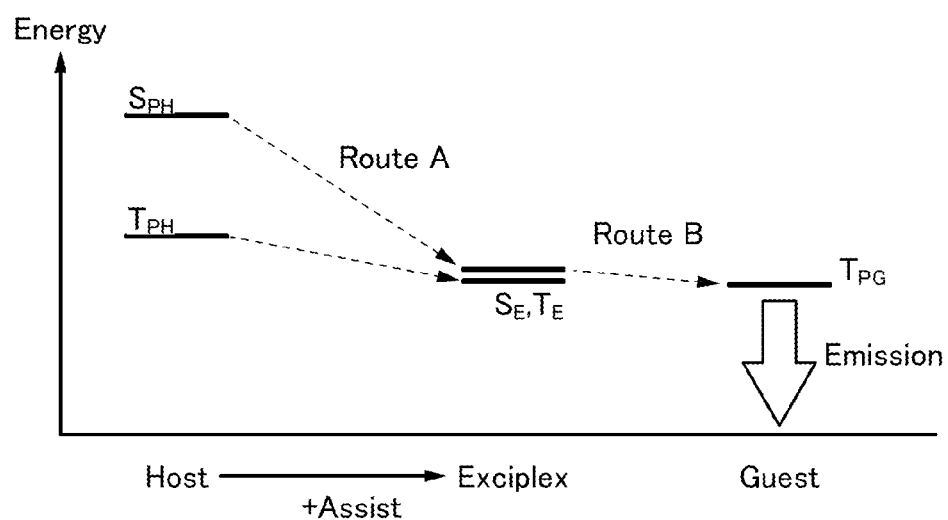
FIGS. 2A and 2B show correlations of energy levels in light-emitting layers.

FIG. 2A shows a correlation of energy levels between the first organic compound, the second organic compound, and the phosphorescent material of the second light-emitting layer 114. The following explains what terms and signs in FIG. 2A represent:

Host: the first organic compound;
Assist: the second organic compound;
Guest: the phosphorescent material;
$S_{PH}$: the level of the lowest singlet excited state of the host material (the first organic compound):
$T_{PH}$: the level of the lowest triplet excited state of the host material (the first organic compound);
$T_{PG}$: the level of the lowest triplet excited state of the guest material (the phosphorescent material);
$S_E$: the level of the lowest singlet excited state of the exciplex; and
$T_E$: the level of the lowest triplet excited state of the exciplex.

In the light-emitting element 100 of one embodiment of the present invention, the first and second organic compounds of the second light-emitting layer 114 form the exciplex. The level of the lowest singlet excited state of the exciplex ($S_E$) and the level of the lowest triplet excited state of the exciplex ($T_E$) are adjacent to each other (see Route A in FIG. 2A).

An exciplex is an excited state formed from two kinds of substances. In the case of photoexcitation, the exciplex is formed in such a manner that one molecule in an excited state takes in the other substance in a ground state. The two kinds of substances that have formed the exciplex return to a ground state by emitting light and serve as the original two kinds of substances. In the case of electrical excitation, the exciplex can be formed when a cationic molecule (hole) of one substance comes close to an anionic molecule (electron) of the other substance. That is, the exciplex can be formed without formation of excitation state of any molecule in the electrical excitation; thus, a driving voltage can be lowered. Both energies of $S_E$ and $T_E$ of the exciplex then move to the level of the lowest triplet excited state of the guest material (the phosphorescent material) to obtain light emission (see Route B in FIG. 2A).

The above-described process of Route A and Route B is referred to as exciplex-triplet energy transfer (ExTET) in this specification and the like. As described, in the light-emitting element of one embodiment of the present invention, energy can be given from the exciplex to the phosphorescent material (guest material).

When one of the first and second organic compounds receiving a hole and the other of the first and second organic compounds receiving an electron come close to each other, the exciplex is formed at once. Alternatively, when one substance becomes in an excited state, the one immediately takes in the other substance to form the exciplex. Therefore, most excitons in the second light-emitting layer 114 exist as the exciplexes. A band gap of the exciplex is narrower than those of the first organic compound and the second organic compound; therefore, the driving voltage can be lowered when the exciplex is formed by recombination of a hole and an electron.

<Light Emission Mechanism of First Light-Emitting Layer>

In the first light-emitting layer 113, recombination of carriers forms an excited state. Note that the first light-emitting layer 113 includes the host material and the fluorescent material. Because the amount of the host material is large as compared to the fluorescent material, the excited states are formed mostly as the excited states of the host material. The ratio of singlet excited states to triplet excited states caused by carrier recombination (hereinafter referred to as exciton generation probability) is approximately 1:3.

First, a case where the $T_1$ level of the host material is higher than the $T_1$ level of the guest material is described below.

Energy is transferred from the host material in the triplet excited state to the guest material (triplet energy transfer). However, the triplet excited state of the guest material does not offer emission of light in a visible light region because the guest material is the fluorescent material. Thus, the triplet excited state of the host material cannot be used for light emission. Therefore, when the $T_1$ level of the host material is higher than the $T_1$ level of the guest material, only approximately 25% of injected carriers can be used for light emission at most.

Figure 2B:
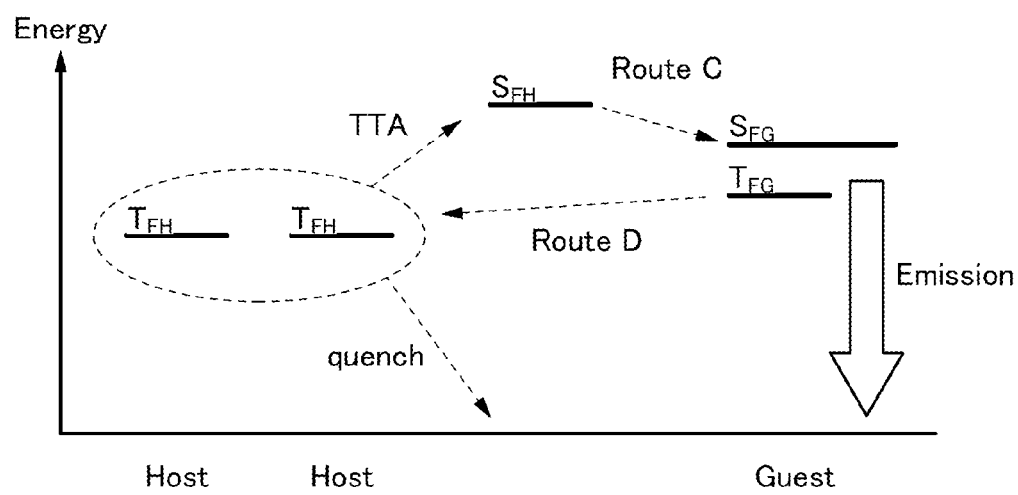

FIG. 2B shows a correlation of energy levels between the host material and the fluorescent material of the first light-emitting layer 113. The following explains what terms and signs in FIG. 2B represent:

Host: the host material;
Guest: the fluorescent material;
$S_{FH}$: the level of the lowest singlet excited state of the host material;
$T_{FH}$: the level of the lowest triplet excited state of the host material;
$S_{FG}$: the level of the lowest singlet excited state of the guest material (the fluorescent material); and
$T_{FG}$: the level of the lowest triplet excited state of the guest material (the fluorescent material).

As shown in FIG. 2B, the $T_1$ level of the guest material ($T_{FG}$ in FIG. 2B) is higher than the $T_1$ level of the guest material ($T_{FH}$ in FIG. 2B).

In addition, as shown in FIG. 2B, triplet excitons collide with each other by triplet-triplet annihilation (TTA), and part of energy of them is converted into the level of the lowest singlet excited state of the host material ($S_{FH}$). Energy is transferred from the level of the lowest singlet excited state of the host material ($S_{FH}$) to the level of the lowest singlet excited state of the guest material (the fluorescent material) ($S_{FG}$) that is the level lower than $S_{FH}$ (see Route C in FIG. 2B); and thus the fluorescent material emits light.

Because the $T_1$ level of the host material is lower than the $T_1$ level of the guest material, energy is transferred from $T_{FG}$ to $T_{FH}$ without deactivation of $T_{FG}$ (see Route D in FIG. 2B) and is utilized for TTA.

<Light Emission Mechanism of First and Second Light-Emitting Layers>

Each light emission mechanism of the first light-emitting layer 113 and the second light-emitting layer 114 is described above. In the light-emitting element 100 of one embodiment of the present invention, even when energy is transferred from the exciplex to the host material of the first light-emitting layer 113 (in particular, when energy of the triplet excited level is transferred) at an interface between the first light-emitting layer 113 and the second light-emitting layer 114, triplet excitation energy can be converted into light emission in the first light-emitting layer 113.

Figure 3:
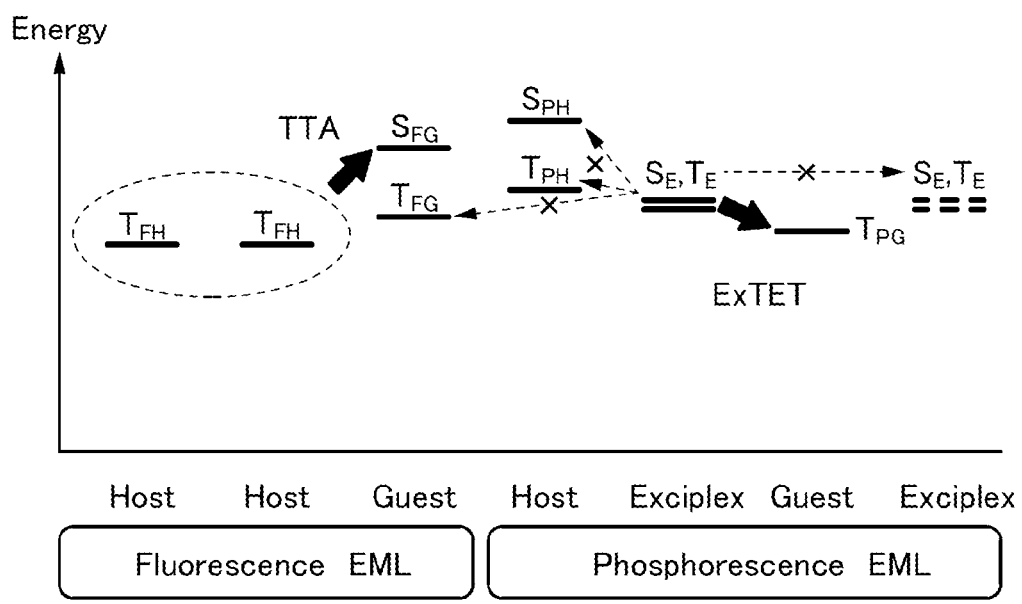
FIG. 3 shows a correlation of energy levels in light-emitting layers.

FIG. 3 shows a correlation of energy levels in the case where TTA is utilized in the first light-emitting layer 113 and ExTET is utilized in the second light-emitting layer 114. The following explains what terms and signs in FIG. 3 represent:

Fluorescence EML: the fluorescent light-emitting layer (the first light-emitting layer 113);
Phosphorescence EML: the phosphorescent light-emitting layer (the second light-emitting layer 114);

$T_{FH}$: the level of the lowest triplet excited state of the host material;

$S_{FG}$: the level of the lowest singlet excited state of the guest material (the fluorescent material);

$T_{FG}$: the level of the lowest triplet excited state of the guest material (the fluorescent material);

$S_{PH}$: the level of the lowest singlet excited state of the host material (the first organic compound);

$T_{PH}$: the level of the lowest triplet excited state of the host material (the first organic compound);

$T_{PG}$: the level of the lowest triplet excited state of the guest material (the phosphorescent material);

$S_E$: the level of the lowest singlet excited state of the exciplex; and $T_E$: the level of the lowest triplet excited state of the exciplex.

As shown in FIG. 3, the exciplex exists only in an excited state; thus, exciton diffusion between the exciplexes is not likely to occur. In addition, because the excited levels of the exciplex ($S_E$ and $T_E$) are lower than the excited levels of the first organic compound (the host material of the phosphorescent material) of the second light-emitting layer 114 ($S_{PH}$ and $T_{PH}$), energy diffusion from the exciplex to the first organic compound does not occur. That is, emission efficiency of the phosphorescent light-emitting layer (the second light-emitting layer 114) can be maintained because an exciton diffusion distance of the exciplex is short in the phosphorescent light-emitting layer (the second light-emitting layer 114). In addition, even when part of the triplet excitation energy of the exciplex of the phosphorescent light-emitting layer (the second light-emitting layer 114) diffuses into the fluorescent light-emitting layer (the first light-emitting layer 113) through the interface between the fluorescent light-emitting layer (the first light-emitting layer 113) and the phosphorescent light-emitting layer (the second light-emitting layer 114), energy loss can be reduced because the triplet excitation energy in the fluorescent light-emitting layer (the first light-emitting layer 113) caused by the diffusion is used for light emission through TTA.

The light-emitting element of one embodiment of the present invention can have emission efficiency exceeding the exciton generation probability when ExTET is utilized in the second light-emitting layer 114 and TTA is utilized in the first light-emitting layer 113 as described above. Thus, a light-emitting element with high efficiency can be provided.

Note that in FIG. 1A, the first light-emitting layer 113 is on the side of the first electrode 101 functioning as the anode and the second light-emitting layer 114 is on the side of the second electrode 102 functioning as the cathode. However, the stacking order may be reversed. Specifically, as shown by the light-emitting element 140 in FIG. 1B, the first light-emitting layer 113 and the second light-emitting layer 114 may be on the side of the electrode functioning as the cathode and on the side of the electrode functioning as the anode, respectively. In other words, the first light-emitting layer 113 is over the second light-emitting layer 114 in the light-emitting element 140.

Such a structure used for the light-emitting element 140 is preferable when a microcavity structure (described later) is employed because the optical path length of the second light-emitting layer 114 and/or the first light-emitting layer 113 is easily adjusted.

The details of the components of the light-emitting element 100 of one embodiment of the present invention are described below.

<Electrode>

The first electrode 101 and the second electrode 102 have functions of injecting holes and electrons, respectively, into the first light-emitting layer 113 and the second light-emitting layer 114. These electrodes can be formed of a metal, an alloy, or a conductive compound, or a mixture or a stack thereof, for example. A typical example of the metal is aluminum, besides, a transition metal such as silver, tungsten, chromium, molybdenum, copper, or titanium, an alkali metal such as lithium or cesium, or a Group 2 metal such as calcium or magnesium can be used. As the transition metal, a rare earth metal may be used. An alloy containing any of the above metals can be used as the alloy, and MgAg and AlLi can be given as examples. As the conductive compound, a metal oxide such as indium oxide-tin oxide (indium tin oxide) can be given. It is also possible to use an inorganic carbon-based material such as graphene as the conductive compound. As described above, the first electrode 101 and/or the second electrode 102 may be formed by stacking two or more of these materials.

Light emitted from the first light-emitting layer 113 and the second light-emitting layer 114 is extracted through the first electrode 101 and/or the second electrode 102. Therefore, at least one of the electrodes transmits visible light. In the case where the electrode through which light is extracted is formed using a material with low light permeability, such as metal or alloy, the first electrode 101, the second electrode 102, or part thereof is formed to a thickness that is thin enough to transmit visible light. In this case, the specific thickness is in a range from 1 nm to 10 nm.

<First Light-Emitting Layer>

The first light-emitting layer 113 includes the host material and the fluorescent material. In the first light-emitting layer 113, the host material is present in the highest proportion by weight, and the fluorescent material is dispersed in the host material. The $S_1$ level of the host material is higher than the $S_1$ level of the fluorescent material, and the $T_1$ level of the host material is lower than the $T_1$ level of the fluorescent material.

An anthracene derivative or a tetracene derivative is preferably used as the host material. This is because these derivatives each have a high $S_1$ level and a low $T_1$ level. Specific examples include 9-phenyl-3-[4-(10-phenyl-9-anthryl)phenyl]-9H-carbazole (PCzPA), 3-[4-(1-naphthyl)-phenyl]-9-phenyl-9H-carbazole (PCPN), 9-[4-(10-phenyl-9-anthracenyl)phenyl]-9H-carbazole (CzPA), 7-[4-(10-phenyl-9-anthryl)phenyl]-7H-dibenzo[c,g]carbazole (cgDBCzPA), 6-[3-(9,10-diphenyl-2-anthryl)phenyl]-benzo[b]naphtho[1,2-d]furan (2mBnfPPA), and 9-phenyl-10-{4-(9-phenyl-9H-fluoren-9-yl)biphenyl-4'-yl}anthracene (FLPPA). Besides, 5,12-diphenyltetracene, 5,12-bis(biphenyl-2-yl)tetracene, and the like can be given.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (1,6mMemFLPAPrn), N,N'-bis[4-(9-phenyl-9H-fluoren-9-yl)phenyl]-N,N'-diphenylpyrene-1,6-diamine (1,6FLPAPrn), N,N'-bis(dibenzofuran-2-yl)-N,N'-diphenylpyrene-1,6-diamine (1,6FrAPrn), and N,N'-bis(dibenzothiophen-2-yl)-N,N'-diphenylpyrene-1,6-diamine (1,6ThAPrn).

<Second Light-Emitting Layer>

The second light-emitting layer 114 includes the first organic compound, the second organic compound, and the phosphorescent material. Note that the first organic compound serves as the host material and the second organic compound serves as the assist material in the following description.

In the second light-emitting layer 114, the host material (the first organic compound) is present in the highest proportion by weight, and the phosphorescent material is dispersed in the host material. The $T_1$ level of the host material (the first organic compound) of the second light-emitting layer 114 is preferably higher than the $T_1$ level of the fluorescent material of the first light-emitting layer 113.

As the phosphorescent material, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given.

As the phosphorescent material, a material with a spectrum peak in the yellow wavelength region is preferred. In addition, it is preferred that an emission spectrum of the material with the peak in the yellow wavelength region include spectral components in the green and red wavelength regions.

Examples of the host material (the first organic compound) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples are an aromatic amine and a carbazole derivative.

As the second organic compound (the assist material), a substance which can form an exciplex together with the first organic compound is used. In this case, it is preferable that the first organic compound, the second organic compound, and the phosphorescent material be selected such that the emission peak of the exciplex overlaps with an adsorption band, specifically an adsorption band on the longest wavelength side, of a triplet metal to ligand charge transfer (MLCT) transition of the phosphorescent material. This makes it possible to provide a light-emitting element with drastically improved emission efficiency. However, if a material exhibiting thermally activated delayed fluorescence (TADF) is used instead of the phosphorescent material, it is preferred that an adsorption band on the longest wavelength side be an absorption band of a singlet. The TADF material is explained later.

There is no limitation on the emission colors of the first light-emitting material and the second light-emitting material, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the first light-emitting material is preferably shorter than that of the second light-emitting material.

For example, it is preferable that the first light-emitting material emit blue light and the second light-emitting material emit yellow light.

<Other Layers>

As illustrated in FIG. 1A, the light-emitting element 100 of one embodiment of the present invention may include another layer besides the first light-emitting layer 113 and the second light-emitting layer 114. For example, the light-emitting element may include a hole-injection layer, a hole-transport layer, an electron-blocking layer, a hole-blocking layer, an electron-transport layer, an electron-injection layer, and the like. Furthermore, each of these layers may be formed of a plurality of layers. These layers can reduce a carrier injection barrier, improve a carrier transport property, or suppress a quenching phenomenon by an electrode, thereby contributing to an improvement in emission efficiency or a reduction in a driving voltage. Each of these layers can be formed by any one or any combination of the following methods: an evaporation method (including a vacuum evaporation method), a printing method (such as relief printing, intaglio printing, gravure printing, planography printing, and stencil printing), an ink-jet method, a coating method, and the like.

<Hole-Injection Layer>

The hole-injection layer 111 has a function of reducing a barrier for hole injection from the first electrode 101 to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron accepting property, organic acceptors such as a quinodimethane derivative, a chloranil derivative, and a hexaazatriphenylene derivative can be given. Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1 \times 10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

<Hole-Transport Layer>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the first light-emitting layer 113, the highest occupied molecular orbital (HOMO) level of the hole-transport layer 112 is preferably equal or close to the HOMO level of the hole-injection layer 111.

<Electron-Transport Layer>

The electron-transport layer 115 has a function of transporting, to the second light-emitting layer 114, electrons injected from the second electrode 102 through the electron-injection layer 116. A material having a property of transporting more electrons than holes can be used as an electron-transport material, and a material having an electron mobility of $1 \times 10^{-6}$ cm$^2$/Vs or higher is preferable. Specific examples include a metal complex having a quinoline ligand, a benzoquinoline ligand, an oxazole ligand, or a thiazole ligand; an oxadiazole derivative; a triazole derivative; a phenanthroline derivative; a pyridine derivative; and a bipyridine derivative.

<Electron-Injection Layer>

The electron-injection layer 116 has a function of reducing a barrier for electron injection from the second electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron donating property, a Group 1 metal, a Group 2 metal, an oxide of any of the metals, or the like can be given.

<Substrate, FET, and the Like>

The light-emitting element 100 is fabricated over a substrate of glass, plastic, or the like. As the way of stacking layers over the substrate, layers may be sequentially stacked from the first electrode 101 side or sequentially stacked from the second electrode 102 side. The light-emitting element may be formed over an electrode electrically connected to a field-effect transistor (FET), for example, that is formed over a substrate of glass, plastic, or the like. Accordingly, an active matrix light-emitting device in which the FET controls the drive of the light-emitting element can be fabricated.

Although the light-emitting material included in the second light-emitting layer 114 is the phosphorescent material in the above description, the light-emitting material is not limited thereto. As the light-emitting material included in the second light-emitting layer 114, any material can be used as long as the material can convert the triplet excitation energy into light emission. As an example of the material that can convert the triplet excitation energy into light emission, a TADF material is given in addition to a phosphorescent material. Therefore, it is acceptable that the "phosphorescent material" in the description is replaced with the "TADF material. Note that the TADF material is a substance that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV.

It is to be noted that this embodiment can be combined appropriately with other embodiments.

Embodiment 2

Figure 4A:
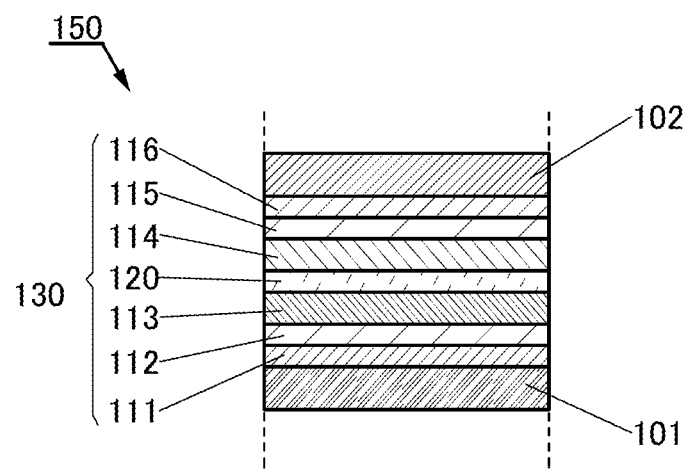
FIGS. 4A and 4B are schematic cross-sectional views illustrating light-emitting elements of one embodiment of the present invention.
Figure 4B:
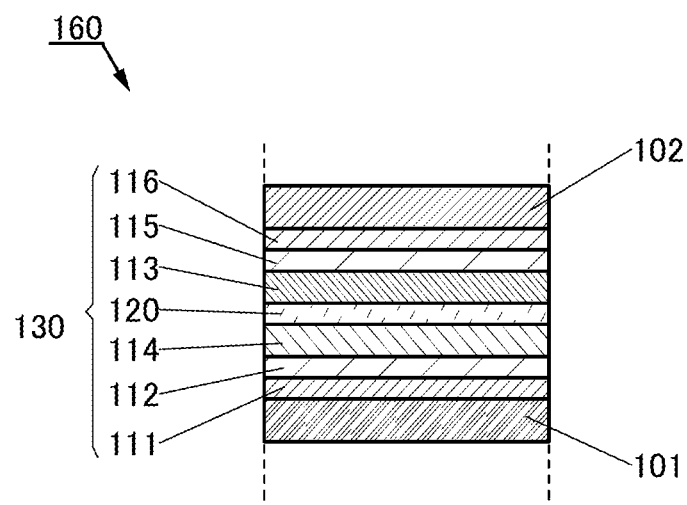

Light-emitting elements with different structures from those of the light-emitting elements 100 and 140 shown in Embodiment 1 are described in this embodiment with reference to FIGS. 4A and 4B. FIG. 4A is a schematic cross-sectional view of a light-emitting element 150 of one embodiment of the present invention, and FIG. 4B is a schematic cross-sectional view of a light-emitting element 160 of one embodiment of the present invention.

The light-emitting element 150 is different from the light-emitting element 100 in that a separation layer 120 is provided between the first light-emitting layer 113 and the second light-emitting layer 114. The separation layer 120 is in contact with the first light-emitting layer 113 and the second light-emitting layer 114. The structures of the other layers are similar to those in Embodiment 1; therefore, description thereof is omitted.

The separation layer 120 is provided to prevent energy transfer by the Dexter mechanism (particularly triplet energy transfer) from the first organic compound in an excited state or the phosphorescent material in an excited state which is generated in the second light-emitting layer 114 to the host material or the fluorescent material in the first light-emitting layer 113. Therefore, the thickness of the separation layer may be approximately several nanometers, specifically 0.1 nm or more and 20 nm or less, 1 nm or more and 10 nm or less, or 1 nm or more and 5 nm or less.

The separation layer 120 may contain a single material or both a hole-transport material and an electron-transport material. In the case of a single material, a bipolar material may be used. The bipolar material here refers to a material in which the ratio between the electron mobility and the hole mobility is 100 or less. As a material contained in the separation layer 120, the hole-transport material, the electron-transport material, or the like given as an example in Embodiment 1 can be used. Furthermore, at least one of materials contained in the separation layer 120 may be the same as the host material (the first organic compound) of the second light-emitting layer 114. This facilitates the manufacture of the light-emitting element and reduces the driving voltage.

For example, when the separation layer 120 is formed of the same materials as the host material (the first organic compound) and the assist material (the second organic compound) of the second light-emitting layer 114, the first light-emitting layer 113 and the second light-emitting layer 114 are stacked with each other while the layer (the separation layer 120) not including the phosphorescent material of the second light-emitting layer 114 is provided therebetween. In the case of such a structure, depending on using or not using the phosphorescent material, the second light-emitting layer 114 or the separation layer 120 can be deposited. In other words, the separation layer 120 includes a region not including the phosphorescent material while the second light-emitting layer 114 includes a region including the phosphorescent material. In the case of such a structure, the separation layer 120 and the second light-emitting layer 114 can be formed in the same chamber. Thus, the manufacturing cost can be reduced.

Alternatively, at least one of materials contained in the separation layer 120 may have a higher $T_1$ level than the host material (the first organic compound) of the second light-emitting layer 114.

The recombination region can be adjusted by adjusting the mixture ratio of the hole-transport material and the electron-transport material, whereby the emission color can be controlled. For example, in the case where the first electrode 101 and the second electrode 102 serve as an anode and a cathode, respectively, the recombination region can be shifted from the first electrode 101 side to the second electrode 102 side by increasing the proportion of the hole-transport material in the separation layer 120. As a result, the contribution of the second light-emitting layer 114 to light emission can be increased. In contrast, by increasing the proportion of the electron-transport material, the recombination region can be shifted from the second electrode 102 side to the first electrode 101 side, so that the contribution of the first light-emitting layer 113 to light emission can be increased. In the case where the first light-emitting layer 113 and the second light-emitting layer 114 have different emission colors, the emission color of the light-emitting element can be changed as a whole.

The hole-transport material and the electron-transport material may form an exciplex in the separation layer 120, which effectively prevents exciton diffusion. Specifically, energy transfer from the host material (the first organic compound) of the second light-emitting layer 114 in an excited state or the phosphorescent material in an excited state to the host material of the first light-emitting layer 113 or the fluorescent material can be prevented.

As in the light-emitting element 140 described in Embodiment 1, the first light-emitting layer 113 may be positioned over the second light-emitting layer 114. Specifically, as shown by the light-emitting element 160 in FIG. 4B, it is acceptable that the second light-emitting layer 114 is provided over the hole-transport layer 112, and the first light-emitting layer 113 is provided over the second light-emitting layer 114 with the separation layer 120 provided therebetween.

The structure described in this embodiment can be used in appropriate combination with any of the structures described in the other embodiments.

Embodiment 3

Figure 5:
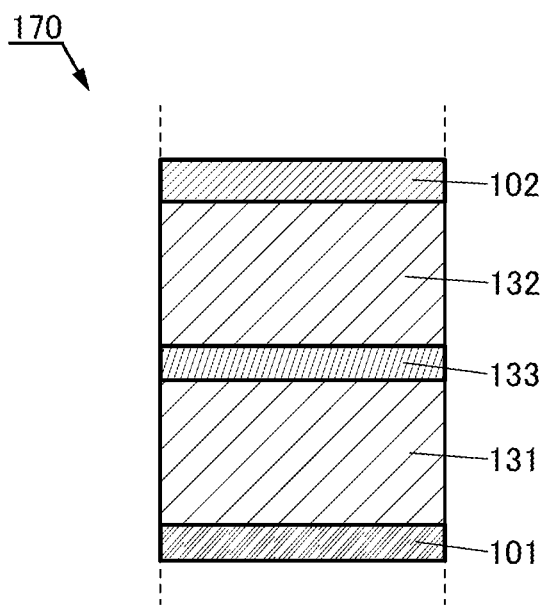
FIG. 5 is a schematic cross-sectional view illustrating a light-emitting element of one embodiment of the present invention.

In this embodiment, a light-emitting element of one embodiment of the present invention is described with reference to FIG. 5. FIG. 5 is a schematic cross-sectional view of a light-emitting element 170 of one embodiment of the present invention.

The light-emitting element 170 includes a plurality of light-emitting units (a first light-emitting unit 131 and a second light-emitting unit 132 in FIG. 5) between the first electrode 101 and the second electrode 102. One light-emitting unit has the same structure as the EL layer 130 illustrated in FIG. 1A or 1B. That is, the light-emitting element 100 in FIG. 1A includes one light-emitting unit while the light-emitting element 170 includes the plurality of light-emitting units.

In the light-emitting element 170 shown in FIG. 5, the first light-emitting unit 131 and the second light-emitting unit 132 are stacked, and a charge generation layer 133 is provided between the first light-emitting unit 131 and the second light-emitting unit 132. Note that the first light-emitting unit 131 and the second light-emitting unit 132 may have the same structure or different structures.

The charge generation layer 133 may include a composite material of an organic compound and metal oxide. For the composite material, the composite material that can be used for the hole-injection layer 111 described above may be used. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1 \times 10^{-6}$ cm$^2$/Vs or higher is preferably used. Note that any other substance may be used as long as the substance has a hole-transport property higher than an electron-transport property. Since the composite material of an organic compound and a metal oxide is superior in carrier-injecting property and carrier-transporting property, low-voltage driving or low-current driving can be realized. Note that when a surface of a light-emitting unit on the anode side is in contact with the charge generation layer 133, the charge generation layer 133 can also serve as a hole-transport layer of the light-emitting unit; thus, a hole-transport layer does not need to be formed in the light-emitting unit.

The charge generation layer 133 may have a stacked-layer structure of a layer containing the composite material of an organic compound and a metal oxide and a layer containing another material. For example, the charge generation layer 133 may be formed using a combination of a layer containing the composite material of an organic compound and a metal oxide with a layer containing one compound selected from among electron-donating substances and a compound having a high electron-transporting property. Further, the charge generation layer 133 may be formed using a combination of a layer containing the composite material of an organic compound and a metal oxide with a transparent conductive film.

In any case, as the charge-generation layer 133, which is provided between the first light-emitting unit 131 and the second light-emitting unit 132, acceptable is a layer which injects electrons into the light-emitting unit on one side and injects holes into the light-emitting unit on the other side when voltage is applied to the first electrode 101 and the second electrode 102. For example, in FIG. 5, when a voltage is applied such that a potential of the first electrode 101 is higher than a potential of the second electrode 102, any structure may be used for the charge generation layer 133, as long as the charge generation layer 133 injects electrons and holes into the first light-emitting unit 131 and the second light-emitting unit 132, respectively.

In FIG. 5, the light-emitting element having two light-emitting units is described; however, one embodiment of the present invention can be similarly applied to a light-emitting element in which three or more light-emitting units are stacked. With a plurality of light-emitting units partitioned by the charge generation layer between a pair of electrodes as in the light-emitting element 170, it is possible to provide a light-emitting element which can emit light with high luminance with the current density kept low and has a long lifetime. A light-emitting device that can be driven at a low voltage and has low power consumption can be realized.

When the above-described structure of the EL layer 130 is used for at least one of the plurality of units, the number of manufacturing steps of the unit can be reduced; thus, a multicolor light-emitting element which is advantageous for practical application can be provided.

The above-described structure can be combined with any of the structures in this embodiment and the other embodiments.

Embodiment 4

In this embodiment, a light-emitting device manufactured using the light-emitting element described in any of Embodiments 1 to 3 will be described with reference to FIGS. 6A and 6B.

Figure 6A:
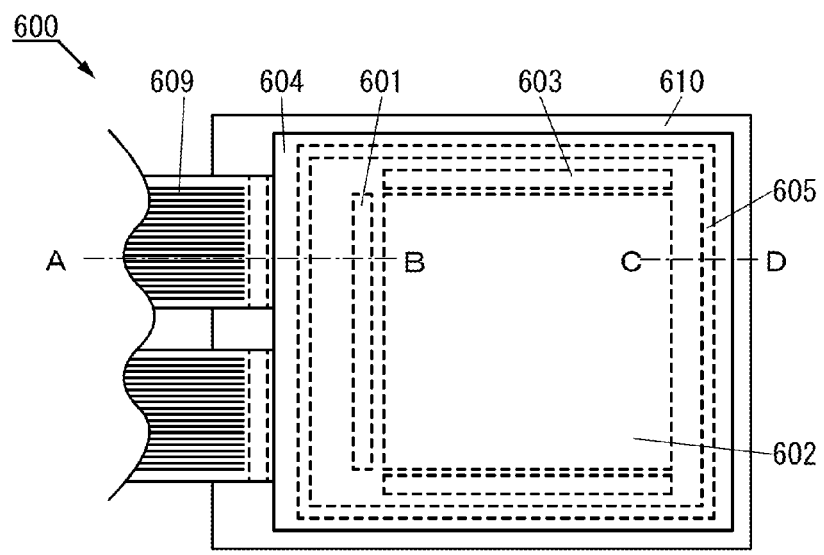
FIGS. 6A and 6B are a top view and a cross-sectional view, respectively, illustrating a light-emitting device of one embodiment of the present invention.
Figure 6B:
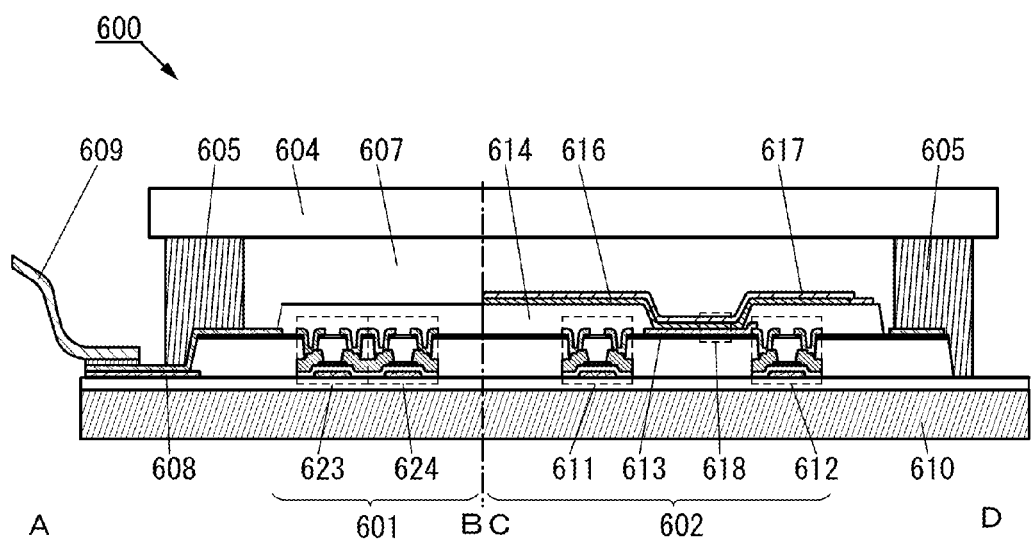

FIG. 6A is a top view illustrating a light-emitting device 600 and FIG. 6B is a cross-sectional view taken along the dashed-dotted line A-B and the dashed-dotted line C-D in FIG. 6A. The light-emitting device 600 includes driver circuit portions (a source line driver circuit portion 601 and a gate line driver circuit portion 603) and a pixel portion 602. Note that the source line driver circuit portion 601, the gate line driver circuit portion 603, and the pixel portion 602 have a function of controlling light emission of a light-emitting element.

The light-emitting device 600 also includes an element substrate 610, a sealing substrate 604, a sealing member 605, a region 607 surrounded by the sealing member 605, a lead wiring 608, and an FPC 609.

Note that the lead wiring 608 is a wiring for transmitting signals to be input to the source line driver circuit portion 601 and the gate line driver circuit portion 603 and for receiving a video signal, a clock signal, a start signal, a reset signal, and the like from the FPC 609 serving as an external input terminal. Although only the FPC 609 is shown here, the FPC 609 may be provided with a printed wiring board (PWB).

In the source line driver circuit portion 601, a CMOS circuit is formed in which an n-channel FET 623 and a p-channel FET 624 are combined. Note that the source line driver circuit portion 601 or the gate line driver circuit portion 603 may be formed with various kinds of CMOS circuits, NMOS circuits, and PMOS circuits. In this embodiment, although a driver-integrated type structure in which a driver circuit portion is formed over a substrate is described, a driver circuit portion is not necessarily formed over a substrate but can be formed outside a substrate.

The pixel portion 602 includes a switching FET 611, a current control FET 612, and a first electrode 613 electrically connected to a drain of the current control FET 612. It is to be noted that an insulator 614 is formed to cover an edge of the first electrode 613. As the insulator 614, for example, a positive type photosensitive acrylic resin film can be used.

The insulator 614 is formed to have a curved surface with curvature at an upper edge or a lower edge thereof in order to obtain favorable coverage. For example, in the case where positive photosensitive acrylic is used for a material of the insulator 614, it is preferred that only the upper end portion of the insulator 614 has a curved surface with a curvature radius (0.2 µm to 3 µm). As the insulator 614, either a negative photosensitive resin or a positive photosensitive resin can be used.

Note that there is no particular limitation on a structure of each of the FETs (the FETs 611, 612, 623, and 624). For example, a staggered transistor can be used. In addition, there is no particular limitation on a conductivity type of each transistor. For these transistors, n-type and p-type transistors may be used, or either n-type transistors or p-type transistors may be used, for example. Furthermore, there is no particular limitation on crystallinity of a semiconductor film used for the transistor. For example, an amorphous semiconductor film or a crystalline semiconductor film may be used. Examples of a semiconductor material include Group 13 semiconductors (e.g., gallium), Group 14 semiconductors (e.g., silicon), compound semiconductors (including oxide semiconductors), organic semiconductors, and the like. For example, an oxide semiconductor that has an energy gap of 2 eV or more, preferably 2.5 eV or more, further preferably 3 eV or more is preferably used for the transistors, so that the off-state current of the transistors can be reduced. Examples of the oxide semiconductor include an In—Ga oxide, an In-M-Zn oxide (M is Al, Ga, Y, Zr, La, Ce, or Nd), and the like.

An EL layer 616 and a second electrode 617 are formed over the first electrode 613. Here, the first electrode 613 serves as an anode and the second electrode 617 serves as a cathode.

The EL layer 616 can be formed by a method such as an evaporation method (including a vacuum evaporation method), a printing method (such as relief printing, intaglio printing, gravure printing, planography printing, and stencil printing), an ink-jet method, or a coating method. The EL layer 616 has the structure described in any of Embodiments 1 to 3. As another material included in the EL layer 616, a low molecular compound or a high molecular compound (including an oligomer or a dendrimer) may be used.

Note that the light-emitting element 618 is formed with the first electrode 613, the EL layer 616, and the second electrode 617. The light-emitting element 618 has any of the structures shown in Embodiments 1 to 3. In the case where the pixel portion includes a plurality of light-emitting elements, the pixel portion may include both the light-emitting element described in any of Embodiments 1 to 3 and a light-emitting element having a different structure.

When the sealing substrate 604 and the element substrate 610 are attached to each other with the sealing member 605, the light-emitting element 618 is provided in the region 607 surrounded by the element substrate 610, the sealing substrate 604, and the sealing member 605. Note that the region 607 is filled with filler, specifically filled with an inert gas (such as nitrogen or argon) in some cases, or filled with the sealing member 605 in other cases. It is preferable that the sealing substrate be provided with a recessed portion and the drying agent (not illustrated in the drawing) be provided in the recessed portion, in which case deterioration due to influence of moisture can be suppressed.

An epoxy-based resin or glass frit is preferably used for the sealing member 605. The material preferably allows as little moisture and oxygen as possible to penetrate. As the sealing substrate 604, a glass substrate, a quartz substrate, or a plastic substrate formed of fiber reinforced plastic (FRP), polyvinyl fluoride) (PVF), polyester, acrylic, or the like can be used.

As described above, the light-emitting device which uses the light-emitting element described in any of Embodiments 1 to 3 can be obtained.

The light-emitting device 600 in this embodiment is fabricated using the light-emitting element described in any of Embodiments 1 to 3 and thus can have favorable characteristics. Specifically, since the light-emitting element described in any of Embodiments 1 to 3 has high emission efficiency, the light-emitting device can have reduced power consumption. In addition, since the light-emitting element is easy to mass-produce, the light-emitting device can be provided at low cost.

FIGS. 7A and 7B each illustrate an example of a cross-sectional view of a light-emitting device in which full color display is achieved by formation of a light-emitting element exhibiting white light emission and use of coloring layers (color filters) and the like.

In FIG. 7A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024Y, 1024R, 1024G, and 1024B of light-emitting elements, a partition 1025, an EL layer 1028, a second electrode 1026 of the light-emitting elements, a sealing substrate 1031, a sealing member 1032, and the like are illustrated.

In FIG. 7A, coloring layers (a red coloring layer 1034R, a green coloring layer 1034G, a blue coloring layer 1034B, and a yellow coloring layer 1034Y) are provided on a transparent base material 1033. Further, a black layer (black matrix) 1035 may be provided. The transparent base material 1033 provided with the coloring layers and the black layer is positioned and fixed to the substrate 1001. Note that the coloring layers and the black layer are covered with an overcoat layer 1036. In the structure in FIG. 7A, red light, blue light, green light, and yellow light transmit the coloring layers, and thus an image can be displayed with the use of pixels of four colors.

FIG. 7B illustrates an example in which coloring layers (the red coloring layer 1034R, the green coloring layer 1034G, and the blue coloring layer 1034B) are formed between the gate insulating film 1003 and the first interlayer insulating film 1020. As in the structure, the coloring layers may be provided between the substrate 1001 and the sealing substrate 1031. Note that the yellow coloring layer is not necessarily provided as shown in FIG. 7B because the light-emitting element of one embodiment of the present invention can emit light with a yellow wavelength.

The above-described light-emitting device is a light-emitting device having a structure in which light is extracted from the substrate 1001 side where the FETs are formed (a bottom emission structure), but a light-emitting device having a structure in which light is extracted from the sealing substrate 1031 side (a top emission structure) is also acceptable.

Figure 8:
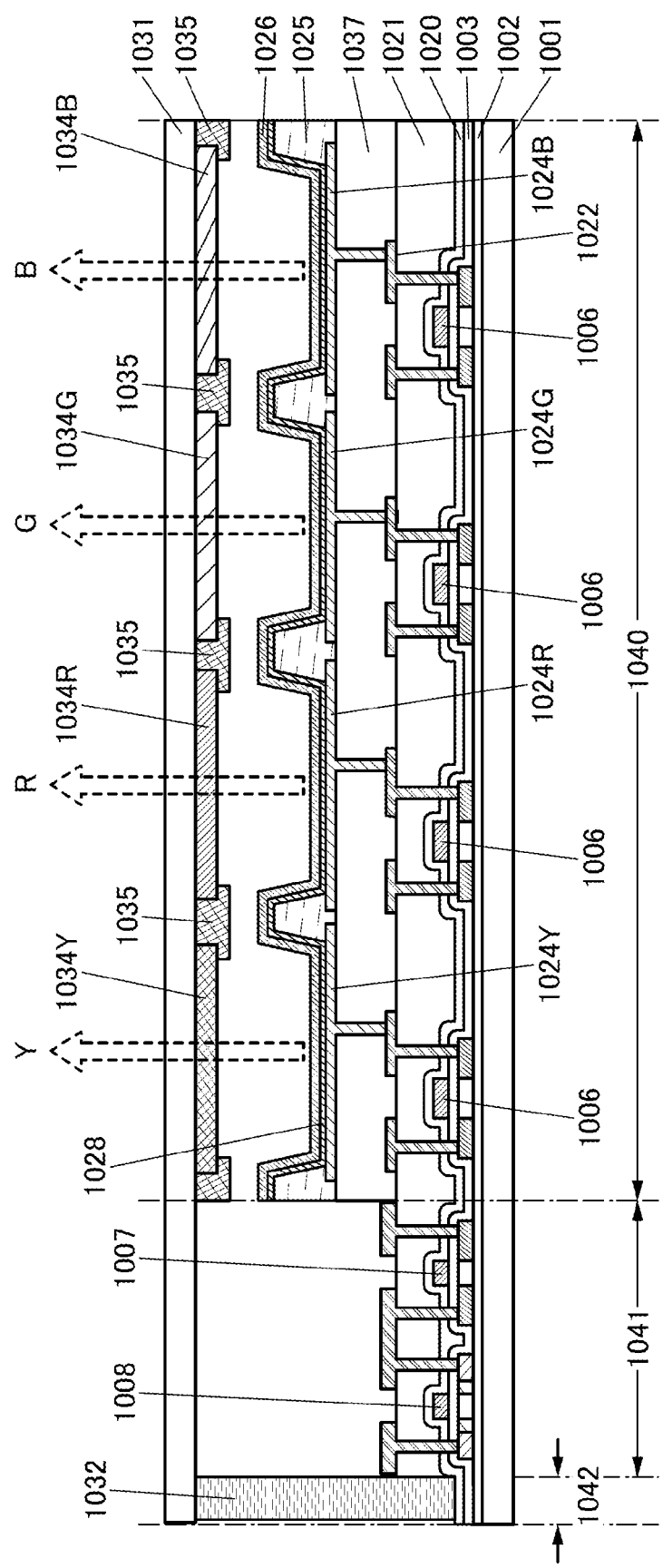
FIG. 8 is a cross-sectional view illustrating a light-emitting device of one embodiment of the present invention.

FIG. 8 is a cross-sectional view of a light-emitting device having a top emission structure. In this case, as the substrate 1001, a substrate that does not transmit light can be used. The process up to the step of forming a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may function for planarization. The third interlayer insulating film 1037 can be formed by using a material similar to that of the second interlayer insulating film, or can be formed by using any other materials.

The first electrodes 1024Y, 1024R, 1024G, and 1024B of the light-emitting elements each serve as an anode here, but may serve as a cathode. Further, in the case of a light-emitting device having a top emission structure as illustrated in FIG. 8, the first electrodes 1024Y, 1024R, 1024G, and 1024B are preferably reflective electrodes. The EL layer 1028 is formed to have a structure similar to the structure of the EL layer 130, which is described in any of Embodiments 1 to 3, with which white light emission can be obtained.

In FIG. 8, a second electrode 1026 is formed over the EL layer 1028. The second electrode 1026 may be a semi-transmissive and semi-reflective electrode, and a micro optical resonator (microcavity) structure utilizing a resonant effect of light between the second electrode 1026 and the first electrodes 1024Y, 1024R, 1024G, and 1024B may be used so as to increase the intensity of light having a specific wavelength.

In the case of a top emission structure as illustrated in FIG. 8, sealing can be performed with the sealing substrate 1031 on which the coloring layers (the red coloring layer 1034R, the green coloring layer 1034G, the blue coloring layer 1034B, and the yellow coloring layer 1034Y) are provided. The sealing substrate 1031 may be provided with a black layer 1035 which is positioned between pixels. The color layers (the red coloring layer 1034R, the green coloring layer 1034G, and the blue coloring layer 1034B, and the yellow coloring layer 1034Y) and the black layer 1035 may be covered with the overcoat layer (not illustrated in the drawing). Note that a light-transmitting substrate is used as the sealing substrate 1031.

Figure 9A:
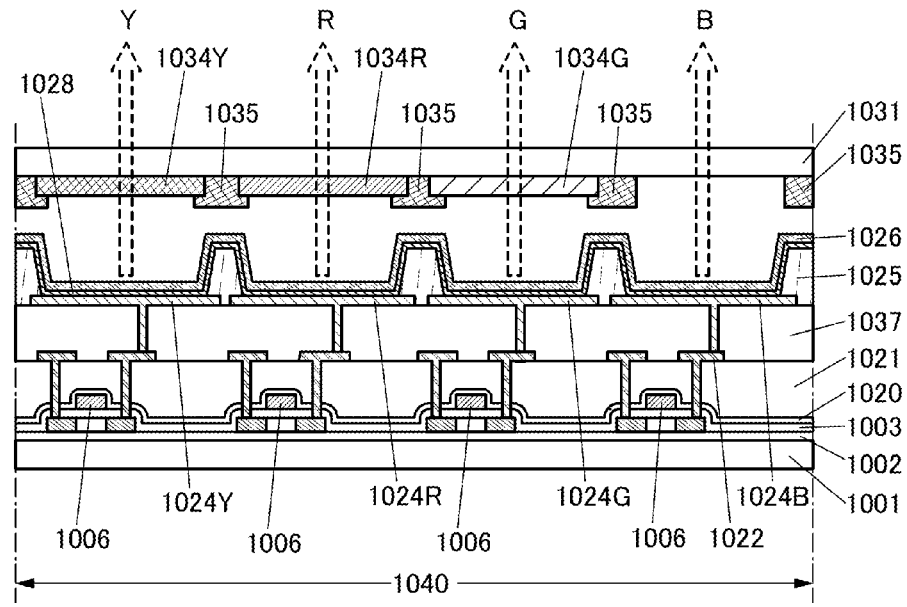
FIGS. 9A and 9B are cross-sectional views illustrating light-emitting devices of one embodiment of the present invention.
Figure 9B:
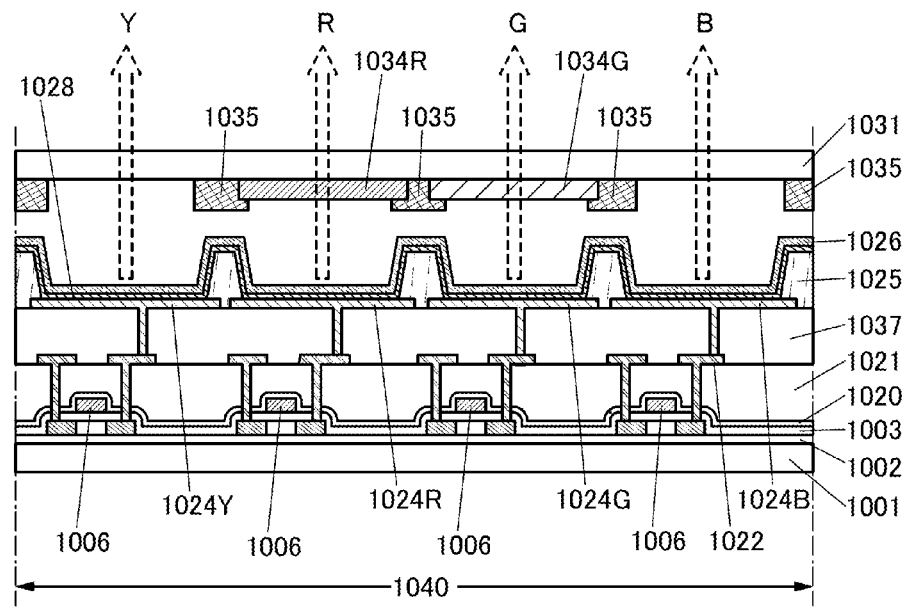

FIG. 8 shows the structure provided with the light-emitting elements from which white light emission can be obtained and the coloring layers for the light-emitting elements as an example; however, the structure is not limited thereto. For example, as shown in FIG. 9A, a structure including the light-emitting elements from which white light emission can be obtained, the red coloring layer 1034R, the green coloring layer 1034G, and the yellow coloring layer 1034Y while not including the blue coloring layer may be employed in order to achieve full color display with the four colors of red, green, blue, and yellow. Alternatively, as shown in FIG. 9B, a structure including the light-emitting elements from which white light emission can be obtained, the red coloring layer 1034R, and the green coloring layer 1034G while not including the blue coloring layer and the yellow coloring layer may be employed in order to achieve full color display with the four colors of red, green, blue, and yellow. The structure as shown in FIG. 8 where the coloring layer is provided to each of the light-emitting element from which white light emission can be obtained is effective to suppress reflection of outside light. In contrast, the structure as shown in FIG. 9B where the light-emitting elements from which white light emission can be obtained are provided with the red coloring layer and the green coloring layer and without the blue and yellow coloring layers is effective to reduce power consumption because of small energy loss of light emitted from the light-emitting elements.

Figure 10A:
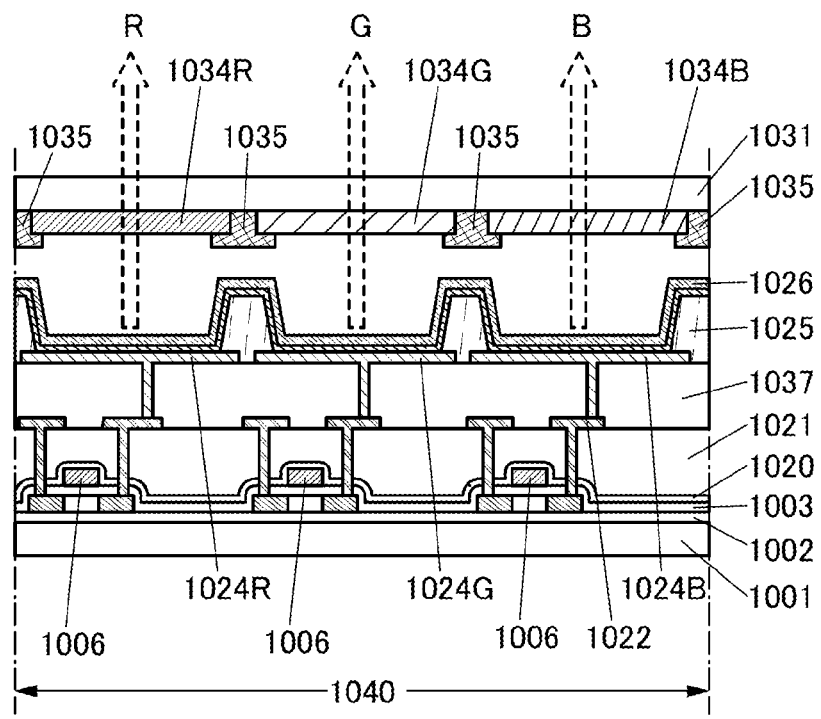
FIGS. 10A and 10B are cross-sectional views illustrating light-emitting devices of one embodiment of the present invention.
Figure 10B:
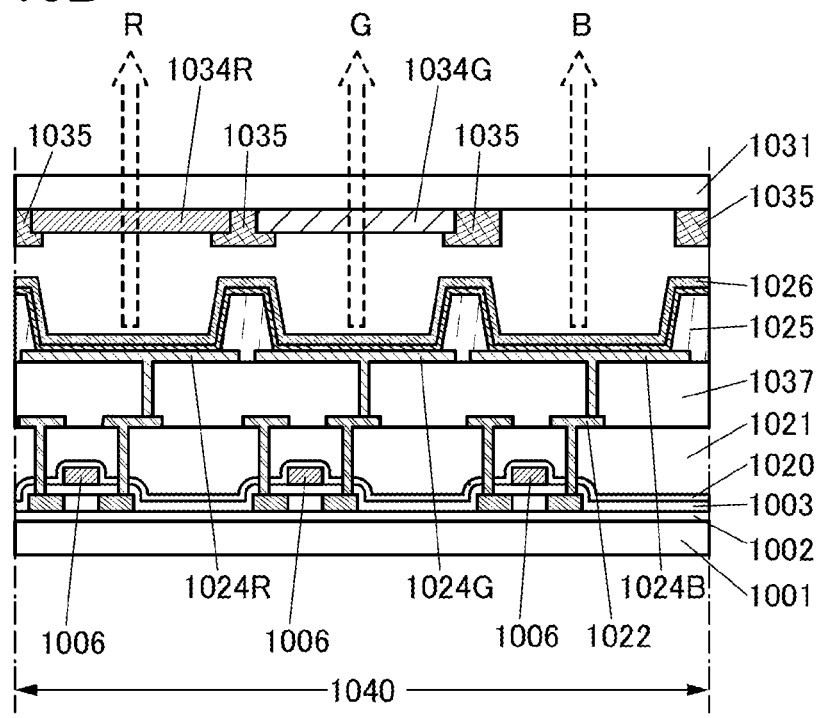

Alternatively, a structure as shown in FIG. 10A, including the light-emitting elements from which white light emission can be obtained and the coloring layers for the light-emitting layers to achieve full color display with three colors of red, green, and blue, may be employed. Alternatively, a structure as shown in FIG. 10B, including the light-emitting elements from which white light emission can be obtained, the red coloring layer 1034R, and the green coloring layer 1034G while not including the blue coloring layer to achieve full color display with three colors of red, green, and blue, may be employed.

Note that FIGS. 9A and 9B and FIGS. 10A and 10B are each a schematic cross-sectional view for illustrating the light-emitting device of one embodiment of the present invention, and the driver circuit portion 1041, the peripheral portion 1042, and the like, which are shown in FIG. 8, are not illustrated therein. In the structures of FIGS. 9A and 9B and FIGS. 10A and 10B, the microcavity structure may be employed as in the structure of FIG. 8.

The light-emitting device in this embodiment is fabricated using the light-emitting element described in any of Embodiments 1 to 3 and thus can have favorable characteristics. Specifically, since the light-emitting element described in any of Embodiments 1 to 3 has high emission efficiency, the light-emitting device can have reduced power consumption. When the light-emitting element described in any of Embodiments 1 to 3 is combined with the coloring layer such as the color filter, an optimum element structure can be formed from which white light emission can be obtained. In addition, since the structure of the light-emitting element described in any of Embodiments 1 to 3 is easy to mass-produce, the light-emitting device can be provided at low cost.

The above-described structure can be combined with any of the structures in this embodiment and the other embodiments.

Embodiment 5

In this embodiment, a display device that includes a lithe-emitting device of one embodiment of the present invention is described with reference to FIGS. 11A and 11B.

Figure 11A:
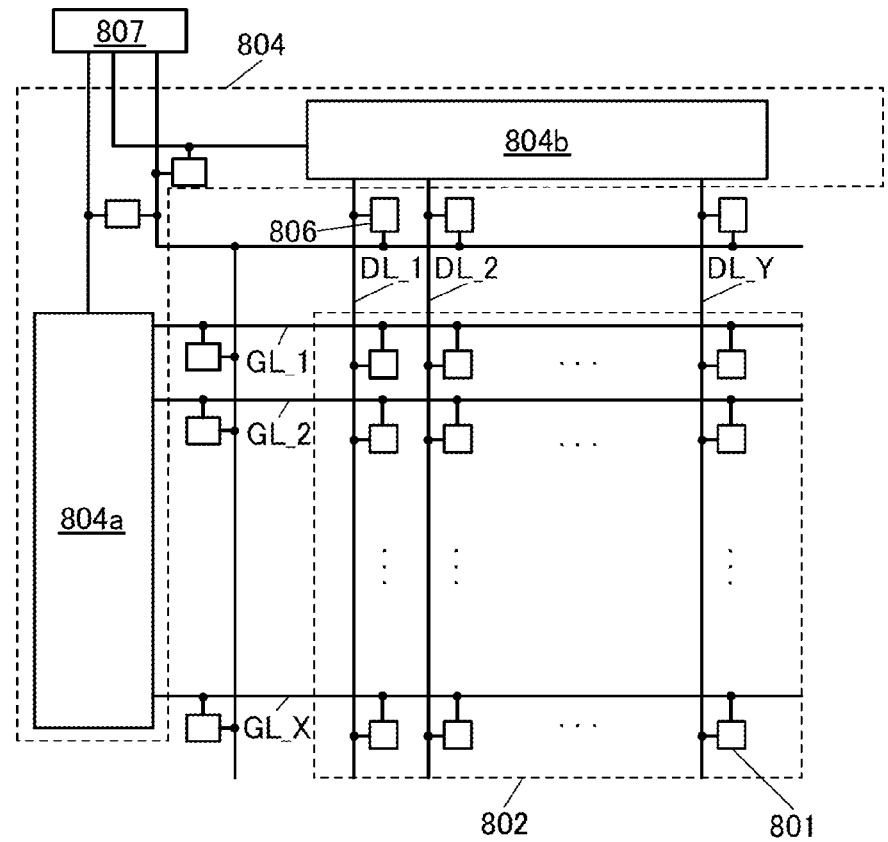
FIGS. 11A and 11B are a block diagram and a circuit diagram, respectively, illustrating a display device of one embodiment of the present invention.
Figure 11B:
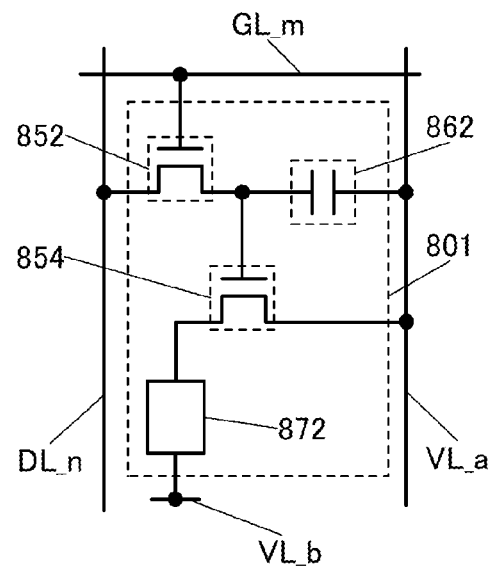

FIG. 11A is a block diagram illustrating the display device of one embodiment of the present invention, and FIG. 11B is a circuit diagram illustrating a pixel circuit of the display device of one embodiment of the present invention.

The display device illustrated in FIG. 11A includes a region including pixels of display elements (hereinafter the region is referred to as a pixel portion 802), a circuit portion provided outside the pixel portion 802 and including a circuit for driving the pixels (hereinafter the portion is referred to as a driver circuit portion 804), circuits having a function of protecting elements (hereinafter the circuits are referred to as protection circuits 806), and a terminal portion 807. Note that the protection circuits 806 are not necessarily provided.

A part or the whole of the driver circuit portion 804 is preferably formed over a substrate over which the pixel portion 802 is formed. Thus, the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes circuits for driving a plurality of display elements arranged in X rows (X is a natural number of 2 or more) and Y columns (Y is a natural number of 2 or more) (hereinafter, such circuits are referred to as pixel circuits 801). The driver circuit portion 804 includes driver circuits such as a circuit for supplying a signal (scan signal) to select a pixel (hereinafter the circuit is referred to as a gate driver 804a) and a circuit for supplying a signal (data signal) to drive a display element in a pixel (hereinafter, the circuit is referred to as a source driver 804b).

The gate driver 804a includes a shift register or the like. The gate driver 804a receives a signal for driving the shift register through the terminal portion 807 and outputs a signal. For example, the gate driver 804a receives a start pulse signal, a clock signal, or the like and outputs a pulse signal. The gate driver 804a has a function of controlling the potentials of wirings supplied with scan signals (hereinafter, such wirings are referred to as scan lines GL_1 to GL_X). Note that a plurality of gate drivers 804a may be provided to control the scan lines GL_1 to GL_X separately. Alternatively, the gate driver 804a has a function of supplying an initialization signal. Not limited thereto, the gate driver 804a can supply another signal.

The source driver 804b includes a shift register or the like. The source driver 804b receives a signal (video signal) from which a data signal is derived, as well as a signal for driving the shift register, through the terminal portion 807. The source driver 804b has a function of generating a data signal to be written in the pixel circuits 801 based on the video signal. In addition, the source driver 804b has a function of controlling output of a data signal in response to a pulse signal produced by input of a start pulse signal, a clock signal, or the like. Further, the source driver 804b has a function of controlling the potentials of wirings supplied with data signals (hereinafter, such wirings are referred to as data lines DL_1 to DL_Y). Alternatively, the source driver 804b has a function of supplying an initialization signal. Not limited thereto, the source driver 804b can supply another signal.

Alternatively, the source driver 804b is formed using a plurality of analog switches or the like, for example. The source driver 804b can output, as the data signals, signals obtained by time-dividing the video signal by sequentially turning on the plurality of analog switches. The source driver 804b may include a shift register or the like.

A pulse signal and a data signal are input, through one of the plurality of scan lines GL supplied with scan signals and one of the plurality of data lines DL supplied with data signals, respectively, to each of the plurality of the pixel circuits 801. Writing and holding of the data signal in each of the plurality of pixel circuits 801 are controlled by the gate driver 804a. For example, to the pixel circuit 801 in the m-th row and the n-th column (m is a natural number of less than or equal to X, and n is a natural number of less than or equal to Y), a pulse signal is input from the gate driver 804a through the scan line GL_m, and a data signal is input from the source driver 804b through the data line DL_n in accordance with the potential of the scan line GL_m.

The protection circuit 806 shown in FIG. 11A is connected to, for example, the scan line GL between the gate driver 804a and the pixel circuits 801. Alternatively, the protection circuit 806 is connected to the data line DL between the source driver 804b and the pixel circuit 801. Alternatively, the protection circuit 806 can be connected to a wiring between the gate driver 804a and the terminal portion 807. Alternatively, the protection circuit 806 can be electrically connected to a wiring between the source driver 804b and the terminal portion 807. Note that the terminal portion 807 means a portion having terminals for inputting power, control signals, and video signals to the display device from external circuits.

The protection circuit 806 is a circuit which electrically conducts a wiring connected to the protection circuit to another wiring when a potential out of a certain range is supplied to the wiring connected to the protection circuit.

As illustrated in FIG. 11A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, the protection circuit 806 may be configured to be connected to the gate driver 804a or the protection circuit 806 may be configured to be connected to the source driver 804b. Alternatively, the protection circuit 806 may be configured to be connected to the terminal portion 807.

In FIG. 11A, an example in which the driver circuit portion 804 includes the gate driver 804a and the source driver 804b is shown; however, the structure is not limited thereto. For example, only the gate driver 804a may be formed and a separately prepared substrate where a source driver circuit is formed (e.g., a driver circuit substrate formed with a single crystal semiconductor film or a polycrystalline semiconductor film) may be mounted.

Each of the plurality of pixel circuits 801 in FIG. 11A can have the structure illustrated in FIG. 11B, for example.

The pixel circuit 801 shown in FIG. 11B includes transistors 852 and 854, a capacitor 862, and a light-emitting element 872.

One of a source electrode and a drain electrode of the transistor 852 is electrically connected to a wiring to which a data signal is supplied (hereinafter referred to as a signal line DL_n). A gate electrode of the transistor 852 is electrically connected to a wiring to which a gate signal is supplied (hereinafter referred to as a scan line GL_m).

The transistor 852 has a function of controlling whether to write a data signal by being turned on or off.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Further, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, the light-emitting element described in any of Embodiments 1 to 3 can be used.

A high power supply potential VDD is supplied to one of the potential supply line VL_a and the potential supply line VL_b, and a low power supply potential VSS is supplied to the other.

For example, in the display device including the pixel circuit 801 in FIG. 11B, the pixel circuits 801 are sequentially selected row by row by the gate driver 804*a* illustrated in FIG. 11A, whereby the transistor 852 is turned on and a data signal is written.

When the transistor 852 is turned off, the pixel circuits 801 in which the data has been written are brought into a holding state. Further, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

The structure described in this embodiment can be used in appropriate combination with the structure described in any of the other embodiments.

Embodiment 6

In this embodiment, a display module and electronic devices that include a light-emitting device of one embodiment of the present invention are described with reference to FIG. 12 and FIGS. 13A to 13G.

Figure 12:
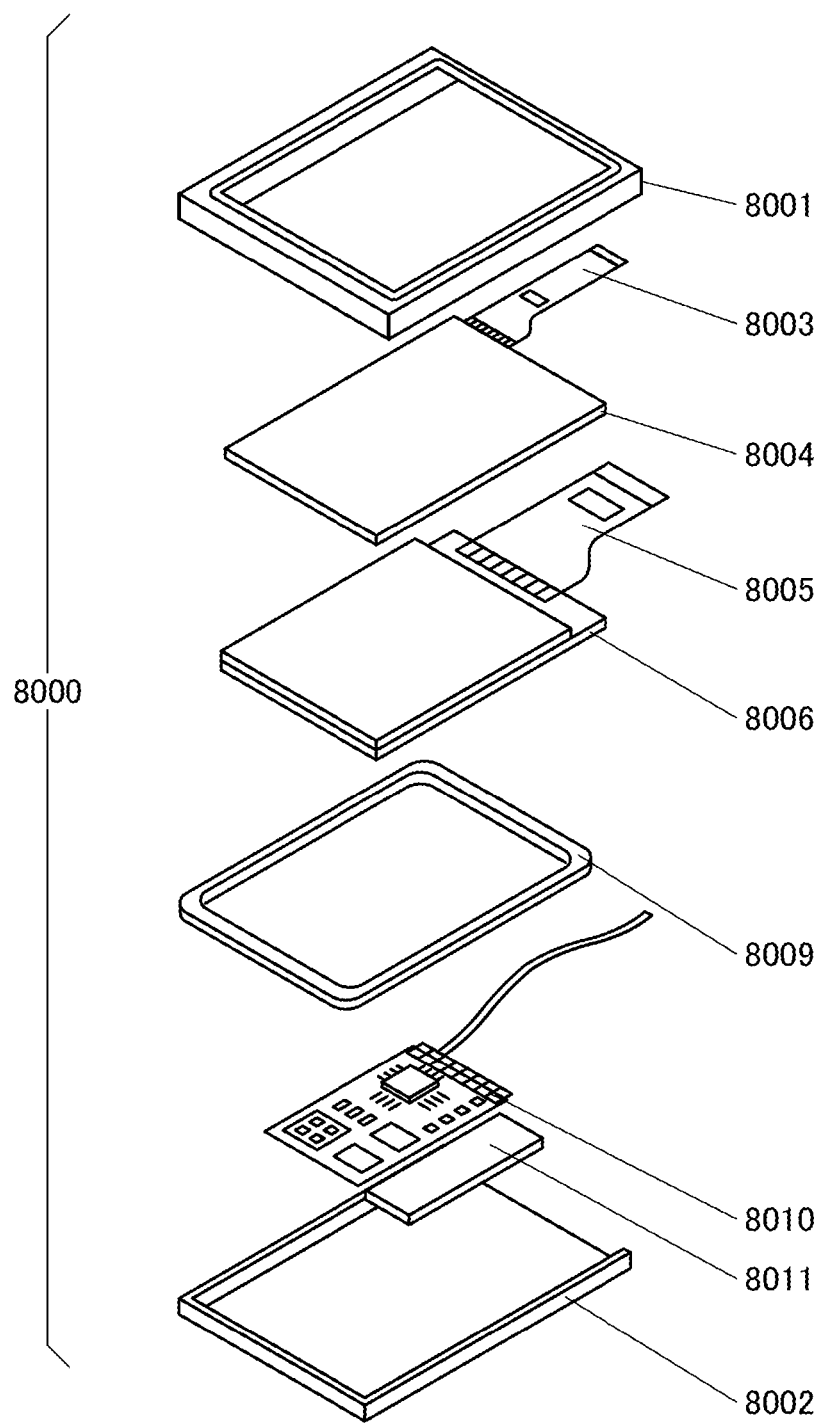
FIG. 12 is a perspective view illustrating a display module.

In a display module 8000 illustrated in FIG. 12, a touch panel 8004 connected to an FPC 8003, a display panel 8006 connected to an FPC 8005, a frame 8009, a printed board 8010, and a battery 8011 are provided between an upper cover 8001 and a lower cover 8002.

The light-emitting device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may overlap with the display panel 8006. Alternatively, a counter substrate (sealing substrate) of the display panel 8006 can have a touch panel function. Alternatively, a photosensor may be provided in each pixel of the display panel 8006 so as to function as an optical touch panel.

The frame 8009 protects the display panel 8006 and functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 13A to 13G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 13A to 13G can have a variety of functions. For example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 13A to 13G are not limited to those described above, and the electronic devices can have a variety of functions. Although not shown in FIGS. 13A to 13G, the electronic device may have a plurality of display portions. The electronic device may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices shown in FIGS. 13A to 13G will be described in detail.

Figure 13A:
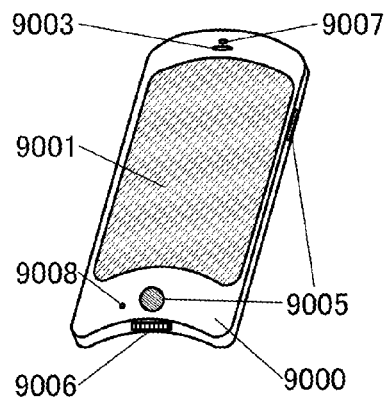
FIGS. 13A to 13G each illustrate an electronic device.

FIG. 13A is a perspective view of a portable information terminal 9100. A display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 13D:
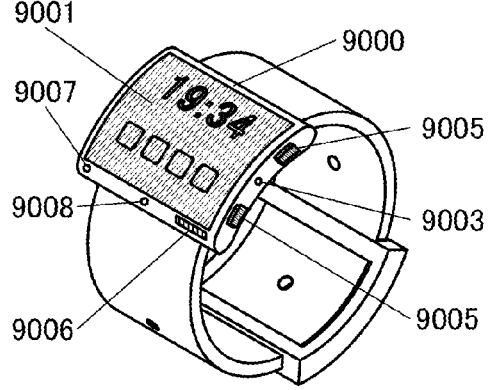
Figure 13B:
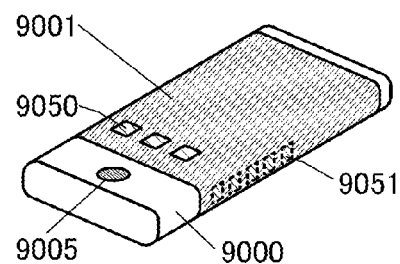

FIG. 13B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 13B, can be positioned in the portable information terminal 9101 as in the portable information terminal 9100 shown in FIG. 13A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 13E:
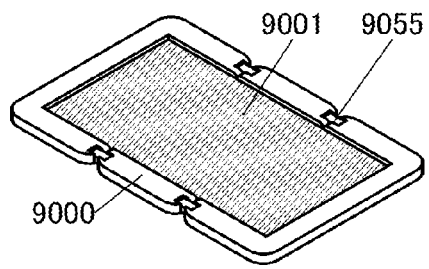
Figure 13C:
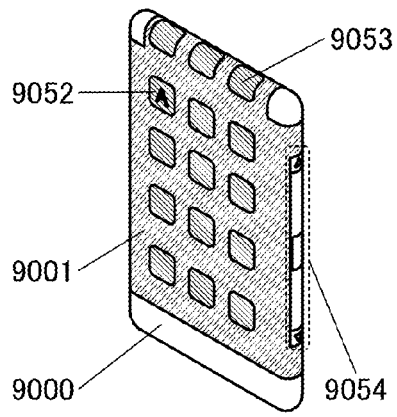

FIG. 13C is a perspective view of a portable information terminal 9102. The portable information terminal 9102 has a function of displaying information on three or more surfaces of the display portion 9001. Here, information 9052, 9053, and 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 13D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus handsfree calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 13F:
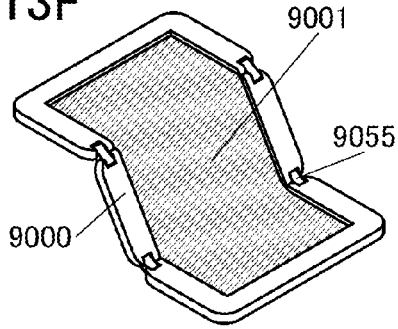
Figure 13G:
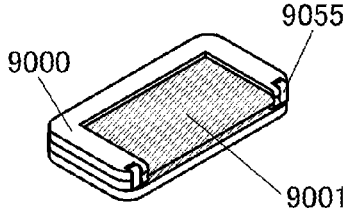

FIGS. 13E, 13F, and 13G are perspective views of a foldable portable information terminal 9201 that is opened, that is shifted from opened to folded or from folded to opened, and that is folded, respectively. The folded portable information terminal 9201 is highly portable, and the opened portable information terminal 9201 is highly browsable due to a seamless large display region. The display portion 9001 of the portable information terminal 9201 is supported by three housings joined together by hinges 9055. By folding the portable information terminal 9201 at a connection portion between two housings 9000 with the hinges 9055, the portable information terminal 9201 can be reversibly changed in shape from opened to folded. For example, the portable information terminal 9201 can be bent with a radius of curvature of greater than or equal to 1 mm and less than or equal to 150 mm.

Electronic devices described in this embodiment are characterized by having a display portion for displaying some sort of information. Note that the light-emitting device of one embodiment of the present invention can also be used for an electronic device which does not have a display portion. The display portion of the electronic device of this embodiment may be non-flexible and display on a flat surface without limitation to the flexible mode capable of displaying along the curved surface or the foldable mode.

The structure described in this embodiment can be used in appropriate combination with the structure described in any of the other embodiments.

Embodiment 7

In this embodiment, examples of lighting devices each using the light-emitting device of one embodiment of the present invention are described with reference to FIG. 14.

Figure 14:
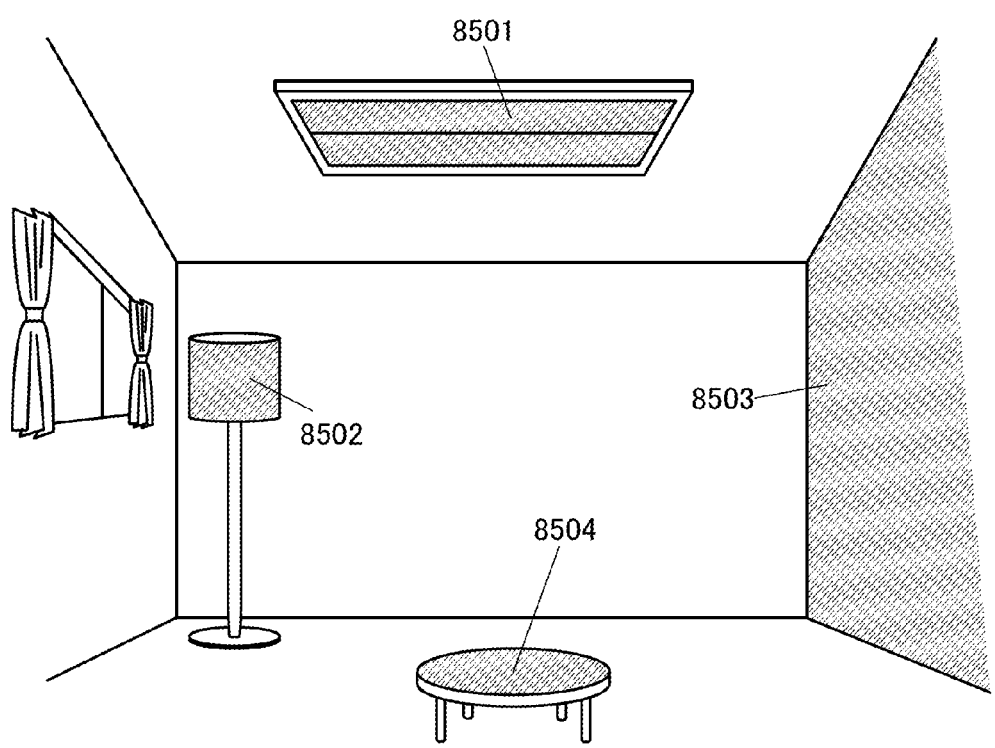
FIG. 14 illustrates lighting devices.

FIG. 14 illustrates an example in which the light-emitting device is used for an interior lighting device 8501. Note that since the area of the light-emitting device can be increased, a lighting device having a large area can also be formed. In addition, a lighting device 8502 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8503. Touch sensors may be provided in the lighting devices 8501, 8502, and 8503 to control the power on/off of the lighting devices.

Moreover, when the light-emitting device is used at a surface of a table, a lighting device 8504 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

Example 1

Figure 15A:
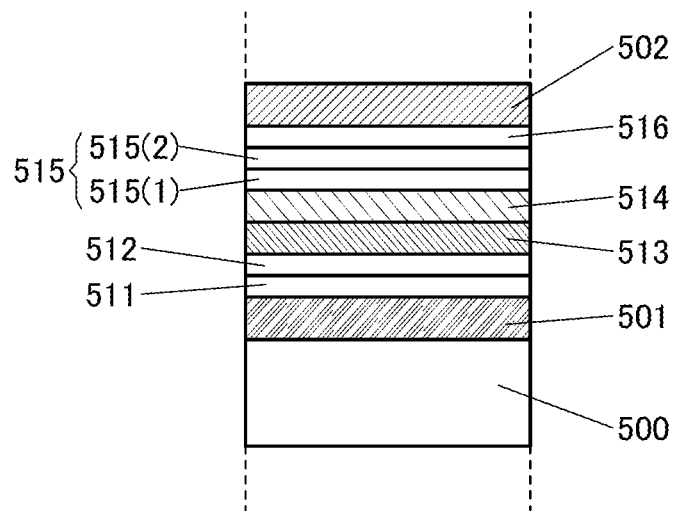
FIGS. 15A and 15B are schematic cross-sectional views illustrating element structures of light-emitting elements of Examples 1 to 3.
Figure 15B:
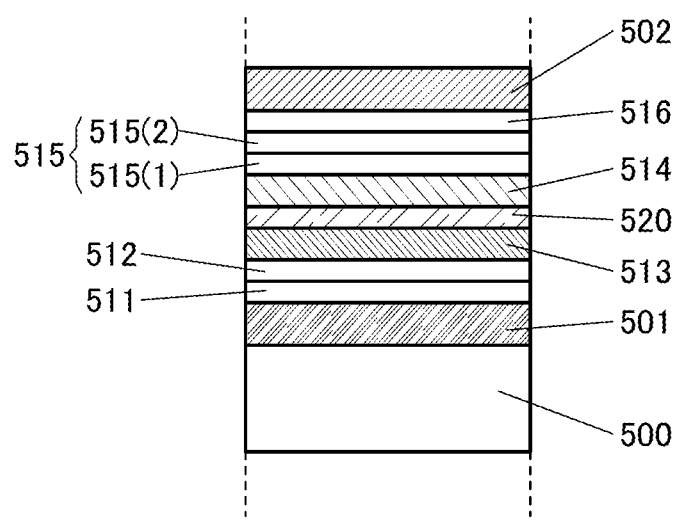

In this example, an example of fabricating a light-emitting element of one embodiment of the present invention will be described. FIGS. 15A and 15B are a schematic cross-sectional views of light-emitting elements (light-emitting elements 1 to 4) fabricated in this example, Table 1 shows the detailed structures of the elements, and structures and abbreviations of compounds used here are given below.

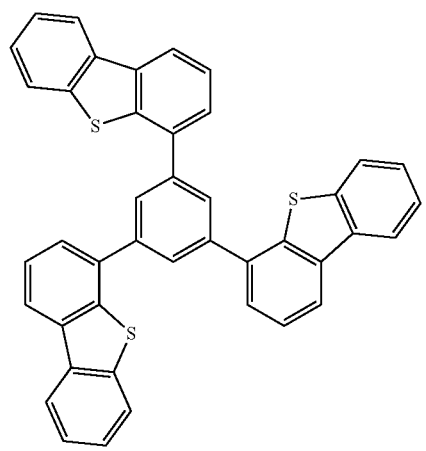

DBT3P-II

-continued

PCPPn cgDBCzPA

PCBBiF

-continued

2mDBTBPDBq-II

Bphen

Ir(ppm-dmp)$_2$(acac)

1,6mMemFLPAPrn

TABLE 1

Structure of light-emitting elements of Example 1

| | Layer | Reference numeral | Thickness (nm) | Material | Weight ratio |
|---|---|---|---|---|---|
| Light-emitting element 1 | Second electrode | 502 | 200 | Al | — |
| | Electron-injection layer | 516 | 1 | LiF | — |
| | Electron-transport layer | 515(2) | 15 | Bphen | — |
| | | 515(1) | 10 | 2mDBTBPDBq-II | — |
| | Second light-emitting layer | 514 | 20 | 2mDBTBPDBq-II: PCBBiF: Ir(ppm-dmp)$_2$(acac) | 0.8:0.2:0.05 |
| | First light-emitting layer | 513 | 10 | cgDBCzPA: 1,6mMemFLPAPrn | 1:0.02 |
| | Hole-transport layer | 512 | 20 | PCPPn | — |

TABLE 1-continued

Structure of light-emitting elements of Example 1

| | Layer | Reference numeral | Thickness (nm) | Material | Weight ratio |
|---|---|---|---|---|---|
| | Hole-injection layer | 511 | 40 | DBT3P-II:MoOx | 2:1 |
| | First electrode | 501 | 110 | ITSO | — |
| Light-emitting element 2 | Second electrode | 502 | 200 | Al | — |
| | Electron-injection layer | 516 | 1 | LiF | — |
| | Electron-transport layer | 515(2) | 15 | Bphen | — |
| | | 515(1) | 10 | 2mDBTBPDBq-II | — |
| | Second light-emitting layer | 514 | 20 | 2mDBTBPDBq-II: PCBBiF: Ir(ppm-dmp)$_2$(acac) | 0.8:0.2:0.05 |
| | Separation layer | 520 | 2 | 2mDBTBPDBq-II: PCBBiF | 0.6:0.4 |
| | First light-emitting layer | 513 | 10 | cgDBCzPA: 1,6mMemFLPAPrn | 1:0.02 |
| | Hole-transport layer | 512 | 20 | PCPPn | — |
| | Hole-injection layer | 511 | 40 | DBT3P-II:MoOx | 2:1 |
| | First electrode | 501 | 110 | ITSO | — |
| Light-emitting element 3 | Second electrode | 502 | 200 | Al | — |
| | Electron-injection layer | 516 | 1 | LiF | — |
| | Electron-transport layer | 515(2) | 15 | Bphen | — |
| | | 515(1) | 10 | 2mDBTBPDBq-II | — |
| | Second light-emitting layer | 514 | 20 | 2mDBTBPDBq-II: PCBBiF: Ir(ppm-dmp)$_2$(acac) | 0.5:0.5:0.05 |
| | First light-emitting layer | 513 | 10 | cgDBCzPA: 1,6mMemFLPAPrn | 1:0.02 |
| | Hole-transport layer | 512 | 20 | PCPPn | — |
| | Hole-injection layer | 511 | 40 | DBT3P-II:MoOx | 2:1 |
| | First electrode | 501 | 110 | ITSO | — |
| Light-emitting element 4 | Second electrode | 502 | 200 | Al | — |
| | Electron-injection layer | 516 | 1 | LiF | — |
| | Electron-transport layer | 515(2) | 15 | Bphen | — |
| | | 515(1) | 10 | 2mDBTBPDBq-II | — |
| | Second light-emitting layer | 514 | 20 | 2mDBTBPDBq-II: PCBBiF: Ir(ppm-dmp)$_2$(acac) | 0.5:0.5:0.05 |
| | Separation layer | 520 | 2 | 2mDBTBPDBq-II: PCBBiF | 0.6:0.4 |
| | First light-emitting layer | 513 | 10 | cgDBCzPA: 1,6mMemFLPAPrn | 1:0.02 |
| | Hole-transport layer | 512 | 20 | PCPPn | — |
| | Hole-injection layer | 511 | 40 | DBT3P-II:MoOx | 2:1 |
| | First electrode | 501 | 110 | ITSO | — |

<1-1. Fabrication of Light-Emitting Element 1>

Indium tin oxide containing silicon oxide (indium tin oxide doped with SiO$_2$: ITSO) which was formed over a glass substrate 500 to have a thickness of 110 nm and an area of 2 mm×2 mm was used as a first electrode 501. On the first electrode 501, 1,3,5-tri(dibenzothiophen-4-yl)benzene (DBT3P-II) and molybdenum oxide (MoO$_3$) were deposited by co-evaporation in a weight ratio of DBT3P-II:MoO$_3$=2:1 to a thickness of 40 nm, so that a hole-injection layer 511 was formed. Note that co-evaporation is an evaporation method in which a plurality of different substances is concurrently vaporized from different evaporation sources.

On the hole-injection layer 511, 3-[4-(9-phenanthryl)-phenyl]-9-phenyl-9H-carbazole (PCPPn) was deposited by evaporation to a thickness of 20 nm, so that a hole-transport layer 512 was formed.

On the hole-transport layer 512, 7-[4-(10-phenyl-9-anthryl)phenyl]-7H-dibenzo[c,g]carbazole (cgDBCzPA), and N,N'-bis(3-methylphenyl)-N,N'-bis[3-(9-phenyl-9H-fluoren-9-yl)phenyl]pyrene-1,6-diamine (1,6mMemFLPAPrn) were deposited by co-evaporation in a weight ratio of cgDBCzPA:1,6mMemFLPAPrn=1:0.02 to a thickness of 10 nm, so that the first light-emitting layer 513 was formed. Note that cgDBCzPA was the host material and 1,6mMem- FLPAPrn was the fluorescent material (the guest material) in the first light-emitting layer 513.

On the first light-emitting layer 513, 2-[3'-(dibenzothiophen-4-yl)biphenyl-3-yl]dibenzo[f,h]quinoxaline (2mDBTBPDBq-II), N-(1,1'-biphenyl-4-yl)-9,9-dimethyl-N-[4-(9-phenyl-9H-carbazol-3-yl)phenyl]-9H-fluoren-2-amine (PCBBiF), and bis {2-[6-(2,6-dimethylphenyl)-4-pyrimidinyl-κN3]phenyl-κC}(2,4-pentanedionato-κO,O')iridium (III) (Ir(ppm-dmp)$_2$(acac)) were deposited by co-evaporation in a weight ratio of 2mDBTBPDBq-II:PCBBiF:Ir(ppm-dpm)$_2$(acac)=0.8:0.2:0.05 to a thickness of 20 nm, so that the second light-emitting layer 514 was formed. Note that 2mDBTBPDBq-II was the first organic compound (the host material), PCBBiF was the second organic compound (the assist material), and Ir(ppm-dmp)$_2$(acac) was the phosphorescent material (the guest material) in the second light-emitting layer 514.

On the second light-emitting layer 514, 2mDBTBPDBq-II and bathophenanthroline (Bphen) were sequentially deposited by evaporation to a thickness of 10 nm and 15 nm, respectively, so that electron-transport layers 515(1) and 512(2) were formed. On the electron-transport layers 515(1) and 515(2), lithium fluoride was deposited by evaporation to a thickness of 1 nm to form the electron-injection layer 516. Furthermore, aluminum was deposited by evaporation to a thickness of 200 nm to form the second electrode 502.

Next, a sealing glass substrate was fixed to the glass substrate using a sealing member in a glove box containing a nitrogen atmosphere. In this manner, the light-emitting element was sealed. Note that for sealing, the sealing member was applied to surround the light-emitting element, irradiation with 365-nm ultraviolet light at 6 J/cm$^2$ was performed, and heat treatment was performed at 80° C. for 1 hour. Through the above steps, the light-emitting element 1 was obtained.

<1-2. Fabrication of Light-Emitting Element 2>

Similar to the light emitting element 1, on the first electrode 501, DBT3P-II and molybdenum oxide (MoO$_3$) were deposited by co-evaporation in a weight ratio of DBT3P-II:MoO$_3$=2:1 to a thickness of 40 nm, so that the hole-injection layer 511 was formed.

On the hole-injection layer 511, PCPPn was deposited by evaporation to a thickness of 20 nm, so that the hole-transport layer 512 was formed.

On the hole-transport layer 512, cgDBCzPA and 1,6mMemFLPAPrn were deposited by co-evaporation in a weight ratio of cgDBCzPA:1,6mMemFLPAPrn=1:0.02 to a thickness of 10 nm, so that the first light-emitting layer 513 was formed.

On the first light-emitting layer 513, 2mDBTBPDBq-II and PCBBiF were deposited by co-evaporation in a weight ratio of 2mDBTBPDBq-II:PCBBiF=0.6:0.4 to a thickness of 2 nm, so that the separation layer 520 was formed.

On the separation layer 520, 2mDBTBPDBq-II, PCBBiF, and Ir(ppm-dmp)$_2$(acac) were deposited by co-evaporation in weight ratio of 2mDBTBPDBq-II:PCBBiF:Ir(ppm-dmp)$_2$(acac)=0.8:0.2:0.05 to a thickness of 20 nm, so that the second light-emitting layer 514 was formed.

On the second light-emitting layer 514, 2mDBTBPDBq-II and Bphen were sequentially deposited by evaporation to a thickness of 10 nm and 15 nm, respectively, so that electron-transport layers 515(1) and 512(2) were formed. On the electron-transport layers 515(1) and 515(2), lithium fluoride was deposited by evaporation to a thickness of 1 nm to form the electron-injection layer 516. Furthermore, aluminum was deposited by evaporation to a thickness of 200 nm to form the second electrode 502.

Next, a sealing glass substrate was fixed to the glass substrate using a sealing member in a glove box containing a nitrogen atmosphere to seal the light-emitting element. In this manner, the light-emitting element 2 was obtained. As the sealing method, a method similar to that used for the light-emitting element 1 was used.

<1-3. Fabrication of Light-Emitting Element 3>

The light-emitting element 3 was fabricated through the same steps as those for the above-mentioned light-emitting element 1 except steps mentioned below.

On the first light-emitting layer 513, 2-[3'-(dibenzothiophen-4-yl)biphenyl-3-yl]dibenzo[f,h]quinoxaline (2mDBTBPDBq-II), N-(1,1'-biphenyl-4-yl)-9,9-dimethyl-N-[4-(9-phenyl-9H-carbazol-3-yl)phenyl]-9H-fluoren-2-amine (PCBBiF), and bis {2-[6-(2,6-dimethylphenyl)-4-pyrimidinyl-κN3]phenyl-κC}(2,4-pentanedionato-κO,O')iridium (III) Ir(ppm-dmp)$_2$(acac) were deposited by co-evaporation in a weight ratio of 2mDBTBPDBq-II:PCBBiF:Ir(ppm-dpm)$_2$(acac)=0.5:0.5:0.05 to a thickness of 20 nm, so that the second light-emitting layer 514 was formed.

<1-4. Fabrication of Light-Emitting Element 4>

The light-emitting element 4 was fabricated through the same steps as those for the above-mentioned light-emitting element 2 except steps mentioned below.

On the separation layer 520, 2-[3'-(dibenzothiophen-4-yl)biphenyl-3-yl]dibenzo[f,h]quinoxaline (2mDBTBPDBq-II), N-(1,1'-biphenyl-4-yl)-9,9-dimethyl-N-[4-(9-phenyl-9H-carbazol-3-yl)phenyl]-9H-fluoren-2-amine (PCBBiF), and bis{2-[6-(2,6-dimethylphenyl)-4-pyrimidinyl-κN3]phenyl-κC}(2,4-pentanedionato-κO,O')iridium (III) Ir(ppm-dmp)$_2$(acac) were deposited by co-evaporation in a weight ratio of 2mDBTBPDBq-II:PCBBiF:Ir(ppm-dpm)$_2$(acac)=0.5:0.5:0.05 to a thickness of 20 nm, so that the second light-emitting layer 514 was formed.

It is to be noted that an evaporation method using resistive heating was employed for all the evaporation steps.

<1-5. Characteristics of Light-Emitting Elements 1 to 4>

Figure 16A:
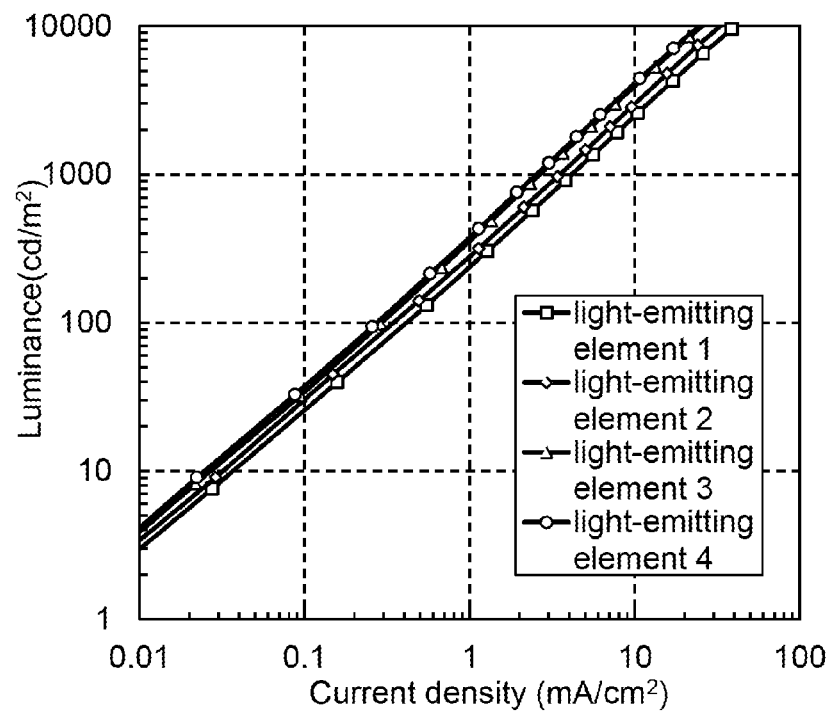
FIGS. 16A and 16B show current density-luminance characteristics and voltage-luminance characteristics, respectively, of light-emitting elements of Example 1.
Figure 16B:
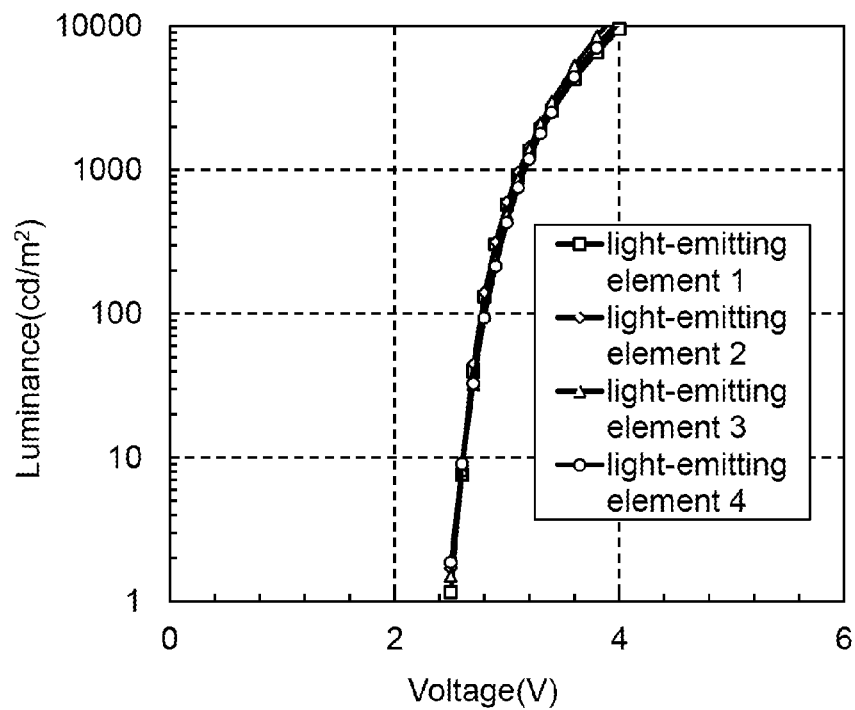
Figure 17A:
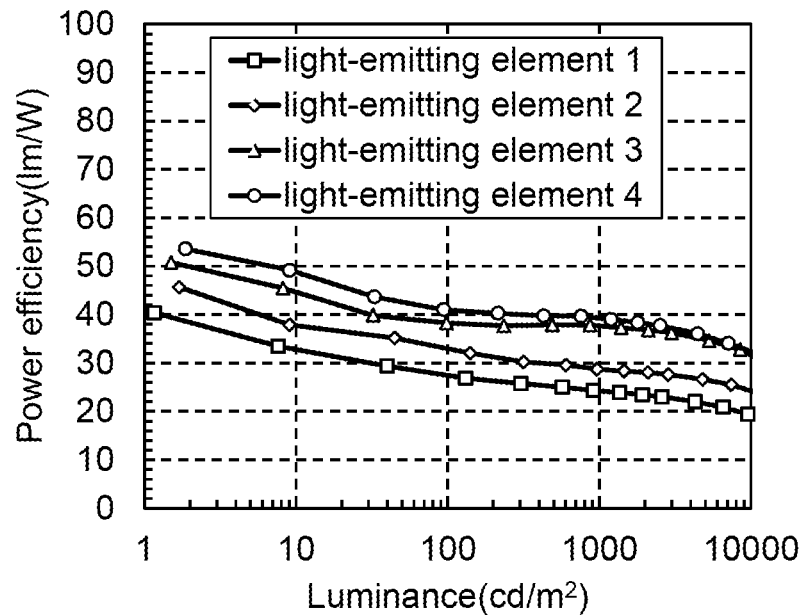
FIGS. 17A and 17B show luminance-power efficiency characteristics and luminance-current efficiency characteristics, respectively, of light-emitting elements of Example 1.
Figure 17B:
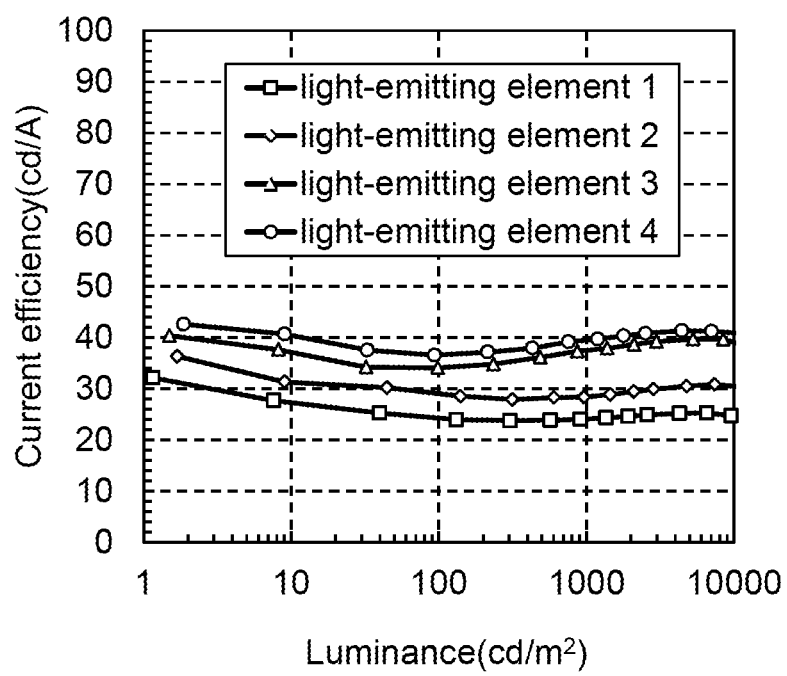

FIG. 16A shows current density-luminance characteristics of the light-emitting elements 1 to 4. In FIG. 16A, the horizontal axis represents current density (mA/cm$^2$) and the vertical axis represents luminance (cd/m$^2$). FIG. 16B shows voltage-luminance characteristics of the light-emitting elements 1 to 4. In FIG. 16B, the horizontal axis represents voltage (V) and the vertical axis represents luminance (cd/m$^2$). FIG. 17A shows luminance-power efficiency characteristics of the light-emitting elements 1 to 4. In FIG. 17A, the horizontal axis represents luminance (cd/m$^2$) and the vertical axis represents power efficiency (lm/W). FIG. 17B shows luminance-current efficiency characteristics of the light-emitting elements 1 to 4. In FIG. 17B, the horizontal axis represents luminance (cd/m$^2$) and the vertical axis represents current efficiency (cd/A). Note that the measurement for each light-emitting element was carried out at room temperature (in the atmosphere maintained at 25° C.).

Table 2 shows element characteristics of the light-emitting elements 1 to 4 at around 1000 cd/m$^2$.

TABLE 2

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting element 1 | 3.1 | 0.15 | 3.8 | (0.30, 0.34) | 910 | 24 | 24 | 10 |
| Light-emitting element 2 | 3.1 | 0.14 | 3.4 | (0.32, 0.37) | 960 | 28 | 29 | 11 |
| Light-emitting element 3 | 3.1 | 0.093 | 2.3 | (0.37, 0.44) | 870 | 37 | 38 | 12 |
| Light-emitting element 4 | 3.2 | 0.12 | 3.0 | (0.38, 0.45) | 1200 | 40 | 39 | 13 |

Element characteristics of light-emitting elements of Example 1

Figure 18:
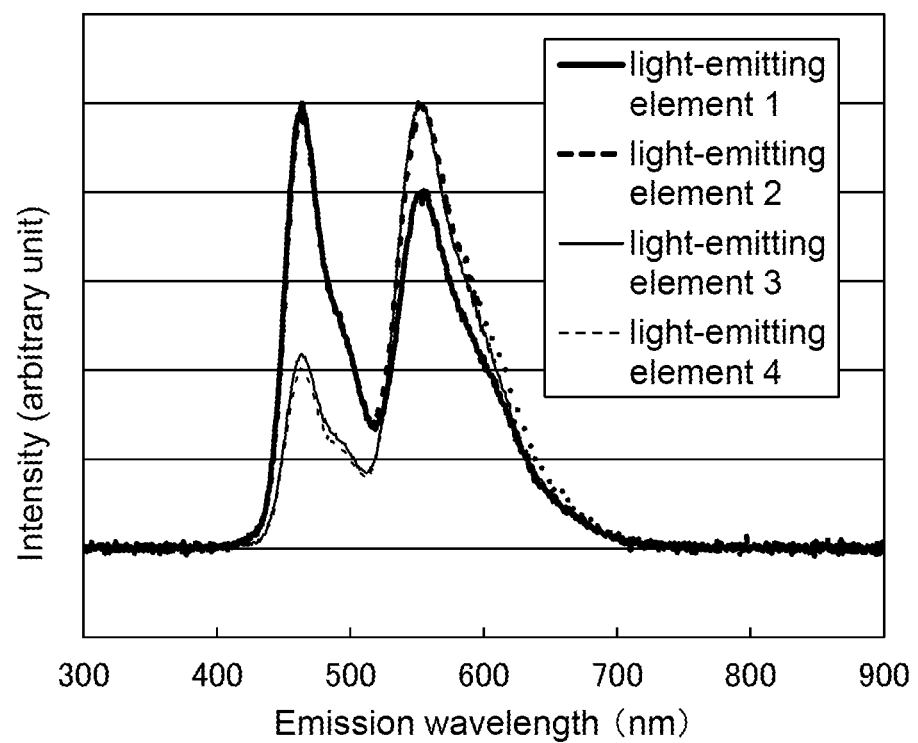
FIG. 18 shows emission spectra of light-emitting elements of Example 1.

FIG. 18 shows emission spectra when a current at a current density of 2.5 mA/cm$^2$ was supplied to the light-emitting elements 1 to 4. As shown in FIG. 18, each spectrum of the light-emitting elements 1 to 4 has peaks at the blue wavelength region and the yellow wavelength region; therefore, it is found that the two light-emitting materials in each light-emitting element emitted light at a time.

As shown in Table 1, difference between the light-emitting elements 1 and 2 was whether with or without the separation layer 520, and difference between the light-emitting elements 3 and 4 was whether with or without the separation layer 520. On the basis of the results shown in FIGS. 16A and 16B and FIGS. 17A and 17B, the light-emitting elements 1 and 2 had approximately the same element characteristics regardless of whether with or without the separation layer 520. In addition, on the basis of the results shown in FIGS. 16A and 16B and FIGS. 17A and 17B, the light-emitting elements 3 and 4 had approximately the same element characteristics regardless of whether with or without the separation layer 520. The concentration of PCBBiF, which was the second organic compound (the assist material) of the second light-emitting layer 514 of the light-emitting elements 3 and 4, was high in the light-emitting elements 3 and 4 as compared with that in the light-emitting elements 1 and 2. Thus, the intensity of the yellow spectrum was increased. Therefore, it is found that the intensity of the yellow spectrum can be easily adjusted while the element characteristics having high efficiency are kept. In addition, on the basis of the results shown in FIG. 18, it is found that, in the light-emitting elements 1 and 2, the intensity of the blue and yellow emission spectra can be adjusted by the presence or absence of the separation layer 520.

The structures described in this example can be used in an appropriate combination with any of the structures described in the other embodiments and examples.

Example 2

In this example, an example of fabricating a light-emitting element of one embodiment of the present invention will be described. FIG. 15B is a schematic cross-sectional view of a light-emitting element (a light-emitting element 5) fabricated in this example, and Table 3 shows the detailed structure of the element, and structures and names of compounds used here are given below. Note that the structures and names of the compounds used for the light-emitting elements 1 to 4 described in Example 1 are not given here.

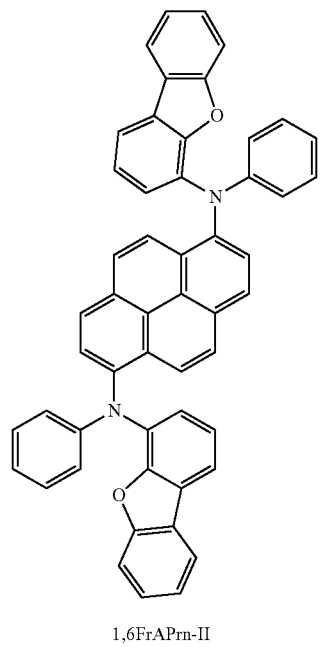

1,6FrAPrn-II

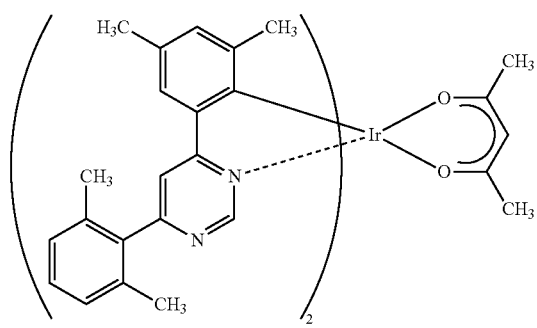

Ir(dmppm-dmp)$_2$(acac)

TABLE 3

Structure of light-emitting element of Example 2

| | Layer | Reference numeral | Thickness (nm) | Material | Weight ratio |
|---|---|---|---|---|---|
| Light-emitting element 5 | Second electrode | 502 | 200 | Al | — |
| | Electron-injection layer | 516 | 1 | LiF | — |
| | Electron-transport layer | 515(2) | 15 | Bphen | — |
| | | 515(1) | 10 | 2mDBTBPDBq-II | — |
| | Second light-emitting layer | 514 | 20 | 2mDBTBPDBq-II: PCBBiF: Ir(dmppm-dmp)$_2$(acac) | 0.8:0.2:0.05 |
| | Separation layer | 520 | 2 | 2mDBTBPDBq-II: PCBBiF | 0.6:0.4 |
| | First light-emitting layer | 513 | 5 | cgDBCzPA: 1,6FrAPrn-II | 1:0.03 |
| | Hole-transport layer | 512 | 20 | PCPPn | — |
| | Hole-injection layer | 511 | 20 | DBT3P-II:MoOx | 2:1 |
| | First electrode | 501 | 110 | ITSP | — |

<2-1. Fabrication of Light-Emitting Element 5>

Similar to the light emitting element 1, on the first electrode 501, DBT3P-II and molybdenum oxide (MoO$_3$) were deposited by co-evaporation in a weight ratio of DBT3P-II:MoO$_3$=2:1 to a thickness of 20 nm, so that the hole-injection layer 511 was formed.

On the hole-injection layer 511, PCPPn was deposited by evaporation to a thickness of 20 nm, so that the hole-transport layer 512 was formed.

On the hole-transport layer 512, cgDBCzPA and N,N'-bis(dibenzofuran-4-yl)-N,N'-diphenylpyrene-1,6-diamine (1,6FrAPrn-II) were deposited by co-evaporation in a weight ratio of cgDBCzPA:1,6FrAPrn-II=1:0.03 to a thickness of 5 nm, so that the first light-emitting layer 513 was formed. Note that cgDBCzPA was the host material and 1,6FrAPrn-II was the fluorescent material (the guest material) in the first light-emitting layer 513.

On the first light-emitting layer 513, 2mDBTBPDBq-II and PCBBiF were deposited by co-evaporation in a weight ratio of 2mDBTBPDBq-II:PCBBiF=0.6:0.4 to a thickness of 2 nm, so that the separation layer 520 was formed.

On the separation layer 520, 2mDBTBPDBq-II, PCBBiF, and bis {4,6-dimethyl-2-[6-(2,6-dimethylphenyl)-4-pyrimidinyl-κN3]phenyl-κC}(2,4-pentanedionato-κ$^2$O,O')iridium (III) (Ir(dmppm-dmp)$_2$(acac)) were deposited by co-evaporation in a weight ratio of 2mDBTBPDBq-II:PCBBiF:Ir(dmppm-dmp)$_2$(acac)=0.8:0.2:0.05 to a thickness of 20 nm, so that the second light-emitting layer 514 was formed. Note that 2mDBTBPDBq-II was the first organic compound (the host material), PCBBiF was the second organic compound (the assist material), and Ir(dmppm-dmp)$_2$(acac) was the phosphorescent material (the guest material) in the second light-emitting layer 514.

On the second light-emitting layer 514, 2mDBTBPDBq-II and Bphen were sequentially deposited by evaporation to a thickness of 10 nm and 15 nm, respectively, so that electron-transport layers 515(1) and 512(2) were formed. On the electron-transport layers 515(1) and 515(2), lithium fluoride was deposited by evaporation to a thickness of 1 nm to form the electron-injection layer 516. Furthermore, aluminum was deposited by evaporation to a thickness of 200 nm to form the second electrode 502.

It is to be noted that an evaporation method using resistive heating was employed for all the evaporation steps.

Next, a sealing glass substrate was fixed to the glass substrate using a sealing member in a glove box containing a nitrogen atmosphere to seal the light-emitting element. In this manner, the light-emitting element 5 was obtained. As the sealing method, a method similar to that used for the light-emitting element 1 was used.

<2-2. Characteristics of Light-Emitting Element 5>

Figure 19A:
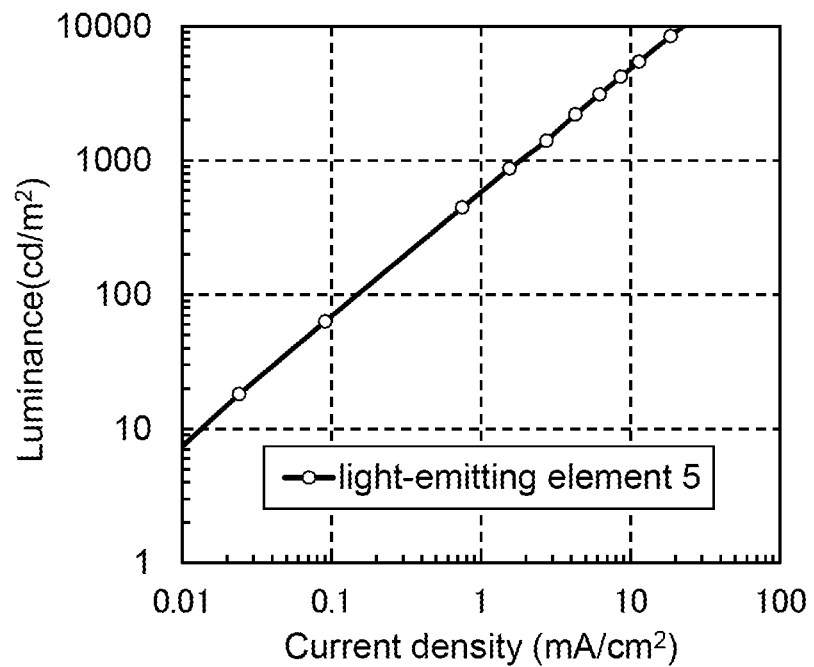
FIGS. 19A and 19B show current density-luminance characteristics and voltage-luminance characteristics, respectively, of a light-emitting element of Example 2.
Figure 19B:
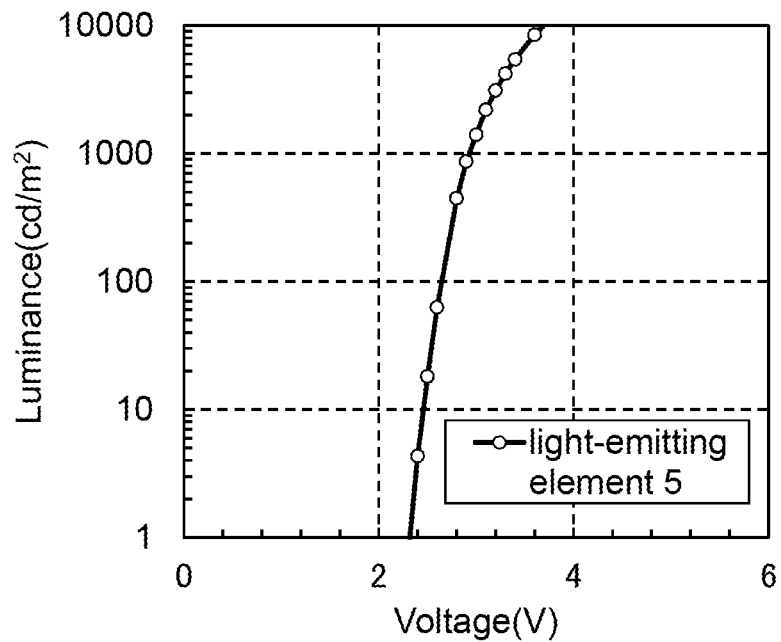
Figure 20A:
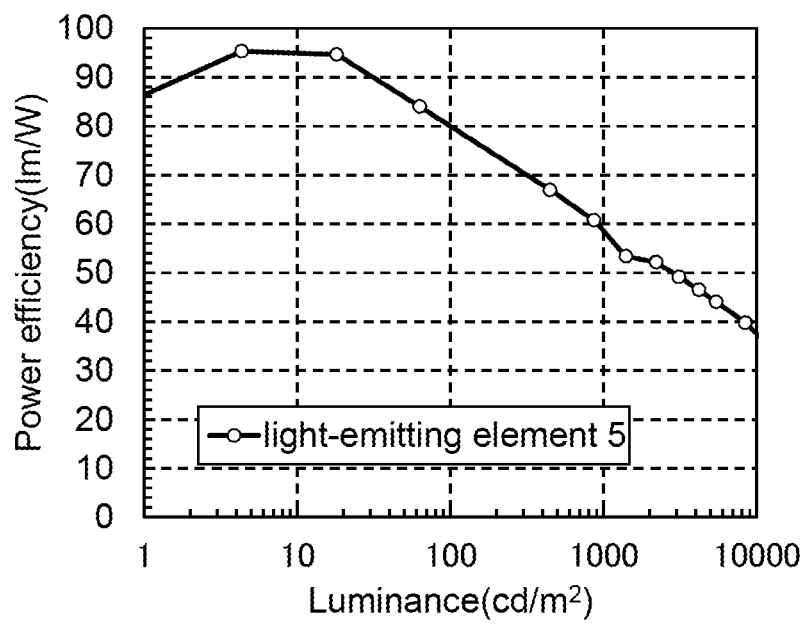
FIGS. 20A and 20B show luminance-power efficiency characteristics and luminance-current efficiency characteristics, respectively, of a light-emitting element of Example 2.
Figure 20B:
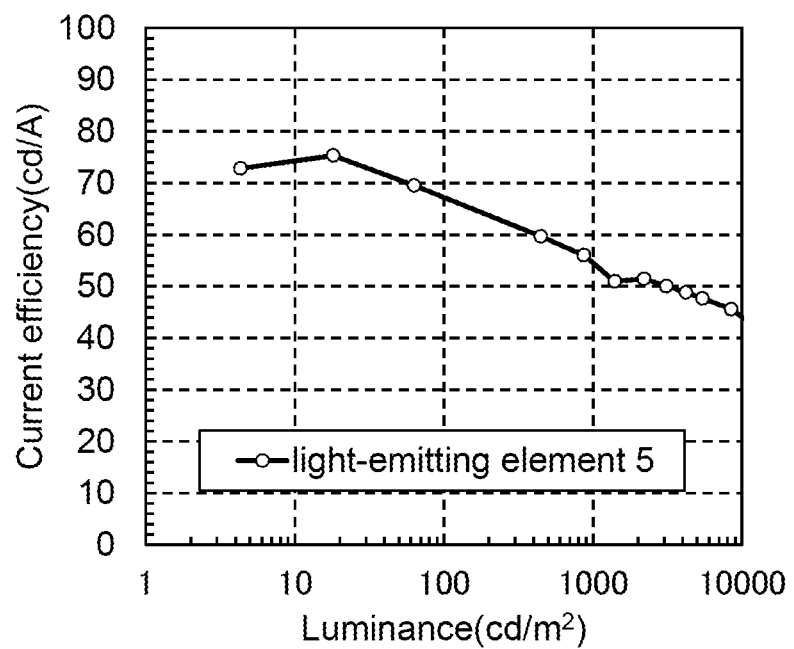

FIG. 19A shows current density-luminance characteristics of the light-emitting element 5. In FIG. 19A, the horizontal axis represents current density (mA/cm$^2$) and the vertical axis represents luminance (cd/m$^2$). FIG. 19B shows the voltage-luminance characteristics of the light-emitting element 5. In FIG. 19B, the horizontal axis represents voltage (V) and the vertical axis represents luminance (cd/m$^2$). FIG. 20A shows luminance-power efficiency characteristics of the light-emitting element 5. In FIG. 20A, the horizontal axis represents luminance (cd/m$^2$) and the vertical axis represents power efficiency (lm/W). FIG. 20B shows luminance-current efficiency characteristics of the light-emitting element 5. In FIG. 20B, the horizontal axis represents luminance (cd/m$^2$) and the vertical axis represents current efficiency (cd/A). Note that the measurement for the light-emitting element was carried out at room temperature (under an atmosphere in which the temperature was kept at 25° C.).

Further, Table 4 shows the element characteristics of the light-emitting element 5 at around 1000 cd/m$^2$.

TABLE 4

| | Element characteristics of light-emitting element of Example 2 | | | | | | |
|---|---|---|---|---|---|---|---|
| | Voltage (V) | Current (mA) | Current density (mA/cm²) | Chromaticity (x, y) | Luminance (cd/m²) | Current efficiency (cd/A) | Power efficiency (lm/W) | External quantum efficiency (%) |
| Light-emitting element 5 | 2.9 | 0.062 | 1.5 | (0.47, 0.45) | 870 | 56 | 61 | 18 |

Figure 21:
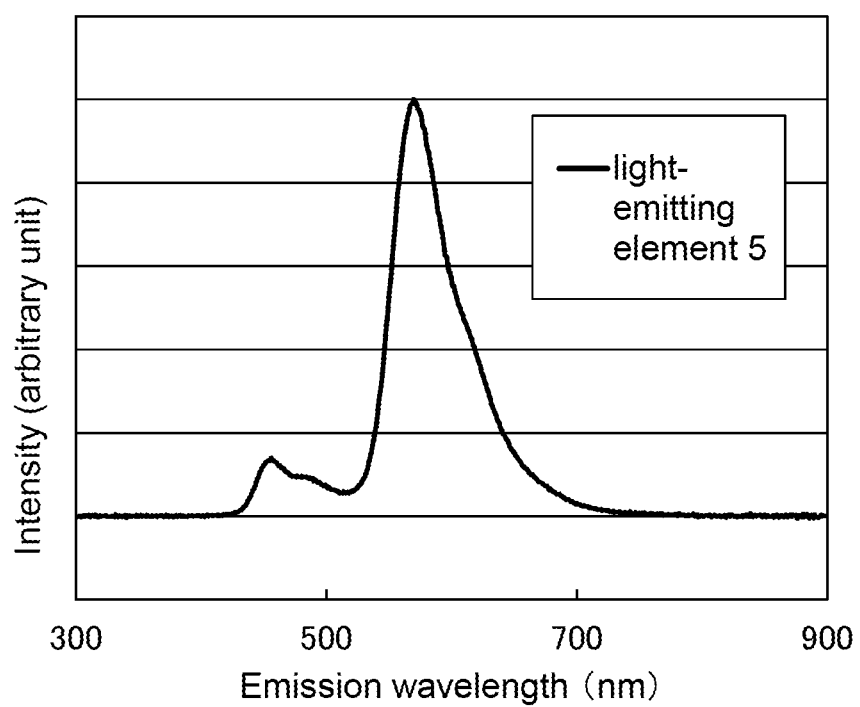
FIG. 21 shows an emission spectrum of a light-emitting element of Example 2.

FIG. 21 shows an emission spectrum when a current at a current density of 2.5 mA/cm² was supplied to the light-emitting element 5. As shown in FIG. 21, the spectrum of the light-emitting element 5 has peaks at the blue wavelength region and the yellow wavelength region; therefore, it is found that the two light-emitting materials therein emitted light at a time.

The light-emitting element 5 of this example was different from the light-emitting elements 1 to 4 of Example 1 in the fluorescent material of the first light-emitting layer 513 and the phosphorescent material of the second light-emitting layer 514. On the basis of the results shown in FIGS. 19A and 19B and FIGS. 20A and 20B, it is found that the light-emitting element 5 had element characteristics with high efficiency, similar to the light-emitting elements 1 to 4 of Example 1. The correlated color temperature of the light-emitting element 5 was 2850 K at around 1000 cd/m². Therefore, it can be used also for a lighting purpose.

The structures described in this example can be used in an appropriate combination with any of the structures described in the other embodiments and examples.

Example 3

In this example, an example of fabricating a light-emitting element of one embodiment of the present invention will be described. FIG. 15B is a schematic cross-sectional view of a light-emitting element (a light-emitting element 6) fabricated in this example, and Table 5 shows the detailed structure of the element, and a structure and a name of a compound used here are given below. Note that the structures and names of the compounds used for the light-emitting elements 1 to 4 described in Example 1 are not given below.

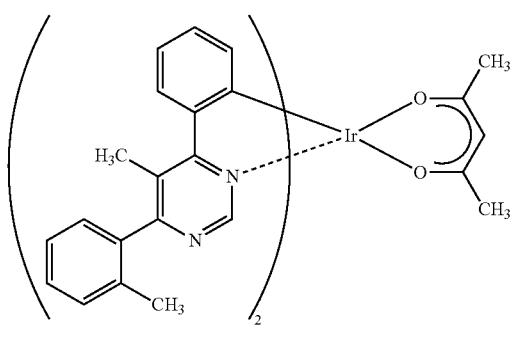

Ir(mpmppm)₂(acac)

TABLE 5

| | Structure of light-emitting element of Example 3 | | | | |
|---|---|---|---|---|---|
| | Layer | Reference numeral | Thickness (nm) | Material | Weight ratio |
| Light-emitting element 6 | Second electrode | 502 | 200 | Al | — |
| | Electron-injection layer | 516 | 1 | LiF | — |
| | Electron-transport layer | 515(2) | 15 | Bphen | — |
| | | 515(1) | 10 | 2mDBTBPDBq-II | — |
| | Second light-emitting layer | 514 | 20 | 2mDBTBPDBq-II: PCBBiF: Ir(mpmppm)₂(acac) | 0.8:0.2:0.05 |
| | Separation layer | 520 | 2 | 2mDBTBPDBq-II: PCBBiF | 0.6:0.4 |
| | First light-emitting layer | 513 | 5 | cgDBCzPA: 1,6mMemFLPAPrn | 1:0.03 |
| | Hole-transport layer | 512 | 20 | PCPPn | — |
| | Hole-injection layer | 511 | 20 | DBT3P-II:MoOx | 2:1 |
| | First electrode | 501 | 110 | ITSO | — |

<3-1. Fabrication of Light-Emitting Element 6>

Similar to the light emitting element 1, on the first electrode 501, DBT3P-II and molybdenum oxide (MoO₃) were deposited by co-evaporation in a weight ratio of DBT3P-II:MoO$_3$=2:1 to a thickness of 20 nm, so that the hole-injection layer 511 was formed.

On the hole-injection layer 511, PCPPn was deposited by evaporation to a thickness of 20 nm, so that the hole-transport layer 512 was formed.

On the hole-transport layer 512, cgDBCzPA and 1,6mMemFLPAPrn were deposited by co-evaporation in a weight ratio of cgDBCzPA:1,6mMemFLPAPrn=1:0.03 to a thickness of 5 nm, so that the first light-emitting layer 513 was formed.

On the first light-emitting layer 513, 2mDBTBPDBq-II and PCBBiF were deposited by co-evaporation in a weight ratio of 2mDBTBPDBq-II:PCBBiF=0.6:0.4 to a thickness of 2 nm, so that the separation layer 520 was formed.

On the separation layer 520, 2mDBTBPDBq-II, PCBBiF, and (acetylacetonato)bis[5-methyl-6-(2-methylphenyl)-4-phenylpyrimidinato]iridium(III) (another name: bis {2-[5-methyl-6-(2-methylphenyl)-4-pyrimidinyl-κN3]phenyl-κC}(2,4-pentanedionato-κ$^2$O,O') iridium(III)) (Ir(mpmppm)$_2$(acac)) were deposited by co-evaporation in a weight ratio of 2mDBTBPDBq-II:PCBBiF:Ir(mpmppm)$_2$(acac)=0.8:0.2:0.05 to a thickness of 20 nm, so that the second light-emitting layer 514 was formed. Note that 2mDBTBPDBq-II was the first organic compound (the host material), PCBBiF was the second organic compound (the assist material), and Ir(mpmppm)$_2$(acac) was the phosphorescent material (the guest material) in the second light-emitting layer 514.

On the second light-emitting layer 514, 2mDBTBPDBq-II and Bphen were sequentially deposited by evaporation to a thickness of 10 nm and 15 nm, respectively, so that electron-transport layers 515(1) and 512(2) were formed. On the electron-transport layers 515(1) and 515(2), lithium fluoride was deposited by evaporation to a thickness of 1 nm to form the electron-injection layer 516. Furthermore, aluminum was deposited by evaporation to a thickness of 200 nm to form the second electrode 502.

It is to be noted that an evaporation method using resistive heating was employed for all the evaporation steps.

Next, a sealing glass substrate was fixed to the glass substrate using a sealing member in a glove box containing a nitrogen atmosphere to seal the light-emitting element. In this manner, the light-emitting element 6 was obtained. As the sealing method, a method similar to that used for the light-emitting element 1 was used.

<3-2. Characteristics of Light-Emitting Element 6>

Figure 22A:
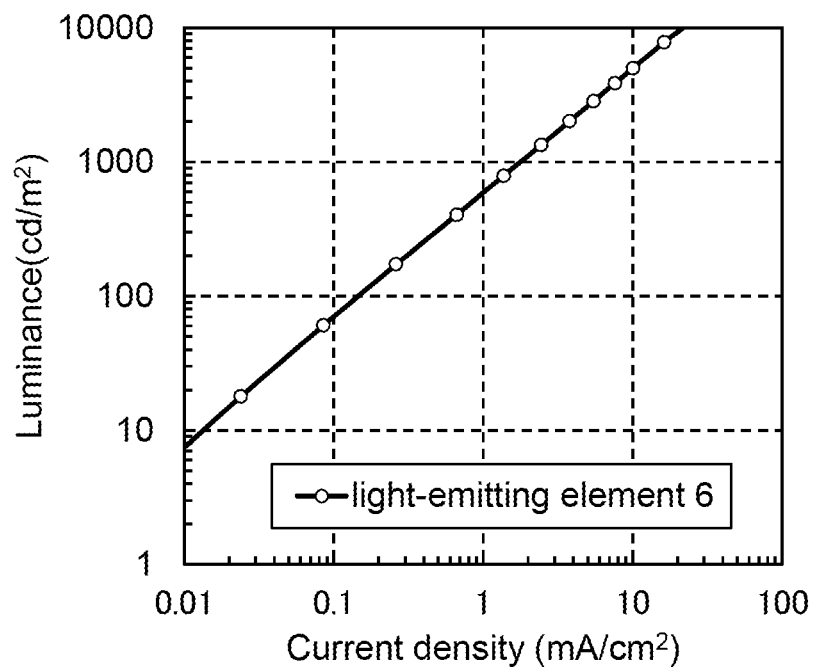
FIGS. 22A and 22B show current density-luminance characteristics and voltage-luminance characteristics, respectively, of a light-emitting element of Example 3.
Figure 22B:
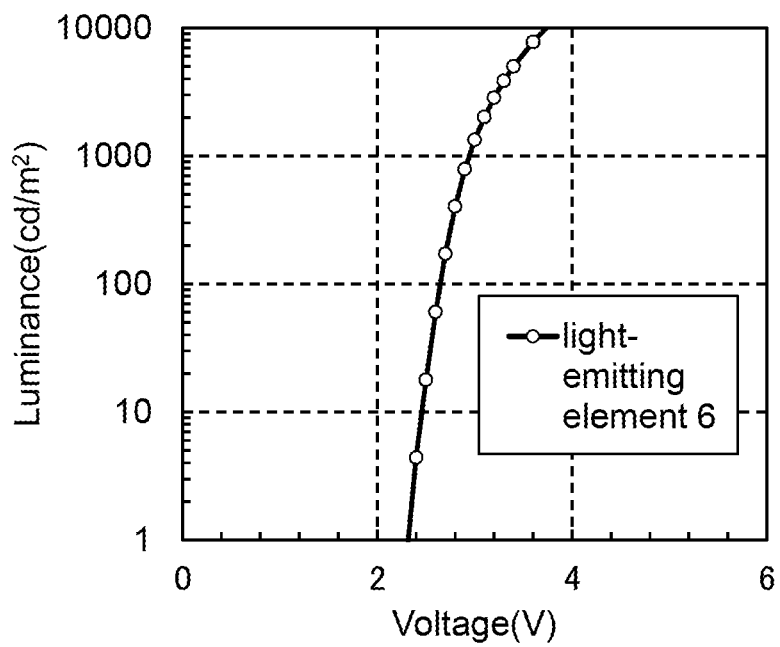
Figure 23A:
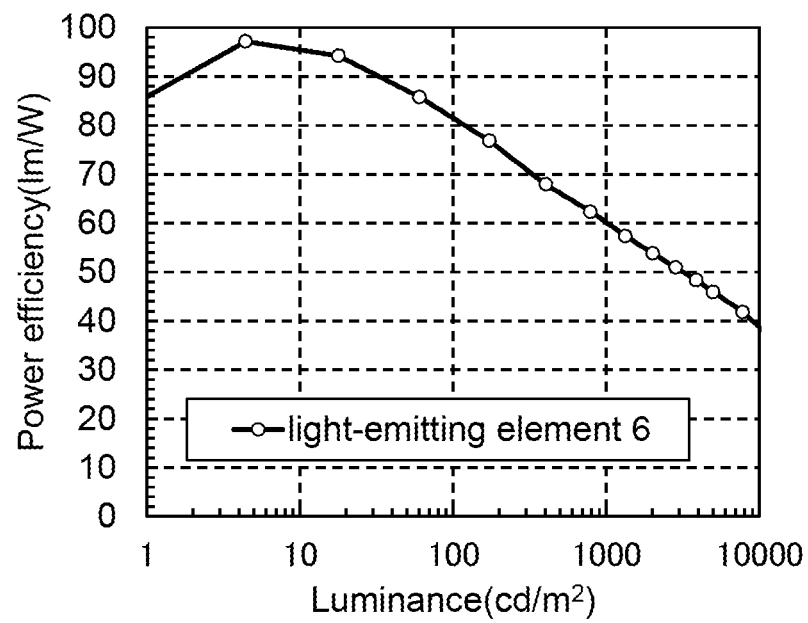
FIGS. 23A and 23B show luminance-power efficiency characteristics and luminance-current efficiency characteristics, respectively, of a light-emitting element of Example 3.
Figure 23B:
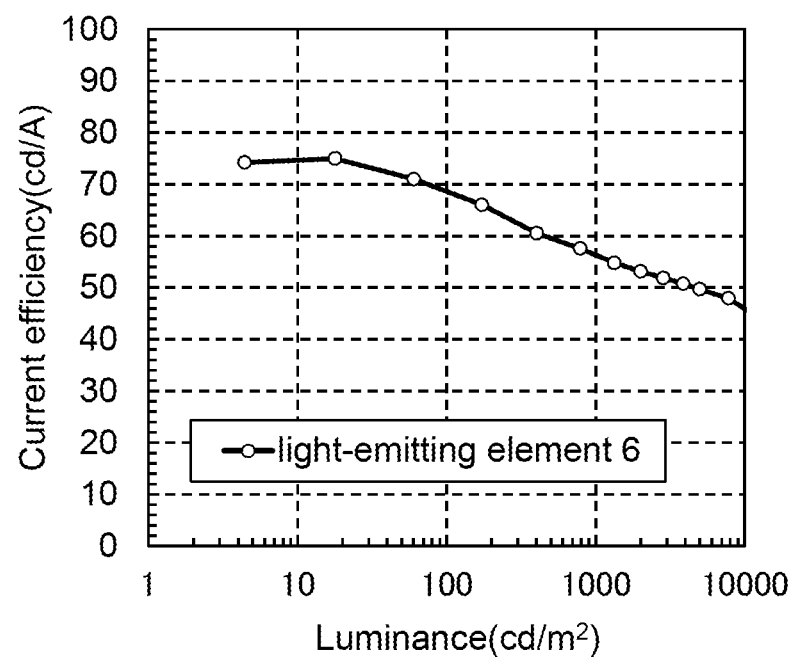

FIG. 22A shows current density-luminance characteristics of the light-emitting element 6. In FIG. 22A, the horizontal axis represents current density (mA/cm$^2$) and the vertical axis represents luminance (cd/m$^2$). FIG. 22B shows the voltage-luminance characteristics of the light-emitting element 6. In FIG. 22B, the horizontal axis represents voltage (V) and the vertical axis represents luminance (cd/m$^2$). FIG. 23A shows luminance-power efficiency characteristics of the light-emitting element 6. In FIG. 23A, the horizontal axis represents luminance (cd/m$^2$) and the vertical axis represents power efficiency (lm/W). FIG. 23B shows luminance-current efficiency characteristics of the light-emitting element 6. In FIG. 23B, the horizontal axis represents luminance (cd/m$^2$) and the vertical axis represents current efficiency (cd/A). Note that the measurement for the light-emitting element was carried out at room temperature (under an atmosphere in which the temperature was kept at 25° C.).

Further, Table 6 shows the element characteristics of the light-emitting element 6 at around 1000 cd/m$^2$.

TABLE 6

| | Element characteristics of light-emitting element of Example 3 | | | | | | | |
|---|---|---|---|---|---|---|---|---|
| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
| Light-emitting element 6 | 2.9 | 0.055 | 1.4 | (0.46, 0.47) | 790 | 58 | 62 | 19 |

Figure 24:
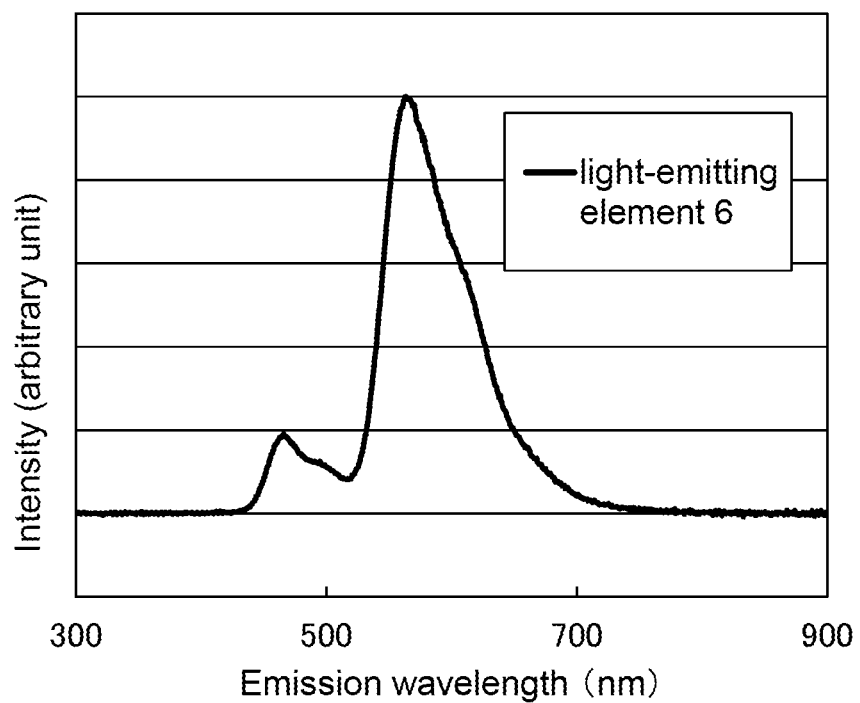
FIG. 24 shows an emission spectrum of a light-emitting element in Example 3.

FIG. 24 shows an emission spectrum when a current at a current density of 2.5 mA/cm$^2$ was supplied to the light-emitting element 6. As shown in FIG. 24, the spectrum of the light-emitting element 6 has peaks at the blue wavelength region and the yellow wavelength region; therefore, it is found that the two light-emitting materials therein emit light at a time.

The light-emitting element 6 of this example is different from the light-emitting elements 1 to 4 of Example 1 in the phosphorescent material of the second light-emitting layer 514. On the basis of the results shown in FIGS. 22A and 22B and FIGS. 23A and 23B, it is found that the light-emitting element 6 has element characteristics with high efficiency, similar to the light-emitting elements 1 to 4 of Example 1. The correlated color temperature of the light-emitting element 6 was 3090 K at around 1000 cd/m$^2$. Therefore, it can be used also for a lighting purpose.

The structures described in this example can be used in an appropriate combination with any of the structures described in the other embodiments and examples.

Example 4

Figure 25:
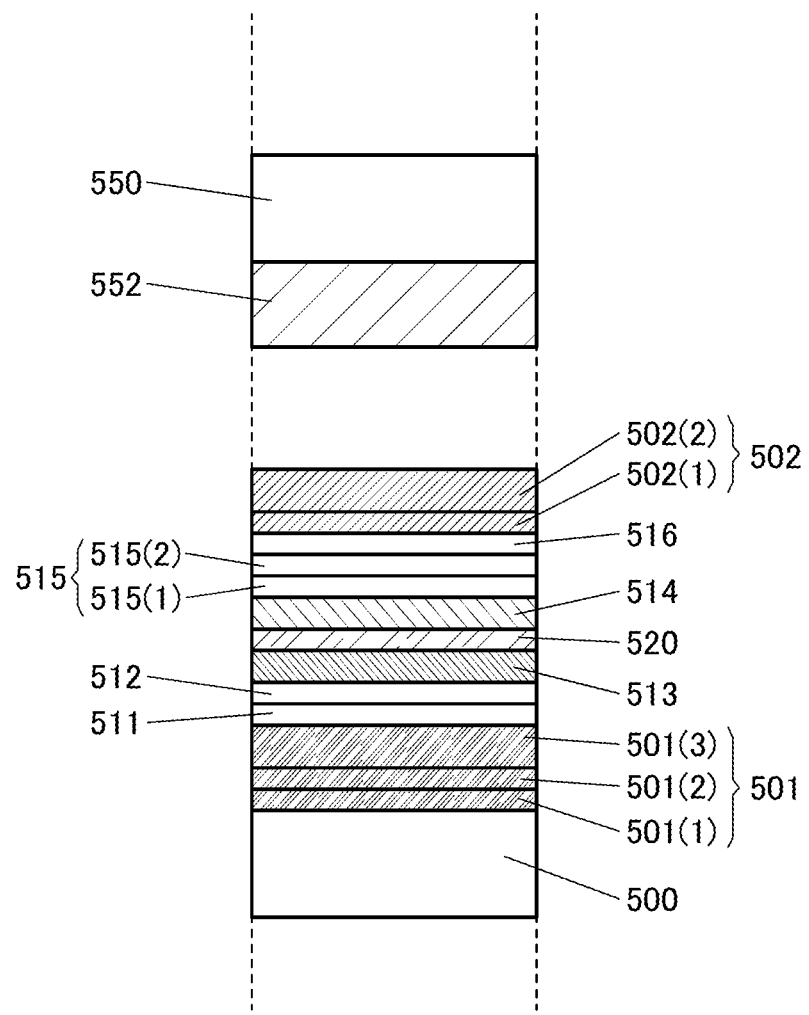
FIG. 25 is a schematic cross-sectional view illustrating an element structure of a light-emitting element of Example 4.

In this example, an example of fabricating a light-emitting element of one embodiment of the present invention will be described. FIG. 25 is a schematic cross-sectional view of light-emitting elements (light-emitting elements 7 to 10) fabricated in this example, and Table 7 shows the detailed structures of the elements. Note that the structures of compounds used for the light-emitting elements 7 to 10 are the same as those of the compounds used for the light-emitting elements 1 to 6; thus the descriptions thereof are omitted.

TABLE 7

Structure of light-emitting element of Example 4

| Layer | | Reference numeral | Thickness (nm) | Material | Weight ratio |
|---|---|---|---|---|---|
| Light-emitting Element 7 | — | 552 | 2360 | CF(Red) | — |
| | Second electrode | 502(2) | 70 | ITO | — |
| | | 502(1) | 15 | Ag:Mg | 0.5:0.05 *[1] |
| | Electron-injection layer | 516 | 1 | LiF | — |
| | Electron-transport layer | 515(2) | 20 | Bphen | — |
| | | 515(1) | 15 | 2mDBTBPDBq-II | — |
| | Second light-emitting layer | 514 | 20 | 2mDBTBPDBq-II: PCBBiF: Ir(mpmppm)$_2$(acac) | 0.8:0.2:0.06 |
| | Separation layer | 520 | 2 | 2mDBTBPDBq-II: PCBBiF | 0.2:0.3 |
| | First light-emitting layer | 513 | 10 | cgDBCzPA: 1,6mMemFLPAPrn | 1:0.02 |
| | Hole-transport layer | 512 | 20 | PCPPn | — |
| | Hole-injection layer | 511 | 87.5 | DBT3P-II:MoOx | 2:1 |
| | First electrode | 501(3) | 75 | ITSO | — |
| | | 501(2) | 6 | Ti | — |
| | | 501(1) | 200 | Al-Ni-La | — |
| Light-emitting Element 8 | — | 552 | 1290 | CF(Green) | — |
| | Second electrode | 502(2) | 70 | ITO | — |
| | | 502(1) | 15 | Ag:Mg | 0.5:0.05 *[1] |
| | Electron-injection layer | 516 | 1 | LiF | — |
| | Electron-transport layer | 515(2) | 20 | Bphen | — |
| | | 515(1) | 15 | 2mDBTBPDBq-II | — |
| | Second light-emitting layer | 514 | 20 | 2mDBTBPDBq-II: PCBBiF: Ir(mpmppm)$_2$(acac) | 0.8:0.2:0.06 |
| | Separation layer | 520 | 2 | 2mDBTBPDBq-II: PCBBiF | 0.2:0.3 |
| | First light-emitting layer | 513 | 10 | cgDBCzPA: 1,6mMemFLPAPrn | 1:0.02 |
| | Hole-transport layer | 512 | 20 | PCPPn | — |
| | Hole-injection layer | 511 | 57.5 | DBT3P-II:MoOx | 2:1 |
| | First electrode | 501(3) | 75 | ITSO | — |
| | | 501(2) | 6 | Ti | — |
| | | 501(1) | 200 | Al-Ni-La | — |
| Light-emitting Element 9 | — | 552 | 780 | CF(Blue) | — |
| | Second electrode | 502(2) | 70 | ITO | — |
| | | 502(1) | 15 | Ag:Mg | 0.5:0.05 *[1] |
| | Electron-injection layer | 516 | 1 | LiF | — |
| | Electron-transport layer | 515(2) | 20 | Bphen | — |
| | | 515(1) | 15 | 2mDBTBPDBq-II | — |
| | Second light-emitting layer | 514 | 20 | 2mDBTBPDBq-II: PCBBiF: Ir(mpmppm)$_2$(acac) | 0.8:0.2:0.06 |
| | Separation layer | 520 | 2 | 2mDBTBPDBq-II: PCBBiF | 0.2:0.3 |
| | First light-emitting layer | 513 | 10 | cgDBCzPA: 1,6mMemFLPAPrn | 1:0.02 |
| | Hole-transport layer | 512 | 20 | PCPPn | — |
| | Hole-injection layer | 511 | 50 | DBT3P-II:MoOx | 2:1 |
| | First electrode | 501(3) | 40 | ITSO | — |
| | | 501(2) | 6 | Ti | — |
| | | 501(1) | 200 | Al-Ni-La | — |
| Light-emitting Element 10 | — | 552 | 800 | CF(Yellow) | — |
| | Second electrode | 502(2) | 70 | ITO | — |
| | | 502(1) | 15 | Ag:Mg | 0.5:0.05 *[1] |
| | Electron-injection layer | 516 | 1 | LiF | — |
| | Electron-transport layer | 515(2) | 20 | Bphen | — |
| | | 515(1) | 15 | 2mDBTBPDBq-II | — |
| | Second light-emitting layer | 514 | 20 | 2mDBTBPDBq-II: PCBBiF: | 0.8:0.2:0.06 |

TABLE 7-continued

Structure of light-emitting element of Example 4

| Layer | Reference numeral | Thickness (nm) | Material | Weight ratio |
|---|---|---|---|---|
| | | | Ir(mpmppm)$_2$(acac) | |
| Separation layer | 520 | 2 | 2mDBTBPDBq-II:PCBBiF | 0.2:0.3 |
| First light-emitting layer | 513 | 10 | cgDBCzPA:1,6mMemFLPAPrn | 1:0.02 |
| Hole-transport layer | 512 | 20 | PCPPn | — |
| Hole-injection layer | 511 | 65 | DBT3P-II:MoOx | 2:1 |
| First electrode | 501(3) | 75 | ITSO | — |
| | 501(2) | 6 | Ti | — |
| | 501(1) | 200 | Al-Ni-La | — |

*[1] The ratio of Ag:Mg is described by the volume ratio.

<4-1. Fabrication of Light-Emitting Elements 7 to 10>

On the glass substrate 500, an alloy film (Al—Ni—La) of aluminum (Al), nickel (Ni), and lanthanum (La) was formed by a sputtering method to a thickness of 200 nm as a first electrode 501(1). Next, a titanium (Ti) film was formed by a sputtering method to a thickness of 6 nm and heated at 300° C. for 1 hour to form a film including a titanium oxide as a first electrode 501(2). Next, as a first electrode 501(3), an indium tin oxide film containing silicon oxide (ITSO) was formed by a sputtering method. Note that the first electrodes 501(1), 501(2), and 501(3) formed the first electrode 501, and the electrode area of the first electrode 501 was 2 mm×2 mm.

The film thickness of the first electrode 501(3) in each of the light emitting elements 7, 8, and 10 was 75 nm, while the film thickness of the first electrode 501(3) in the light emitting element 9 was 40 nm.

Next, on the first electrode 501(3), DBT3P-II and molybdenum oxide (MoO$_3$) were deposited by co-evaporation in a weight ratio of DBT3P-II:MoO$_3$=2:1, so that the hole-injection layer 511 was formed.

The film thickness of the hole-injection layer 511 in the light-emitting element 7, that in the light-emitting element 8, that in the light-emitting element 9, and that in the light-emitting element 10 were 87.5 nm, 57.5 nm, 50 nm, and 65 nm, respectively.

Next, on the hole-injection layer 511, PCPPn was deposited by evaporation to a thickness of 20 nm, so that the hole-transport layer 512 was formed.

On the hole-transport layer 512, cgDBCzPA and 1,6mMemFLPAPrn were deposited by co-evaporation in a weight ratio of cgDBCzPA:1,6mMemFLPAPrn=1:0.02 to a thickness of 10 nm, so that the first light-emitting layer 513 was formed.

On the first light-emitting layer 513, 2mDBTBPDBq-II and PCBBiF were deposited by co-evaporation in a weight ratio of 2mDBTBPDBq-II:PCBBiF=0.2:0.3 to a thickness of 2 nm, so that the separation layer 520 was formed.

On the separation layer 520, 2mDBTBPDBq-II, PCBBiF, and Ir(mpmppm)$_2$(acac) were deposited by co-evaporation in weight ratio of 2mDBTBPDBq-II:PCBBiF:Ir(mpmppm)$_2$(acac)=0.8:0.2:0.06 to a thickness of 20 nm, so that the second light-emitting layer 514 was formed.

On the second light-emitting layer 514, 2mDBTBPDBq-II and Bphen were sequentially deposited by evaporation to a thickness of 15 nm and 20 nm, respectively, so that electron-transport layers 515(1) and 512(2) were formed. On the electron-transport layers 515(1) and 515(2), lithium fluoride was deposited by evaporation to a thickness of 1 nm to form the electron-injection layer 516.

On the electron-injection layer 516, an alloy film of silver (Ag) and magnesium (Mg) was deposited by co-evaporation in a volume ratio of Ag:Mg=0.5:0.05 to a thickness of 15 nm, so that the second electrode 502(1) was formed.

Next, on the second electrode 502(1), an ITO film was formed by a sputtering method to a thickness of 70 nm.

As shown in Table 7, as a coloring layer 552 on a sealing substrate 550, a red (R) color filter with a thickness of 2.36 μm, a green (G) color filter with a thickness of 1.29 μm, a blue (B) color filter with a thickness of 0.78 μm, and a yellow (Y) color filter with a thickness of 0.80 μm were formed in the light-emitting elements 7, 8, 9, and 10, respectively.

Each of the light-emitting elements 7 to 10 formed as described above and the corresponding sealing substrate formed as described above were attached with each other to be sealed in a glove box containing a nitrogen atmosphere without exposed to an air atmosphere (the sealing member was applied to surround the element, irradiation with 365-nm ultraviolet light at 6 J/cm$^2$ was performed, and heat treatment was performed at 80° C. for 1 hour).

It is to be noted that an evaporation method using resistive heating was employed for all the evaporation steps.

<4-2. Characteristics of Light-Emitting Elements 7 to 10>

Figure 26A:
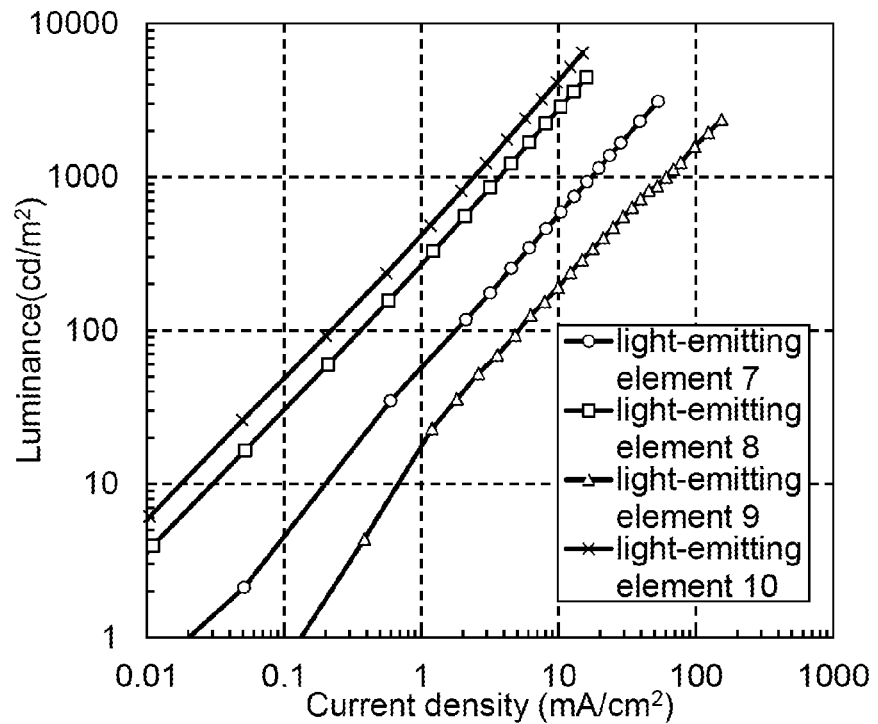
FIGS. 26A and 26B show current density-luminance characteristics and voltage-luminance characteristics, respectively, of light-emitting elements of Example 4.
Figure 26B:
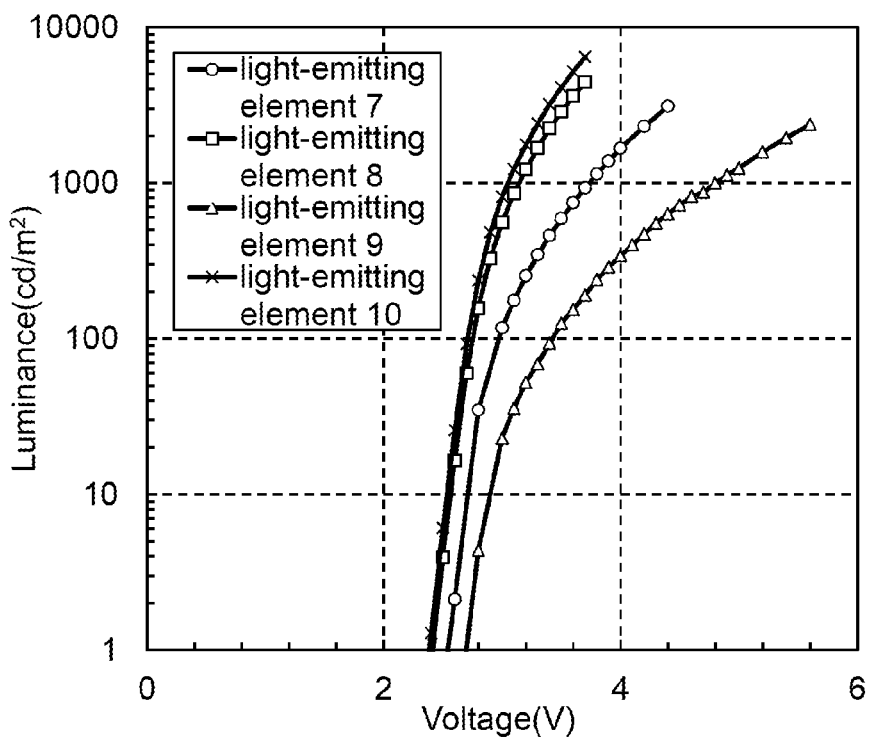

FIG. 26A shows current density-luminance characteristics of the light-emitting elements 7 to 10. In FIG. 26A, the horizontal axis represents current density (mA/cm$^2$) and the vertical axis represents luminance (cd/m$^2$). FIG. 26B shows the voltage-luminance characteristics of the light-emitting elements 7 to 10. In FIG. 26B, the horizontal axis represents voltage (V) and the vertical axis represents luminance (cd/m$^2$). Note that the measurement for each of the light-emitting elements was carried out at room temperature (under an atmosphere in which the temperature was kept at 25° C.).

Further, Table 8 shows the element characteristics of the light-emitting elements 7 to 10 at around 1000 cd/m$^2$.

TABLE 8

Element characteristics of light-emitting elements of Example 4

| | Voltage (V) | Current (mA) | Current density (mA/cm$^2$) | Chromaticity (x, y) | Luminance (cd/m$^2$) | Current efficiency (cd/A) |
|---|---|---|---|---|---|---|
| Light-emitting element 7 | 3.7 | 0.64 | 16 | (0.66, 0.34) | 930 | 5.8 |
| Light-emitting element 8 | 3.1 | 0.12 | 3.2 | (0.33, 0.64) | 850 | 27 |
| Light-emitting element 9 | 4.8 | 2.4 | 61 | (0.14, 0.055) | 1000 | 1.6 |
| Light-emitting element 10 | 3.0 | 0.078 | 2.0 | (0.41, 0.58) | 810 | 41 |

Figure 27:
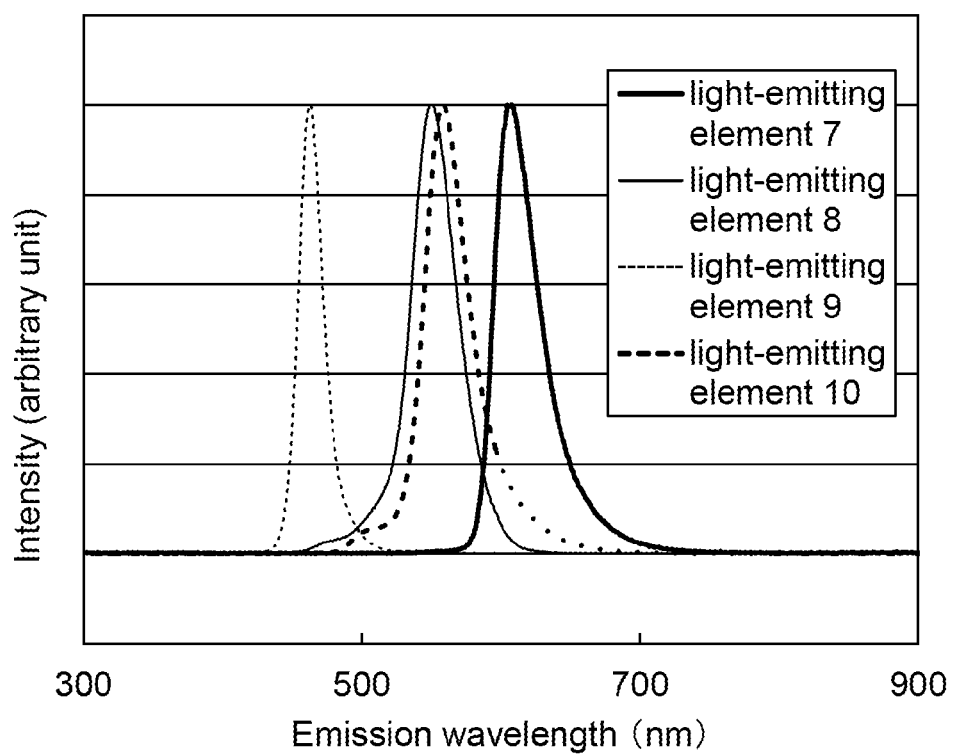
FIG. 27 shows emission spectra of light-emitting elements of Example 4.

FIG. 27 shows emission spectra when a current at a current density of 2.5 mA/cm$^2$ was supplied to the light-emitting elements 7 to 10. FIG. 27 shows that the spectrum of the light-emitting element 7 has a peak in the red wavelength region, that the spectrum of the light-emitting element 8 has a peak in the green wavelength region, that the spectrum of the light-emitting element 9 has a peak in the blue wavelength region, and that the spectrum of the light-emitting element 10 has a peak in the yellow wavelength region. Thus, when the light-emitting elements 7 to 10 are used in combination, full-color display can be achieved.

As shown in Table 7, the light-emitting elements 7 to 10 fabricated in this example each included the same first light-emitting layer 513 and the same second light-emitting layer 514. As shown in FIGS. 26A and 26B and FIG. 27, even when the structure of the first light-emitting layer 513 and the second light-emitting layer 514 were common in the light-emitting elements, the light-emitting elements each of which emitted light with a different emission spectrum from the others had high current efficiency and excellent element characteristics.

The structures described in this example can be used in an appropriate combination with any of the structures described in the other embodiments and examples.

Reference Example

A synthesis method of Ir(ppm-dmp)$_2$(acac) used in Examples 1 and 2 will be described. The synthesis scheme is shown below.

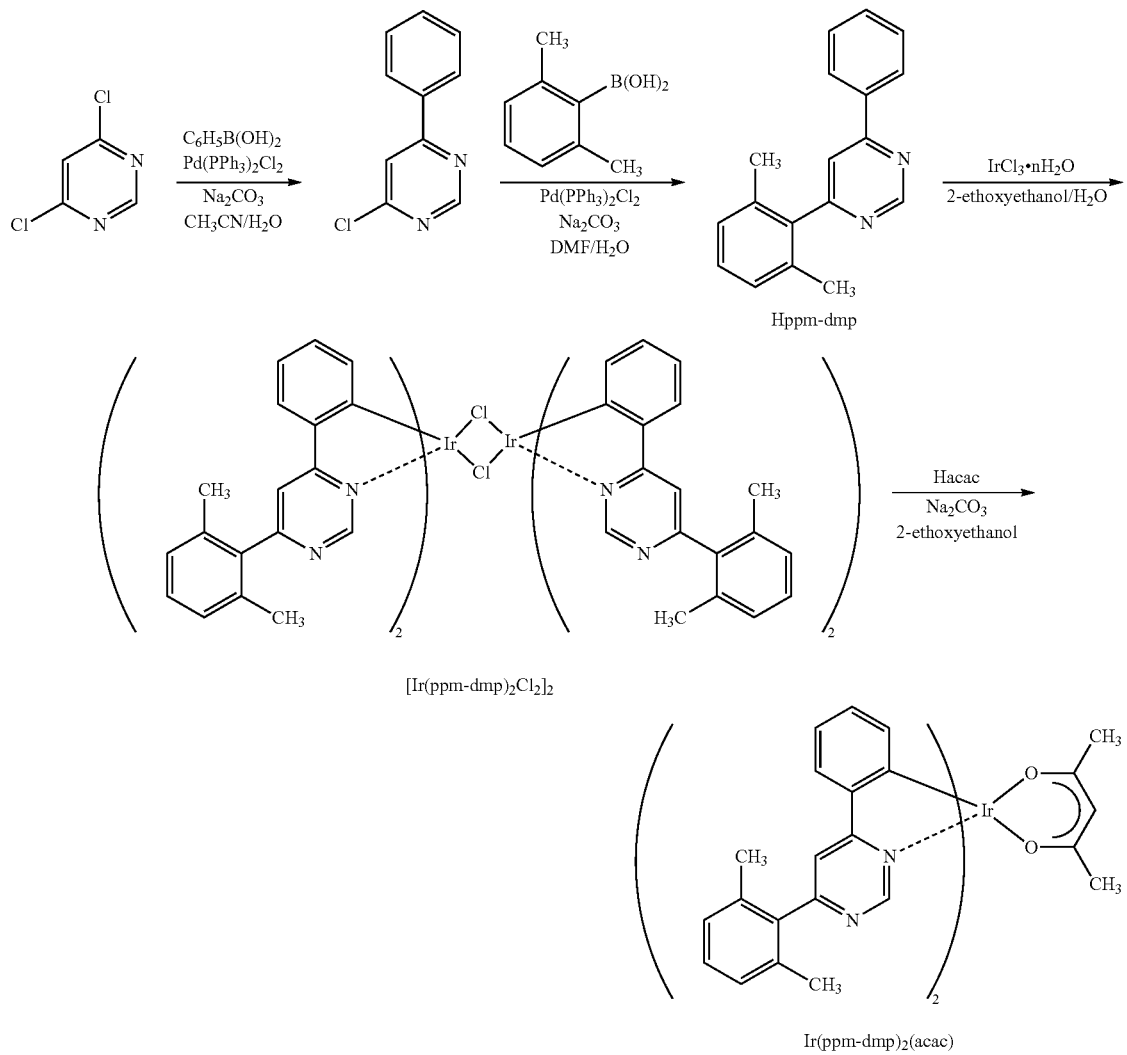

Ir(ppm-dmp)$_2$(acac)

1. Synthesis of 4-Chloro-6-phenylpyrimidine

A mixture of 5.0 g of 4,6-dichloropyrimidine, 4.9 g of phenylboronic acid, 7.1 g of sodium carbonate, 0.34 g of bis(triphenylphosphine)palladium(II)dichloride (Pd (PPh$_3$)$_2$Cl$_2$), 20 mL of acetonitrile, and 20 mL of water was heated to reflux by irradiation with microwaves (2.45 GHz, 100 W) under an argon stream for 1 hour. The obtained mixture was subjected to extraction with dichloromethane and purified by silica gel column chromatography (developing solvent: dichloromethane), whereby 1.6 g of 4-chloro-6-phenylpyrimidine was obtained (yield: 23%, a pale yellow solid). Note that the microwave irradiation in this reference example was performed using a microwave synthesis system (Discover, manufactured by CEM Corporation).

2. Synthesis of 4-phenyl-6-(2,6-dimethylphenyl)pyrimidine (Hppm-dmp)

A mixture of 1.6 g of 4-chloro-6-phenylpyrimidine, 1.5 g of 2,6-dimethylphenylboronic acid, 1.8 g of sodium carbonate, 59 mg of Pd (PPh$_3$)$_2$Cl$_2$, 20 mL of N,N-dimethylformamide, and 20 mL of water was heated to reflux by irradiation with microwaves (2.45 GHz, 100 W) under an argon stream for 2 hours. The obtained mixture was subjected to extraction with dichloromethane and purified by silica gel column chromatography (developing solvent: ethyl acetate and hexane in a ratio of 1:5), whereby 0.50 g of Hppm-dmp was obtained (yield: 23%, a pale yellow oily substance).

3. Synthesis of Di-μ-chloro-tetrakis {2-[6-(2,6-dimethylphenyl)-4-pyrimidinyl-κN3]phenyl-κC}diiridium(III) ([Ir(ppm-dmp)$_2$Cl]$_2$)

A mixture of 1.0 g of Hppm-dmp, 0.57 g of iridium(III) chloride hydrate, 20 mL of 2-ethoxyethanol, and 20 mL of water was heated to reflux by irradiation with microwaves (2.45 GHz, 100 W) under an argon stream for 3 hours. The obtained mixture was filtrated and the resulting solid was washed with methanol, whereby 1.1 g of [Ir(ppm-dmp)$_2$Cl]$_2$ was obtained (yield: 74%, an orange solid).

4. Synthesis of Ir(ppm-dmp)$_2$(acac)

A mixture of 1.1 g of [Ir(ppm-dmp)$_2$Cl]$_2$, 0.77 g of sodium carbonate, 0.23 g of acetylacetone (Hacac), and 30 mL of 2-ethoxyethanol was heated to reflux by irradiation with microwaves (2.45 GHz, 120 W) under an argon stream for 2 hours. The obtained mixture was filtrated, and an insoluble was washed with methanol. The obtained filtrate was concentrated, a residue was purified by silica gel column chromatography (developing solvent: ethyl acetate and hexane in a ratio of 1:5), and the obtained solid was recrystallized from hexane, whereby Ir(ppm-dmp)$_2$(acac) was obtained (yield: 59%, an orange powdered solid). By a train sublimation method, 0.21 g of the obtained orange powdered solid were purified, whereby the objective orange solid was collected in a yield of 48%. The conditions of the purification by sublimation were as follows: the pressure was 2.7 Pa; the flow rate of an argon gas was 5.0 mL/min; and the temperature was 240° C. $^1$H-NMR (nuclear magnetic resonance) spectrum data of the obtained Ir(ppm-dmp)$_2$(acac) are shown below.

$^1$H-NMR. δ (CDCl$_3$): 1.85 (s, 6H), 2.26 (s, 12H), 5.35 (s, 1H), 6.46-6.48 (dd, 2H), 6.83-6.90 (dm, 4H), 7.20-7.22 (d, 4H), 7.29-7.32 (t, 2H), 7.63-7.65 (dd, 2H), 7.72 (ds, 2H), 9.24 (ds, 2H).

Example 5

In this example, described are a fabrication example of a light-emitting element 11 not including the second light-emitting layer but including the first light-emitting layer of the light-emitting element of one embodiment of the present invention, and a formation example of a light-emitting element 12 not including the first light-emitting layer but including the second light-emitting layer of the light-emitting element of one embodiment of the present invention. A structure of N,N'-(pyrene-1,6-diyl)bis[(6,N-diphenylbenzo[b]naphtho[1,2-d]furan)-8-amine] (abbreviation: 1,6BnfAPrn-03) which is a compound used in this example is given below. The structures and names of the compounds used for the light-emitting elements in the above-described examples are not given below.

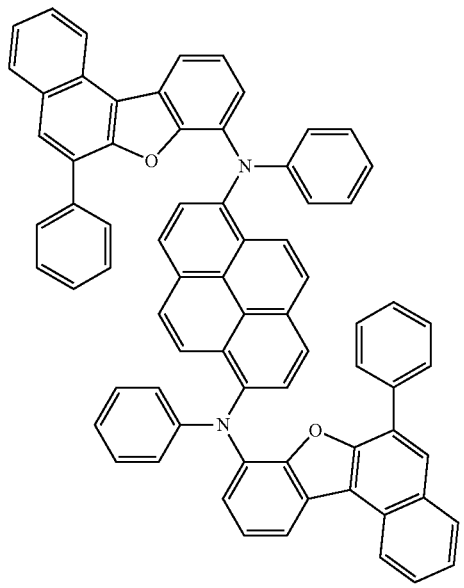

1,6BnfAPrn-03

<5-1. Fabrication of Light-Emitting Elements 11 and 12>

Similar to the light-emitting element 1 described in Example 1, the light-emitting element 11 has a structure in which the hole-injection layer 511, the hole-transport layer 512, and the first light-emitting layer 513 are stacked over the first electrode 501; however, the second light-emitting layer 514 is not formed and the electron-transport layers 515(1) and 515(2), the electron-injection layer 516, and the second electrode 502 are stacked over the first light-emitting layer 513 in this order. Similar to the light-emitting element 1 described in Example 1, the light-emitting element 12 has a structure in which the hole-injection layer 511 and the hole-transport layer 512 are stacked over the first electrode 501; however, the first light-emitting layer 513 is not formed and the second light-emitting layer 514, the electron-transport layers 515(1) and 515(2), the electron-injection layer 516, and the second electrode 502 are stacked over the hole-transport layer 512 in this order.

Thus, Example 1 is referred to for the specific fabrication method of the light-emitting elements. Table 9 shows the specific element structures of the light-emitting elements fabricated in this example (the light-emitting elements 11 and 12).

TABLE 9

Structure of light-emitting elements of Example 5

| | Layer | Reference numeral | Thickness (nm) | Material | Weight ratio |
|---|---|---|---|---|---|
| Light-emitting Element 11 | Second electrode | 502 | 200 | Al | — |
| | Electron-injection layer | 516 | 1 | LiF | — |
| | Electron-transport layer | 515(2) | 15 | Bphen | — |
| | | 515(1) | 10 | cgDBCzPA | — |
| | First light-emitting layer | 513 | 25 | cgDBCzPA: 1,6BnfAPrn-03 | 1:0.03 |
| | Hole-transport layer | 512 | 30 | PCPPn | — |
| | Hole-injection layer | 511 | 10 | PCPPn:MoOx | 4:2 |
| | First electrode | 501 | 110 | ITSO | — |
| Light-emitting Element 12 | Second electrode | 502 | 130 | Al | — |
| | Electron-injection layer | 516 | 1 | LiF | — |
| | Electron-transport layer | 515(2) | 20 | Bphen | — |
| | | 515(1) | 15 | 2mDBTBPDBqII | — |
| | Second light-emitting layer | 514 | 40 | 2mDBTBPDBqII: PCBBiF: Ir(mpmppm)$_2$(acac) | 0.8:0.2:0.06 |
| | Hole-transport layer | 512 | 20 | BPAFLP | — |
| | Hole-injection layer | 511 | 10 | DBT3PII:MoOx | 1:0.5 |
| | First electrode | 501 | 110 | ITSO | — |

<5-2. Characteristics of Light-Emitting Elements 11 and 12>

Figure 28:
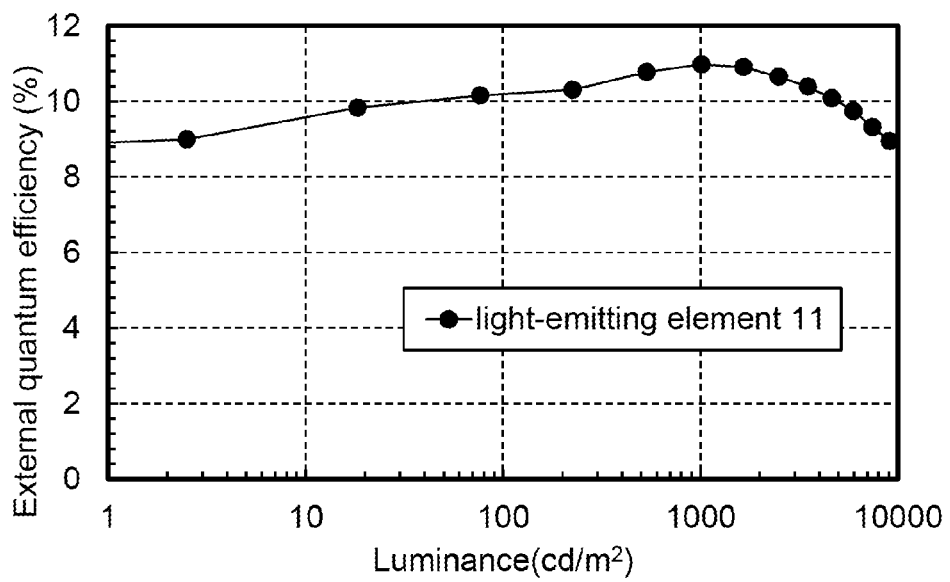
FIG. 28 shows luminance-external quantum efficiency characteristics of a light-emitting element 11 of Example 5.
Figure 31:
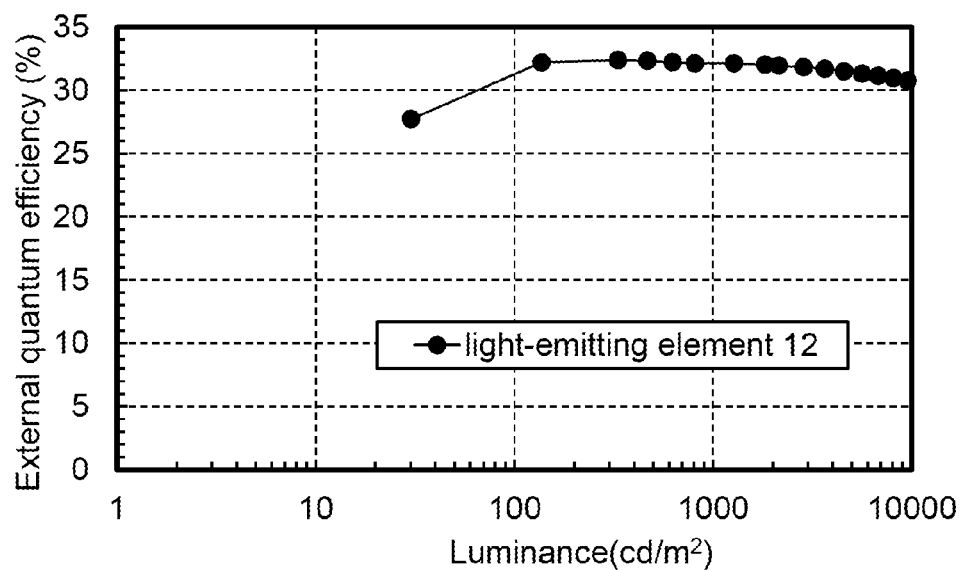
FIG. 31 shows luminance-external quantum efficiency characteristics of a light-emitting element 12 of Example 5.

FIG. 28 shows luminance-external quantum efficiency characteristics of the light-emitting element 11. FIG. 31 shows luminance-external quantum efficiency characteristics of the light-emitting element 12. In each of FIG. 28 and FIG. 31, the horizontal axis represents luminance (cd/m$^2$) and the vertical axis represents external quantum efficiency (%). Note that the measurement of each of the light-emitting elements was carried out at room temperature (under an atmosphere in which the temperature was kept at 25° C.).

Figure 29:
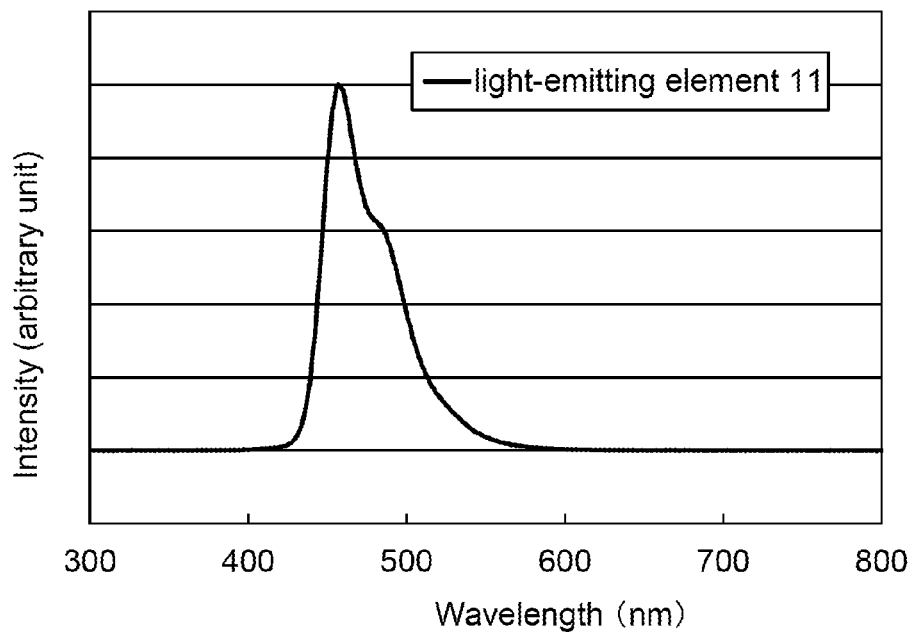
FIG. 29 shows an emission spectrum of a light-emitting element 11 of Example 5.
Figure 32:
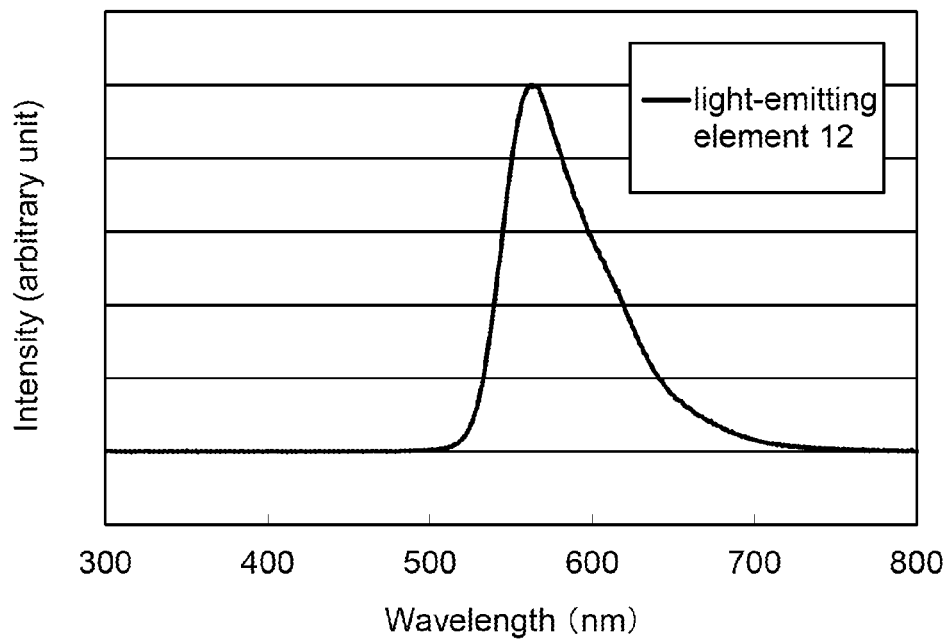
FIG. 32 shows an emission spectrum of a light-emitting element 12 of Example 5.

Further, Table 10 shows the element characteristics of the light-emitting elements 11 and 12 at around 1000 cd/m$^2$.

and the vertical axis represents emission intensity (an arbitrary unit). As shown in FIG. 29, the emission spectrum of the light-emitting element 11 has a peak in the blue wavelength region, which indicates that emission from the light-emitting material included in the first light-emitting layer 513 was obtained. As shown in FIG. 32, the emission spectrum of the light-emitting element 12 has a peak in the yellow wavelength region, which indicates that emission from the light-emitting material included in the second light-emitting layer 514 was obtained.

Figure 30:
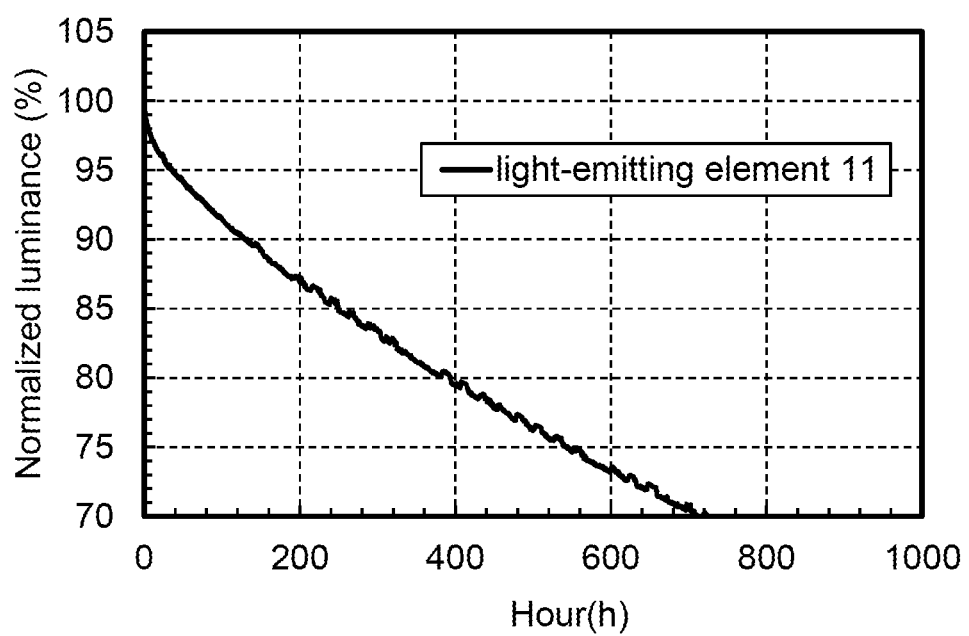
FIG. 30 shows reliability of a light-emitting element 11 of Example 5.
Figure 33:
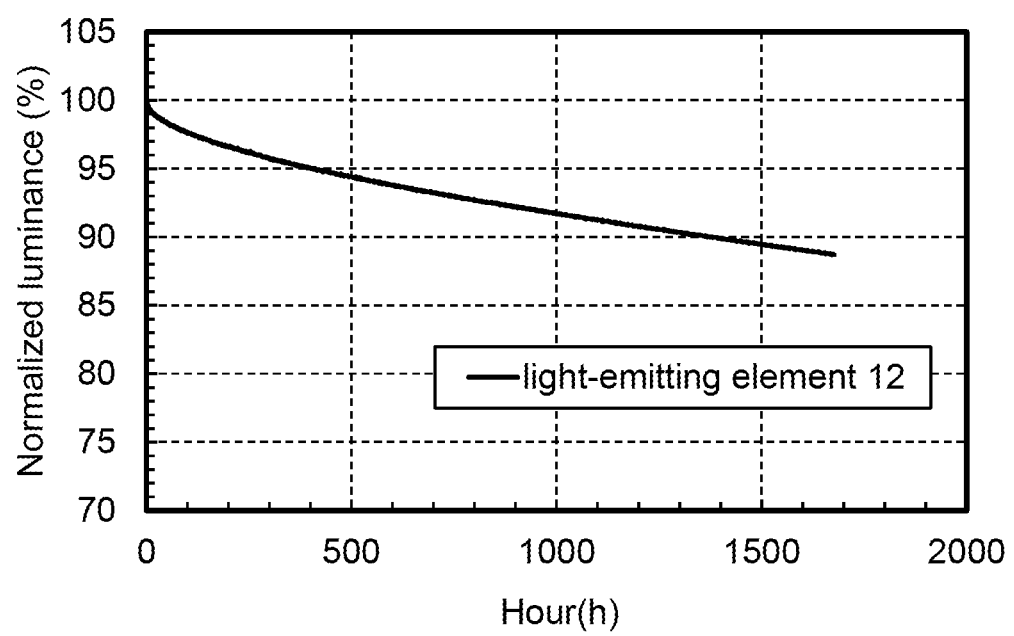
FIG. 33 shows reliability of a light-emitting element 12 of Example 5.

The light-emitting elements 11 and 12 were subjected to reliability tests. FIG. 30 shows the test result of the light-emitting element 11, and FIG. 33 shows the test result of the light-emitting element 12. In each of FIG. 30 and FIG. 33, the vertical axis represents normalized luminance (%) on the assumption that an initial luminance is 100%, and the horizontal axis represents driving time (h) of the light-

TABLE 10

Element characteristics of light-emitting elements of Example 5

| | Voltage (V) | Current density (mA/cm$^2$) | Chromaticity (x, y) | Luminance (cd/m$^2$) | Current efficiency (cd/A) | External quantum efficiency (%) |
|---|---|---|---|---|---|---|
| Light-emitting element 11 | 3.1 | 9.5 | (0.14, 0.13) | 1000 | 11 | 11 |
| Light-emitting element 12 | 2.8 | 0.88 | (0.49, 0.50) | 1000 | 120 | 32 |

FIG. 29 shows an emission spectrum when a current at a current density of 2.5 mA/cm$^2$ was supplied to the light-emitting element 11. FIG. 32 shows an emission spectrum when a current at a current density of 2.5 mA/cm$^2$ was supplied to the light-emitting element 12. In each of FIG. 29 and FIG. 32, the horizontal axis represents wavelength (nm)

emitting elements. Note that in the reliability test, the light-emitting elements 11 and 12 were each driven under the conditions where the initial luminance was set to 5000 cd/m$^2$ and the current density was constant. As a result, the light-emitting element 11 kept approximately 90% of the initial luminance until 130 hours had elapsed, and the light-emitting element 12 kept approximately 90% of the initial luminance until 1300 hours had elapsed.

The structures described in this example can be used in an appropriate combination with any of the structures described in the other embodiments and examples.

Reference Example

In this reference example, a method for synthesizing N,N'-(pyrene-1,6-diyl)bis[(6,N-diphenylbenzo[b]naphtho[1,2-d]furan)-8-amine] (abbreviation: 1,6BnfAPrn-03), an organic compound used in this example, is described. Note that a structure of 1,6BnfAPrn-03 is shown below.

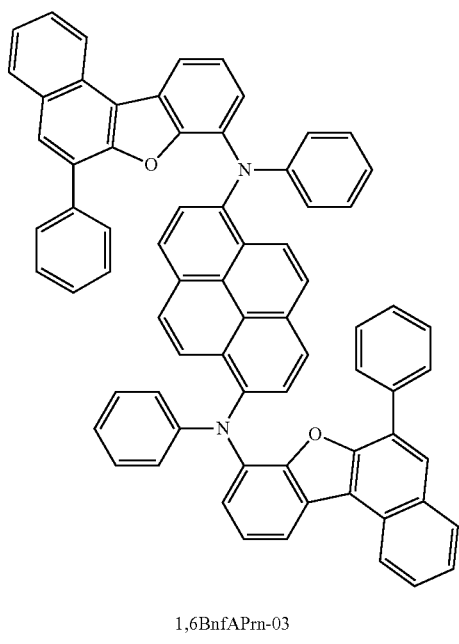 [SMILES: c1ccc(-c2cc3ccccc3c3c2oc2c(N(c4ccccc4)c4ccc5ccc6c(N(c7ccccc7)c7cccc8c7oc7c(-c9ccccc9)cc9ccccc9c78)ccc7ccc4c5c76)cccc23)cc1]

1,6BnfAPrn-03

Step 1: Synthesis of 6-iodobenzo[b]naphtho[1,2-d]furan

Into a 500 mL three-neck flask were put 8.5 g (39 mmol) of benzo[b]naphtho[1,2-d]furan, and the air in the flask was replaced with nitrogen. Then, 195 mL of tetrahydrofuran (THF) was added thereto. This solution was cooled to −75° C. Then, 25 mL (40 mmol) of n-butyllithium (a 1.59 mol/L n-hexane solution) was dropped into this solution. After the drop, the resulting solution was stirred at room temperature for 1 hour.

After a predetermined period of time, the resulting solution was cooled to −75° C. Then, a solution in which 10 g (40 mmol) of iodine had been dissolved in 40 mL of THF was dropped into this solution. After the drop, the resulting solution was stirred for 17 hours while the temperature of the solution was returned to room temperature. After a predetermined period of time, an aqueous solution of sodium thiosulfate was added to the mixture, and the resulting mixture was stirred for 1 hour. Then, an organic layer of the mixture was washed with water and dried with magnesium sulfate. After the drying, the mixture was gravity-filtered to give a solution. The resulting solution was suction-filtered through Celite (Catalog No. 531-16855 produced by Wako Pure Chemical Industries, Ltd.) and Florisil (Catalog No. 540-00135 produced by Wako Pure Chemical Industries, Ltd.) to give a filtrate. The resulting filtrate was concentrated to give a solid. The resulting solid was recrystallized from toluene to give 6.0 g (18 mmol) of white powder of the target substance in a yield of 45%. A synthetic scheme of Step 1 is shown below.

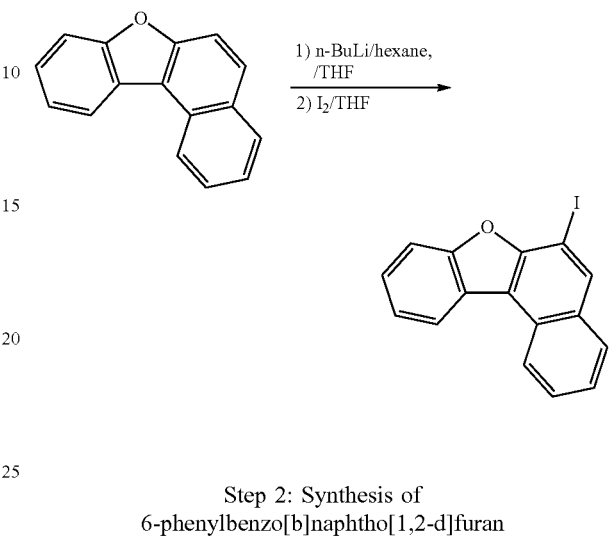

Step 2: Synthesis of 6-phenylbenzo[b]naphtho[1,2-d]furan

Into a 200 mL three-neck flask were put 6.0 g (18 mmol) of 6-iodobenzo[b]naphtho[1,2-d]furan, 2.4 g (19 mmol) of phenylboronic acid, 70 mL of toluene, 20 mL of ethanol, and 22 mL of an aqueous solution of potassium carbonate (2.0 mol/L). The mixture was degassed by being stirred while the pressure was reduced. After the degassing, the air in the flask was replaced with nitrogen, and then 480 mg (0.42 mmol) of tetrakis(triphenylphosphine)palladium(0) was added to the mixture. The resulting mixture was stirred at 90° C. under a nitrogen stream for 12 hours.

After a predetermined time has passed, water was added to the mixture, and the solution was separated into the aqueous layer and an organic layer. An extracted solution which was extracted with toluene from the aqueous layer and the organic layer were combined, and the mixture was washed with water and then dried with magnesium sulfate. The mixture was gravity-filtered to give a filtrate. The resulting filtrate was concentrated to give a solid, and the resulting solid was dissolved in toluene. The resulting solution was suction-filtered through Celite (Catalog No. 531-16855 produced by Wako Pure Chemical Industries, Ltd.), Florisil (Catalog No. 540-00135 produced by Wako Pure Chemical Industries, Ltd.), and alumina to give a filtrate. The resulting filtrate was concentrated to give a solid. The resulting solid was recrystallized from toluene to give a 4.9 g (17 mmol) of a white solid of the target substance in a yield of 93%. A synthetic scheme of Step 2 is shown below.

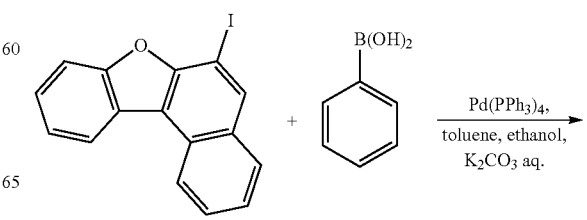

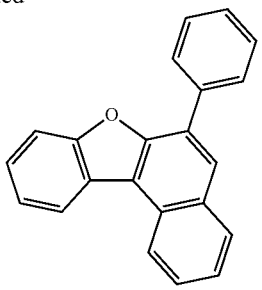

Step 3: Synthesis of 8-iodo-6-phenylbenzo[b]naphtho[1,2-d]furan

Into a 300 mL three-neck flask was put 4.9 g (17 mmol) of 6-phenylbenzo[b]naphtho[1,2-d]furan, and the air in the flask was replaced with nitrogen. Then, 87 mL of tetrahydrofuran (THF) was added thereto. The resulting solution was cooled to −75° C. Then, 11 mL (18 mmol) of n-butyllithium (a 1.59 mol/L n-hexane solution) was dropped into the solution. After the drop, the resulting solution was stirred at room temperature for 1 hour. After a predetermined period of time, the resulting solution was cooled to −75° C. Then, a solution in which 4.6 g (18 mmol) of iodine had been dissolved in 18 mL of THF was dropped into the resulting solution.

The resulting solution was stirred for 17 hours while the temperature of the solution was returned to room temperature. After a predetermined period of time, an aqueous solution of sodium thiosulfate was added to the mixture, and the resulting mixture was stirred for 1 hour. Then, an organic layer of the mixture was washed with water and dried with magnesium sulfate. The mixture was gravity-filtered to give a filtrate. The resulting filtrate was suction-filtered through Celite (Catalog No. 531-16855 produced by Wako Pure Chemical Industries, Ltd.), Florisil (Catalog No. 540-00135 produced by Wako Pure Chemical Industries, Ltd.), and alumina to give a filtrate. The resulting filtrate was concentrated to give a solid. The resulting solid was recrystallized from toluene to give 3.7 g (8.8 mmol) of a target white solid in a yield of 53%. A synthesis scheme of Step 3 is shown below.

Step 4: Synthesis of 1,6BnfAPrn-03

Into a 100 mL three-neck flask were put 0.71 g (2.0 mmol) of 1,6-dibromopyrene, 1.0 g (10.4 mmol) of sodium-tert-butoxide, 10 mL of toluene, 0.36 mL (4.0 mmol) of aniline, and 0.3 mL of tri(tert-butyl)phosphine (a 10 wt % hexane solution), and the air in the flask was replaced with nitrogen. To this mixture was added 50 mg (85 μmol) of bis(dibenzylideneacetone)palladium(0), and the resulting mixture was stirred at 80° C. for 2 hours.

After a predetermined period of time, to the resulting mixture were added 1.7 g (4.0 mmol) of 8-iodo-6-phenylbenzo[b]naphtho[1,2-d]furan, 180 mg (0.44 mmol) of 2-dicyclohexylphosphino-2',6'-dimethoxybiphenyl (abbreviation: S-Phos), and 50 mg (85 μmol) of bis(dibenzylideneacetone)palladium(0), and the resulting mixture was stirred at 100° C. for 15 hours. After a predetermined period of time, the resulting mixture was filtered through Celite (Catalog No. 531-16855 produced by Wako Pure Chemical Industries, Ltd.) to give a filtrate. The obtained filtrate was concentrated to give a solid. The resulting solid was washed with ethanol and recrystallized from toluene to give 1.38 g (1.4 mmol) of a yellow solid of the target substance in a yield of 71%.

By a train sublimation method, 1.37 mg (1.4 mmol) of the resulting yellow solid was purified by sublimation. The purification by sublimation was performed by heating the yellow solid at 370° C. at an argon flow rate of 10 mL/min under a pressure of 2.3 Pa. As a result of the purification by sublimation, 0.68 g (0.70 mmol) of the yellow solid was obtained in a collection rate of 50%. A synthesis scheme of Step 4 is shown below.

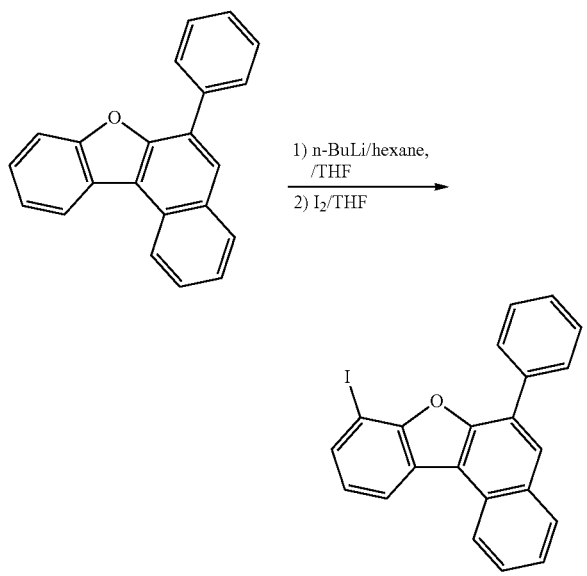

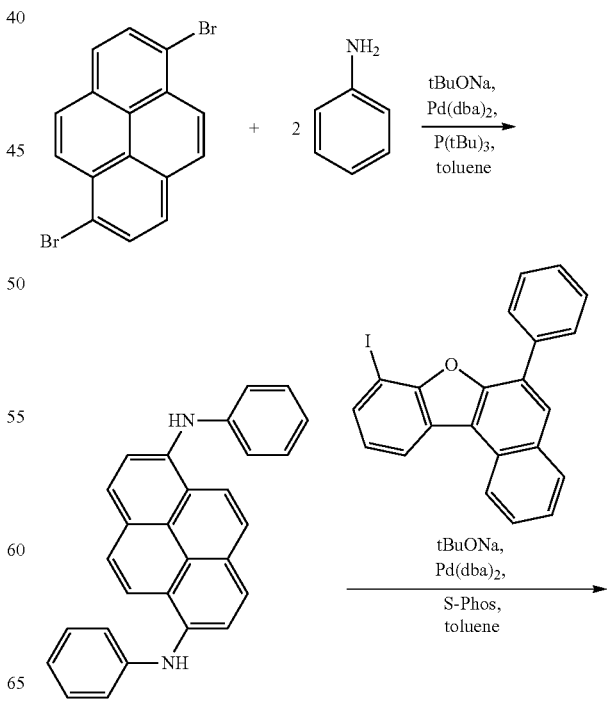

-continued

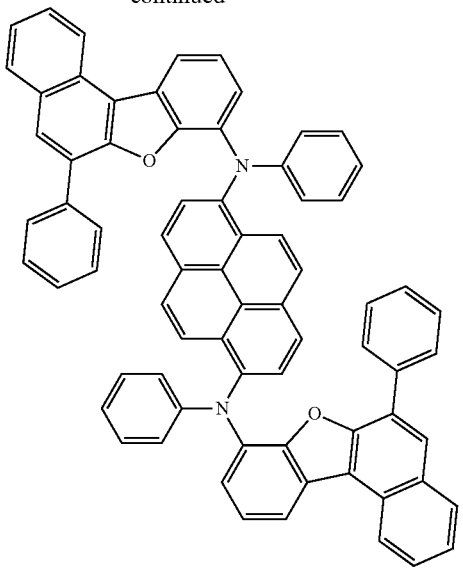

An analysis result by nuclear magnetic resonance ($^1$H-NMR) spectroscopy of the yellow solid obtained in Step 4 is described below. The result revealed that 1,6BnfAPrn-03 was obtained.

$^1$H-NMR (dichloromethane-d2, 500 MHz): δ=6.88 (t, J=7.7 Hz, 4H), 7.03-7.06 (m, 6H), 7.11 (t, J=7.5 Hz, 2H), 7.13 (d, J=8.0 Hz, 2H), 7.28-7.32 (m, 8H), 7.37 (t, J=8.0 Hz, 2H), 7.59 (t, J=7.2 Hz, 2H), 7.75 (t, J=7.7 Hz, 2H), 7.84 (d, J=9.0 Hz, 2H), 7.88 (d, J=8.0 Hz, 2H), 8.01 (s, 2H), 8.07 (d, J=8.0 Hz, 4H), 8.14 (d, J=9.0 Hz, 2H), 8.21 (d, J=8.0 Hz, 2H), 8.69 (d, J=8.5 Hz, 2H).

REFERENCE NUMERALS

100: light-emitting element, 101: electrode, 102: electrode, 111: hole-injection layer, 112: hole-transport layer, 113: light-emitting layer, 114: light-emitting layer, 115: electron-transport layer, 116: electron-injection layer, 120: separation layer, 130: EL layer, 131: light-emitting unit, 132: light-emitting unit, 133: charge generation layer, 140: light-emitting element, 150: light-emitting element, 160: light-emitting element, 170: light-emitting element, 500: glass substrate, 501: electrode, 502: electrode, 511: hole-injection layer, 512: hole-transport layer, 513: light-emitting layer, 514: light-emitting layer, 515(1): electron-transport layer, 515(2): electron-transport layer, 516: electron-injection layer, 520: separation layer, 550: sealing substrate, 552: coloring layer, 600: light-emitting device, 601: source line driver circuit portion, 602: pixel portion, 603: gate line driver circuit portion, 604: sealing substrate, 605: sealing member, 607: region, 608: wiring, 609: FPC, 610: element substrate, 611: FET, 612: FET, 613: electrode, 614: insulator, 616: EL layer, 617: electrode, 618: light-emitting element, 623: FET, 624: FET, 801: pixel circuit, 802: pixel portion, 804: driver circuit portion, 804*a*: gate driver, 804*b*: source driver, 806: protection circuit, 807: terminal portion, 852: transistor, 854: transistor, 862: capacitor, 872: light-emitting element, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024Y: electrode, 1025: partition, 1026: electrode, 1028: EL layer, 1031: sealing substrate, 1032: sealing member, 1033: base material, 1034B: coloring layer, 1034G: coloring layer, 1034R: coloring layer, 1034Y: coloring layer, 1035: black layer, 1036: overcoat layer, 1037: interlayer insulating film, 1040: pixel portion, 1041: driver circuit portion, 1042: peripheral portion, 8000: display module, 8001: upper cover, 8002: lower cover, 8003: FPC, 8004: touch panel, 8005: FPC, 8006: display panel, 8009: frame, 8010: printed board, 8011: battery, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal.

This application is based on Japanese Patent Application serial no. 2014-112448 filed with Japan Patent Office on May 30, 2014 and Japanese Patent Application serial no. 2014-241137 filed with Japan Patent Office on Nov. 28, 2014, and the entire contents of which are hereby incorporated by reference.

The invention claimed is:

1. A light-emitting element comprising:
a first electrode;
a second electrode; and
an EL layer between the first electrode and the second electrode,
wherein the EL layer comprises a first light-emitting layer and a second light-emitting layer,
wherein the first light-emitting layer comprises a fluorescent material and a host material,
wherein the second light-emitting layer comprises a phosphorescent material, a first organic compound, and a second organic compound,
wherein an emission spectrum of the second light-emitting layer has a peak in a yellow wavelength region,
wherein the first organic compound and the second organic compound form an exciplex,
wherein energy is transferred from the exciplex to the phosphorescent material, and
wherein a triplet excited level of the host material is lower than triplet excited levels of the first organic compound and the second organic compound.

2. The light-emitting element according to claim 1, wherein a singlet excited level of the host material is higher than a singlet excited level of the fluorescent material, and
wherein a triplet excited level of the host material is lower than a triplet excited level of the fluorescent material.

3. The light-emitting element according to claim 1, wherein the first light-emitting layer and the second light-emitting layer are in contact with each other.

4. The light-emitting element according to claim 1, wherein the first light-emitting layer and the second light-emitting layer are spaced from each other.

5. The light-emitting element according to claim 4, wherein a layer in which a hole-transport material and an electron-transport material are mixed is located between the first light-emitting layer and the second light-emitting layer.

6. The light-emitting element according to claim 1,
wherein the first electrode is an anode,
wherein the second electrode is a cathode,
wherein the first light-emitting layer is over the first electrode, and wherein the second light-emitting layer is over the first light-emitting layer.

7. A light-emitting device comprising:
the light-emitting element according to claim 1; and
a transistor or a substrate.

8. A light-emitting element comprising:
a first electrode;
a second electrode; and
an EL layer between the first electrode and the second electrode,
wherein the EL layer comprises a first light-emitting layer and a second light-emitting layer,
wherein the first light-emitting layer comprises a fluorescent material and a host material,
wherein the second light-emitting layer comprises a phosphorescent material, a first organic compound, and a second organic compound,
wherein the first organic compound and the second organic compound form an exciplex,
wherein an emission spectrum of the phosphorescent material has a peak in a yellow wavelength region,
wherein energy is transferred from the exciplex to the phosphorescent material, and
wherein a triplet excited level of the host material is lower than triplet excited levels of the first organic compound and the second organic compound.

9. The light-emitting element according to claim 8,
wherein a singlet excited level of the host material is higher than a singlet excited level of the fluorescent material, and
wherein a triplet excited level of the host material is lower than a triplet excited level of the fluorescent material.

10. The light-emitting element according to claim 8, wherein the first light-emitting layer and the second light-emitting layer are in contact with each other.

11. The light-emitting element according to claim 8, wherein the first light-emitting layer and the second light-emitting layer are spaced from each other.

12. The light-emitting element according to claim 11, wherein a layer in which a hole-transport material and an electron-transport material are mixed is located between the first light-emitting layer and the second light-emitting layer.

13. The light-emitting element according to claim 8,
wherein the first electrode is an anode,
wherein the second electrode is a cathode,
wherein the first light-emitting layer is over the first electrode, and
wherein the second light-emitting layer is over the first light-emitting layer.

14. A light-emitting device comprising:
the light-emitting element according to claim 8; and
a transistor or a substrate.

15. A module comprising:
the light-emitting device according to claim 7; and
a connector connected to the light-emitting device.

16. The module according to claim 15,
wherein the connector is an FPC or a TCP.

17. An electronic device comprising:
the light-emitting device according to claim 7; and
any of an external connection port, a keyboard, an operation button, a speaker and a microphone.

18. A lighting device comprising:
the light-emitting device according to claim 7; and
a housing.

* * * * *